(12) United States Patent
Sakamoto et al.

(10) Patent No.: US 11,512,204 B2
(45) Date of Patent: Nov. 29, 2022

(54) SQUARYLIUM DYE AND COMPOSITION CONTAINING SAME

(71) Applicants: TOYO INK SC HOLDINGS CO., LTD., Tokyo (JP); TOYO VISUAL SOLUTIONS CO., LTD., Tokyo (JP)

(72) Inventors: Shohei Sakamoto, Tokyo (JP); Hiroaki Shimizu, Tokyo (JP); Sumihiro Aikyo, Tokyo (JP)

(73) Assignees: TOYO INK SC HOLDINGS CO., LTD., Tokyo (JP); TOYO VISUAL SOLUTIONS CO., LTD., Tokyo (JP)

( * ) Notice: Subject to any disclaimer, the term of this patent is extended or adjusted under 35 U.S.C. 154(b) by 531 days.

(21) Appl. No.: 16/711,435

(22) Filed: Dec. 12, 2019

(65) Prior Publication Data

US 2020/0115556 A1 Apr. 16, 2020

Related U.S. Application Data

(63) Continuation of application No. PCT/JP2018/022162, filed on Jun. 11, 2018.

(30) Foreign Application Priority Data

Jun. 13, 2017 (JP) .............................. JP2017-115709
Oct. 13, 2017 (JP) .............................. JP2017-198974

(51) Int. Cl.
*G02B 5/20* (2006.01)
*G03G 9/09* (2006.01)
*C09B 57/00* (2006.01)
*C09D 7/41* (2018.01)
(Continued)

(52) U.S. Cl.
CPC .............. *C09B 57/007* (2013.01); *C09D 5/32* (2013.01); *C09D 7/41* (2018.01); *C09D 11/037* (2013.01);
(Continued)

(58) Field of Classification Search
CPC ...... C09B 57/007; G03G 9/0906; C09D 5/32; C09D 7/41; C09D 11/037; C09D 11/328; H04N 5/335; C09J 11/06; G02B 5/208
See application file for complete search history.

(56) References Cited

U.S. PATENT DOCUMENTS

| | | | |
|---|---|---|---|
| 2010/0092885 A1* | 4/2010 | Ito ......................... | C09B 57/007 106/31.47 |
| 2010/0108949 A1* | 5/2010 | Hirokawa ............ | C07D 239/70 544/231 |
| 2012/0199731 A1* | 8/2012 | Ito ........................ | G03G 9/0924 250/271 |

FOREIGN PATENT DOCUMENTS

| | | |
|---|---|---|
| JP | 2000162431 | 6/2000 |
| JP | 2004037719 | 2/2004 |

(Continued)

OTHER PUBLICATIONS

"Written Opinion of the International Searching Authority (Form PCT/ISA/237) of PCT/JP2018/022162", dated Aug. 28, 2018, with English translation thereof, pp. 1-11.

(Continued)

*Primary Examiner* — Bijan Ahvazi
(74) *Attorney, Agent, or Firm* — JCIPRNET

(57) ABSTRACT

A squarylium dye [A] that has high invisibility, i.e., exhibits low absorption in the visible light region (400 nm to 750 nm), has excellent near-infrared absorption capability and high light resistance, tends not to exhibit aggregations, and has specific X-ray diffraction peaks; and an image-forming material and the like containing the squarylium dye [A] having said characteristics. The problem is solved by a squarylium dye [A] having specific X-ray diffraction peaks represented by general formula (1). Moreover, the problem is also solved by various materials containing the squarylium dye [A].

15 Claims, 3 Drawing Sheets

(51) Int. Cl.
   *C09D 5/32*      (2006.01)
   *C09D 11/037*    (2014.01)
   *C09D 11/328*    (2014.01)
   *C09J 11/06*     (2006.01)
   *H04N 5/335*     (2011.01)

(52) U.S. Cl.
   CPC ............ *C09D 11/328* (2013.01); *C09J 11/06* (2013.01); *G02B 5/208* (2013.01); *G03G 9/0906* (2013.01); *H04N 5/335* (2013.01)

(56) References Cited

FOREIGN PATENT DOCUMENTS

| | | |
|---|---|---|
| JP | 2007111940 | 5/2007 |
| JP | 2009091517 | 4/2009 |
| JP | 2009209297 | 9/2009 |
| JP | 2010106153 | 5/2010 |
| JP | 2010180308 | 8/2010 |
| JP | 2010184975 | 8/2010 |
| JP | 2010184980 | 8/2010 |
| JP | 2012003225 | 1/2012 |

OTHER PUBLICATIONS

Office Action of Japan Counterpart Application, with English translation thereof, drafted on Dec. 7, 2017, pp. 1-7.
"International Search Report (Form PCT/ISA/210) of PCT/JP2018/022162," dated Aug. 28, 2018, with English translation thereof, pp. 1-4.

* cited by examiner

SQUARYLIUM DYE AND COMPOSITION CONTAINING SAME

CROSS-REFERENCE TO RELATED APPLICATION

This application is a continuation of international PCT application serial no. PCT/JP2018/022162, filed on Jun. 11, 2018, which claims the priority benefit of Japan application no. 2017-115709, filed on Jun. 13, 2017, and the priority benefit of Japan application no. 2017-198974, filed on Oct. 13, 2017. The entirety of each of the above-mentioned patent applications is hereby incorporated by reference herein and made a part of this specification.

TECHNICAL FIELD

The disclosure relates to a specific squarylium dye and a composition containing the same.

DESCRIPTION OF RELATED ART

Near-infrared absorbing dyes are dyes having an absorption band generally in a near-infrared region of 750 nm to 1,200 nm, and main applications thereof include in an optical filter for a semiconductor light-receiving element having a function of absorbing and blocking near-infrared light, a near-infrared cut filter for an electronic device, a near-infrared filter for photography, a near-infrared absorption film and near-infrared absorption plate that block heat radiation for energy saving, a near-infrared absorption film for agriculture for selective use of sunlight, a recording medium using near-infrared absorption heat, protective glasses, glasses, sunglasses, near-infrared cut cosmetics, a heat radiation blocking film, an electrophotographic photoreceptor, a laser welding material, a laser marking material, and the like. In addition, they are also useful in a CCD camera noise cut filter, and a CMOS image sensor filter.

In addition, use in a security printing field has also been proposed. In recent years, technologies for recording invisible information that is not visible in general visual conditions in documents and securities such as stock certificates, bonds, checks, gift certificates, lottery tickets, and commuter passes and optically reading the information have been focused on. Such technologies are very useful in security management and the like, and are effective in improving the added value of documents and the like, and in strengthening measures for counterfeit prevention for security and the like.

For recording invisible information, there is a method in which an image forming material using a dye having absorption specifically in a near-infrared region of 750 nm to 1,000 nm that is not visible to the human eye is used. Such invisible information can be detected by a light-receiving element (CCD, CMOS, etc.) made of silicon or the like even though it is not visible to the human eye.

Regarding typical dyes having absorption in a near-infrared region of 750 nm to 1,000 nm, phthalocyanine dyes, cyanine dyes, diimonium dyes, squarylium dyes, and croconium dyes are known. Among these, phthalocyanine dyes and cyanine dyes are particularly typical dyes. Respective dyes have distinctive features, and phthalocyanine dyes have a relatively robust structure so that various resistances are favorable, but transparency and invisibility are poor because there is absorption derived from a structure called a Soret band in a visible light region. On the other hand, cyanine dyes are generally used in a dissolved state as dyes, they have very high transparency and invisibility, but various resistances, particularly, light resistance, are very poor. Diimonium dyes, squarylium dyes, and croconium dyes have characteristics similar to those of cyanine dyes.

Regarding image forming materials, perimidine squarylium dyes are known as dyes having high light resistance and invisibility (for example, refer to Patent Literature 1 to 5). When specific perimidine squarylium dyes are used as dispersed particles, light resistance is improved. However, regarding Patent Literature 1 to 4, light resistance is insufficient, and regarding Patent Literature 5, light resistance is at a practical level, but the dyes easily aggregate, and thus there are major problems in processability as image forming materials such as regards dispersibility, viscosity, and storage stability over time.

[Patent Literature 1]
   Japanese Patent Laid-Open No. 2009-91517
[Patent Literature 2]
   Japanese Patent Laid-Open No. 2010-106153
[Patent Literature 3]
   Japanese Patent Laid-Open No. 2010-184975
[Patent Literature 4]
   Japanese Patent Laid-Open No. 2010-184980
[Patent Literature 5]
   Japanese Patent Laid-Open No. 2009-209297

As described above, although near-infrared absorbing dyes are beneficial in various applications, regarding near-infrared absorbing dyes hitherto, no dyes that satisfy all preferable requirements such as high invisibility and near-infrared absorption capability/high resistance/easy dispersibility have been provided.

SUMMARY

An aspect of the disclosure is to provide a squarylium dye [A] which has high invisibility, that is, low absorption in a visible light region (400 nm to 750 nm), and high near-infrared absorption capability and durability, and is unlikely to aggregate, and a composition containing the same.

A squarylium dye [A] which is represented by the following General Formula (1) and has diffraction peaks at least at a Bragg angle 2θ (±0.2°) of 8.6°, 12.4°, 17.5°, 20.2°, 22.2° and 25.4° in an X-ray diffraction pattern according to CuKα rays:

General Formula (1)

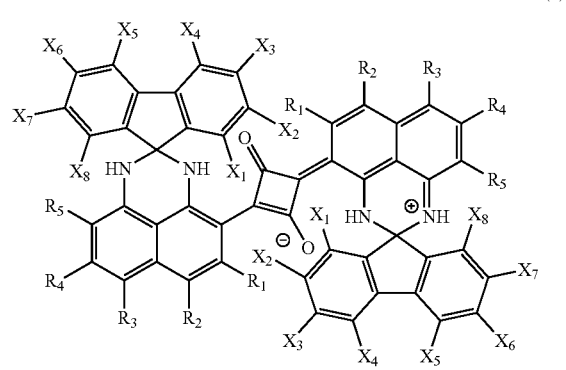

[in General Formula (1),
   $R_1$ to $R_5$ each independently represent a hydrogen atom, a sulfo group or a halogen atom.
   $X_1$ to $X_8$ each independently represent a hydrogen atom, an alkyl group which may have a substituent, an alkenyl group which may have a substituent, an aryl group which may have a substituent, an aralkyl group which may have a substituent, an alkoxy group which may have a substituent, an aryloxy group which may have a substituent, a hydroxyl group, an amino group, —$NR_6R_7$, a sulfo group, —$SO_2NR_8R_9$, —$COOR_{10}$, —$CONR_{11}R_{12}$, a nitro group, a cyano group or a halogen atom.

$R_6$ to $R_{12}$ each independently represent a hydrogen atom, an alkyl group which may have a substituent, an aryl group which may have a substituent, an acyl group which may have a substituent or a pyridinyl group which may have a substituent. $R_6$ and $R_7$, $R_8$ and $R_9$ and $R_{11}$ and $R_{12}$ may be bonded to each other to form a ring.]

In the squarylium dye [A], in General Formula (1), $R_1$ to $R_5$ are all hydrogen atoms, or four thereof are hydrogen atoms and one thereof is a sulfo group or a halogen atom.

In the squarylium dye [A], in General Formula (1), $X_1$ to $X_8$ represent a hydrogen atom.

A near-infrared absorbing composition including the squarylium dye [A] and at least one selected from the group consisting of a resin [B], a dispersant [C], a photopolymerizable monomer, a photopolymerization initiator, an organic solvent and water.

A solid-state image sensing device composition including the squarylium dye [A], a resin [B], a dispersant [C], a photopolymerizable monomer, a photopolymerization initiator and an organic solvent.

A near-infrared cut filter formed of the solid-state image sensing device composition on a substrate.

A solid-state image sensing device including the near-infrared cut filter.

An image forming material including the squarylium dye [A].

The image forming material may be a toner for electrophotography, an ink for an inkjet printer, an ink for a thermal printer, or an ink for letterpress, offset, flexo, gravure, or silk printing.

A paint including the squarylium dye [A].

An adhesive including the squarylium dye [A].

A pressure-sensitive adhesive including the squarylium dye [A].

A molded product including the squarylium dye [A].

A laser welding material including the squarylium dye [A].

A laser welded assembly made of the laser welding material.

According to one or more embodiments of the disclosure, it is possible to provide a squarylium dye [A] which has high invisibility; that is, low absorption in a visible light region (400 nm to 750 nm), and high near-infrared absorption capability and durability, and is unlikely to aggregate, and a composition containing the same.

DESCRIPTION OF EMBODIMENTS

Figure 1:
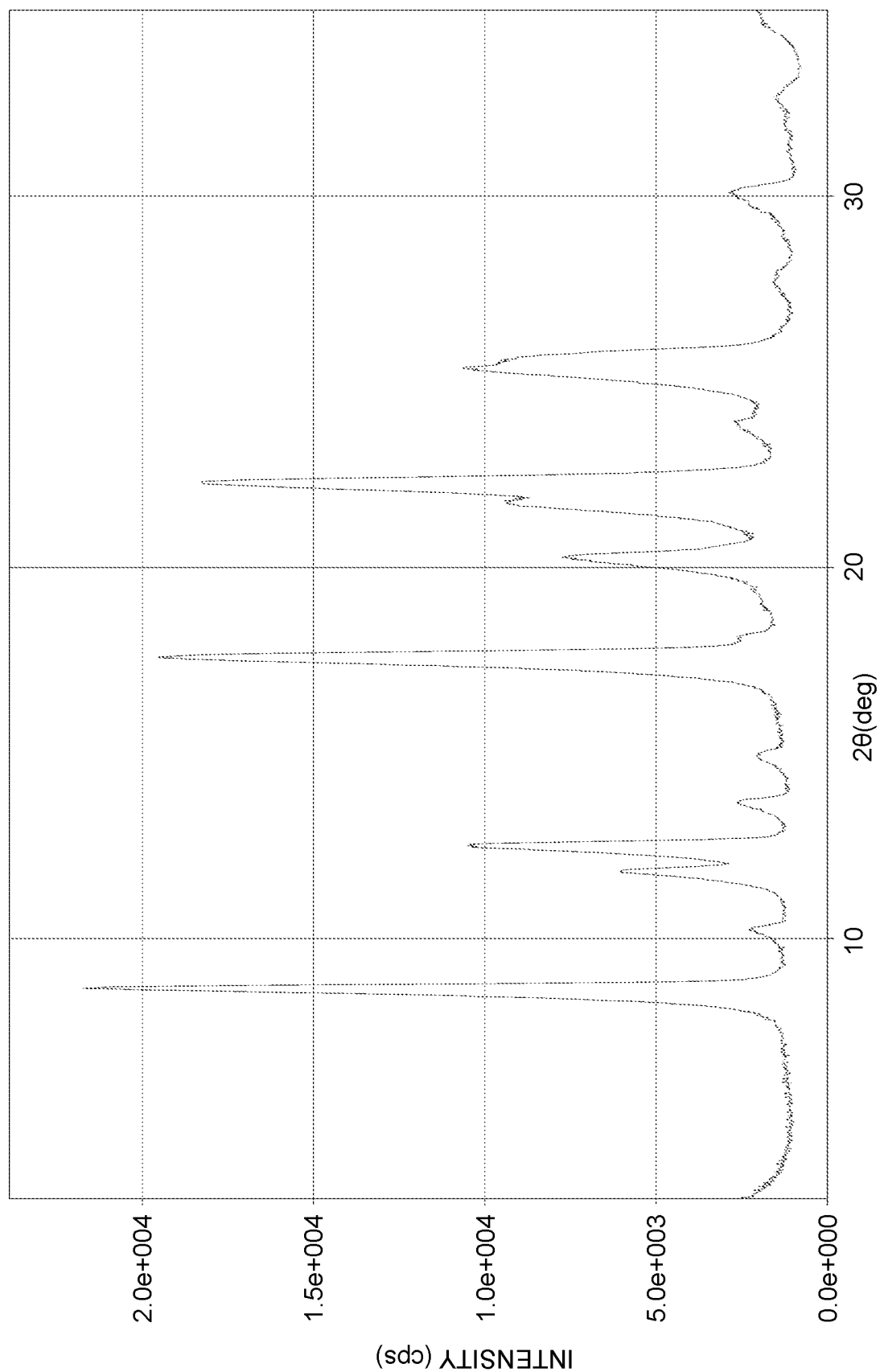
FIG. 1 is an X-ray diffraction diagram of a squarylium dye [A-1] produced in Example 1.

Terms used in the present specification will be defined. "(Meth)acrylic," "(meth)acrylate," "(meth)acryloyl," and the like mean "acrylic or methacrylic," "acrylate or methacrylate," "acryloyl or methacryloyl," and the like. For example "(meth)acrylic acid" means "acrylic acid or methacrylic acid." "Monomer" refers to a compound containing an ethylenically unsaturated group.

A squarylium dye [A] of the present specification has not only strong color development and high robustness derived from a chemical structure but also strong crystallinity having a specific X-ray diffraction peak. According to the present specification, it is possible to provide a squarylium dye [A] which has excellent optical properties (invisibility and near-infrared absorption capability) as a near-infrared absorbing dye and various resistances, and is unlikely to aggregate, that is, easily dispersed, and has excellent storage stability. The squarylium dye [A] can be appropriately used for various applications, for example, in an image forming material, a near-infrared absorption material, a paint, an adhesive, a pressure-sensitive adhesive, a masterbatch, a molded product, a film, a near-infrared cut filter, a solid-state image sensing device, a heat radiation cutting material, a photothermal conversion material, and a laser welding material.

<Squarylium Dye [A]>

The squarylium dye [A] of the present specification is represented by General Formula (1) and has diffraction peaks at least at a Bragg angle 2θ (+0.2°) of 8.6°, 12.4°, 17.5°, 20.2°, 22.2° and 25.4° in an X-ray diffraction pattern according to CuKα rays, and has excellent optical properties (invisibility and near-infrared absorption capability) as a near-infrared absorbing dye.

General Formula (1)

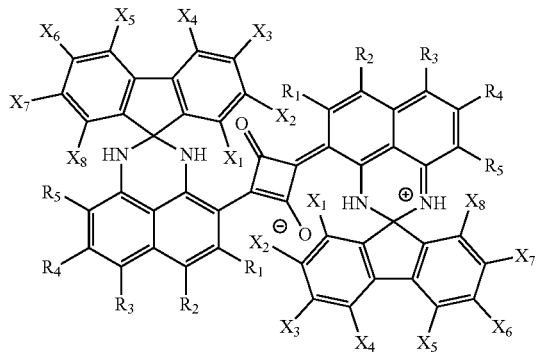

[in General Formula (1), $R_1$ to $R_5$ each independently represent a hydrogen atom, a sulfo group or a halogen atom.

$X_1$ to $X_8$ each independently represent a hydrogen atom, an alkyl group which may have a substituent, an alkenyl group which may have a substituent, an aryl group which may have a substituent, an aralkyl group which may have a substituent, an alkoxy group which may have a substituent, an aryloxy group which may have a substituent, a hydroxyl group, an amino group, —$NR_6R_7$, a sulfo group, —$SO_2NR_8R_9$, —$COOR_{10}$, —$CONR_{11}R_{12}$, a nitro group, a cyano group or a halogen atom. $R_6$ to $R_{12}$ each independently represent a hydrogen atom, an alkyl group which may have a substituent, an aryl group which may have a substituent, an acyl group which may have a substituent or a pyridinyl group which may have a substituent. $R_6$ and $R_7$, $R_8$ and $R_9$ and $R_{11}$ and $R_{12}$ may be bonded to each other to form a ring.]

In $R_1$ to $R_5$, examples of a "halogen atom" include a fluorine atom, a bromine atom, a chlorine atom, and an iodine atom.

In order to impart resistance, preferably, at least four of $R_1$ to $R_5$ are hydrogen atoms. In particular, more preferably, all of them are hydrogen atoms, or four thereof are hydrogen atoms and one thereof is a sulfo group or a halogen atom, and particularly preferably, all of them are hydrogen atoms.

Examples of an "alkyl group which may have a substituent" in $X_1$ to $X_8$ include a methyl group, an ethyl group, an n-propyl group, an isopropyl group, a tert-butyl group, an isobutyl group, a tert-amyl group, a 2-ethylhexyl group, a stearyl group, a chloromethyl group, a trichloromethyl group, a trifluoromethyl group, a 2-methoxyethyl group, a 2-chloroethyl group, a 2-nitroethyl group, a cyclopentyl group, a cyclohexyl group, and a dimethylcyclohexyl group. Among these, a methyl group or an ethyl group is preferable in consideration of synthesis difficulty.

Examples of an "alkenyl group which may have a substituent" in $X_1$ to $X_8$ include a vinyl group, a 1-propenyl group, an allyl group, a 2-butenyl group, a 3-butenyl group, an isopropenyl group, an isobutenyl group, a 1-pentenyl group, a 2-pentenyl group, a 3-pentenyl group, a 4-pentenyl group, a 1-hexenyl group, a 2-hexenyl group, a 3-hexenyl group, a 4-hexenyl group, and a 5-hexenyl group. Among these, a vinyl group or an allyl group is preferable in consideration of synthesis difficulty.

Examples of an "aryl group which may have a substituent" in $X_1$ to $X_8$ include a phenyl group, a naphthyl group, a 4-methylphenyl group, a 3,5-dimethylphenyl group, a pentafluorophenyl group, a 4-bromophenyl group, a 2-methoxyphenyl group, a 4-diethylaminophenyl group, a 3-nitrophenyl group, and a 4-cyanophenyl group. Among these, a phenyl group or a 4-methylphenyl group is preferable in consideration of synthesis difficulty.

Examples of an "aralkyl group which may have a substituent" in $X_1$ to $X_8$ include a benzyl group, a phenethyl group, a phenylpropyl group, and a naphthylmethyl group. Among these, a benzyl group is preferable in consideration of synthesis difficulty.

Examples of an "alkoxy group which may have a substituent" in $X_1$ to $X_8$ include a methoxy group, an ethoxy group, an n-propoxy group, an isopropoxy group, an n-butoxy group, an n-octyloxy group, a 2-ethylhexyloxy group, a trifluoromethoxy group, a cyclohexyloxy group, a stearyloxy group, and a 2-(diethylamino)ethoxy group. Among these, a methoxy group, an ethoxy group, a trifluoromethoxy group, or 2-(diethylamino)ethoxy group is preferable in consideration of synthesis difficulty.

Examples of an "aryloxy group which may have a substituent" in $X_1$ to $X_8$ include a phenoxy group, a naphthyloxy group, a 4-methylphenyloxy group, a 3,5-chlorophenyloxy group, a 4-chloro-2-methylphenyloxy group, a 4-tert-butylphenyloxy group, a 4-methoxyphenyloxy group, a 4-diethylaminophenyloxy group, and a 4-nitrophenyloxy group. Among these, a phenoxy group or a naphthyloxy group is preferable in consideration of synthesis difficulty.

Examples of a "halogen atom" in $X_1$ to $X_8$ include a fluorine atom, a bromine atom, a chlorine atom, and an iodine atom.

Preferably, $X_1$ to $X_8$ each independently represent a hydrogen atom, an alkyl group which may have a substituent, a hydroxyl group, an amino group, a sulfo group, —$COOR_{10}$, a nitro group or a halogen atom, and particularly preferably, $X_1$ to $X_8$ are all hydrogen atoms in consideration of dispersibility, storage stability, and synthesis difficulty.

Examples of an "alkyl group which may have a substituent" in $R_6$ to $R_{12}$ include a methyl group, an ethyl group, an n-propyl group, an isopropyl group, a tert-butyl group, an isobutyl group, a sec-butyl group, a tert-amyl group, a 2-ethylhexyl group, a stearyl group, a chloromethyl group, a trichloromethyl group, a trifluoromethyl group, a 2-methoxyethyl group, a 2-chloroethyl group, a 2-nitroethyl group, a cyclopentyl group, a cyclohexyl group, and a dimethylcyclohexyl group. Among these, a methyl group or an ethyl group is preferable in consideration of synthesis difficulty.

Examples of an "aryl group which may have a substituent" in $R_6$ to $R_{12}$ include a phenyl group, a naphthyl group, a 4-methylphenyl group, a 3,5-dimethylphenyl group, a pentafluorophenyl group, a 4-bromophenyl group, a 2-methoxyphenyl group, a 4-diethylaminophenyl group, a 3-nitrophenyl group, and a 4-cyanophenyl group. Among these, a phenyl group or a 4-methylphenyl group is preferable in consideration of synthesis difficulty.

Examples of an "acyl group which may have a substituent" in $R_6$ to $R_{12}$ include an acetyl group, a propionyl group, a benzoyl group, an acrylyl group, and a trifluoroacetyl group. Among these, an acetyl group is preferable in consideration of synthesis difficulty.

Examples of a "pyridinyl group which may have a substituent" in $R_6$ to $R_{12}$ include a 2-pyridinyl group, a 3-pyridinyl group, a 4-pyridinyl group, and a 2-methyl-4-pyridinyl group. Among these, a 4-pyridinyl group is preferable in consideration of synthesis difficulty.

$R_6$ and $R_7$, $R_8$ and $R_9$, and $R_{11}$ and $R_{12}$ may be bonded to each other to form a ring.

<Method of Producing Squarylium Dye [A]>

The squarylium dye [A] is represented by General Formula (1), and has a specific X-ray diffraction pattern. Regarding a method of producing a squarylium dye represented by General Formula (1), for example, the following method is conceivable. Here, it should be noted that the production method is not limited to the following method.

(Synthesis Example of Squarylium Dye)

1,8-Diaminonaphthalene represented by the following General Formula (2) and fluorenone represented by the following General Formula (3) are heated to reflux in a solvent in the presence of a catalyst and condensed, and 3,4-dihydroxy-3-cyclobutene-1,2-dione represented by the following Formula (4) is then added thereto with additional heating to reflux and condensing, and thereby a squarylium dye represented by General Formula (1) can be synthesized.

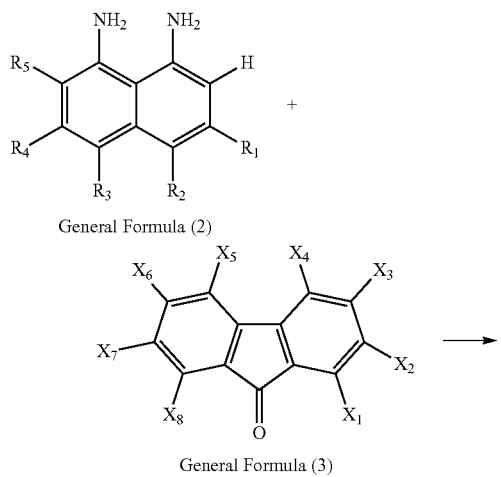

General Formula (2)

General Formula (3)

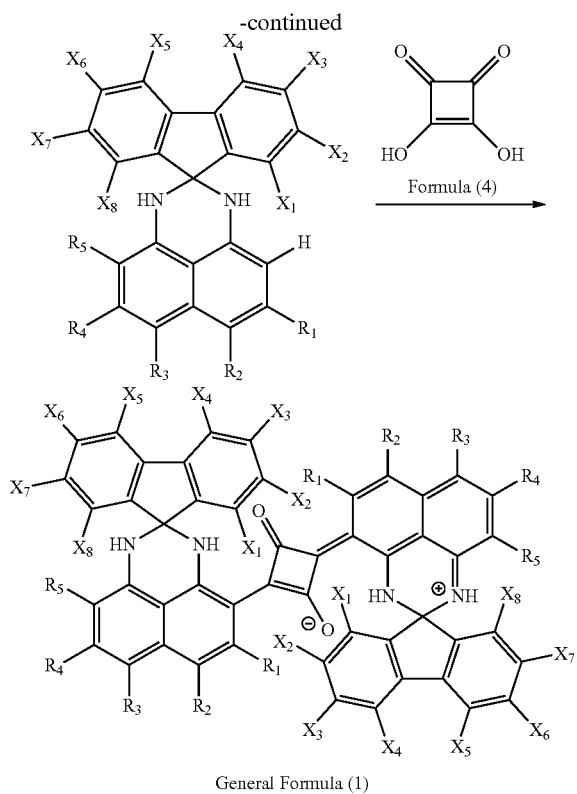

General Formula (1)

(Adjustment and Pigmentation of Crystal Form)

Next, a method of adjusting a crystal form for obtaining the squarylium dye [A] of the present specification having a specific X-ray diffraction pattern from the obtained squarylium dye represented by General Formula (1) will be described. Here, it should be noted that the production method is not limited to the following method.

In order to adjust a crystal form, a method of bringing into contact with an organic solvent such as N,N-dimethylformamide, dimethyl sulfoxide, dimethylacetamide, N-methylpyrrolidone, tetrahydrofuran, or 1,4-dioxane may be used. The above squarylium dye represented by General Formula (1) is mixed into such an organic solvent with stirring and then filtered off and thus a squarylium dye [A] of the present specification having a specific X-ray diffraction pattern is obtained. In this case, heating or cooling may be performed in order to adjust the particle size, and another solvent may be added before filtering.

In addition, the obtained squarylium dye represented by General Formula (1) may be subjected to a pigmentation treatment for various purposes, for example, in order for adjustment to a specific crystal form of the present specification, for the specific crystal form to grow more firmly, for narrowing a particle size distribution, and imparting easy dispersibility.

Examples of a pigmentation method include methods known in the industry used for a general colorant and pigment pigmentation such as an acid pasting method and a solvent salt milling method.

The acid pasting method is a method in which a dye is added to sulfuric acid and dissolved and the sulfuric acid solution is then added dropwise to a large amount of water, and a fine squarylium dye [A] is obtained by precipitation. When an amount of water used during precipitation, the temperature, and the like are optimized, it is possible to obtain particles having a very fine primary particle size, a narrow distribution width, and a sharp particle size distribution.

The solvent salt milling method is a treatment in which a mixture containing a dye, a water-soluble inorganic salt, and a water-soluble organic solvent is mechanically kneaded using a kneading machine such as a kneader, a 2-roll mill, a 3-roll mill, a ball mill, an attritor, and a sand mill, while heating, and washing with water is then performed to remove the water-soluble inorganic salt and the water-soluble organic solvent. The water-soluble inorganic salt functions as a crushing aid, and pigment particles are crushed due to high hardness of the inorganic salt during salt milling. When conditions in the salt milling treatment are optimized, it is possible to obtain a squarylium dye [A] having a very fine primary particle size, a narrow distribution width, and a sharp particle size distribution.

Regarding the water-soluble inorganic salt, sodium chloride, barium chloride, potassium chloride, sodium sulfate, or the like can be used. Sodium chloride (table salt) is preferable because it is cheap. In consideration of both processing efficiency and production efficiency, the amount of the water-soluble inorganic salt used is preferably 50 to 2,000 mass %, more preferably 300 to 1,500 mass %, and most preferably 500 to 1,000 mass % based on the total weight (100 mass %) of the squarylium dye [A].

The water-soluble organic solvent has a function of wetting a squarylium dye [A] and a water-soluble inorganic salt, and is not particularly limited as long as it dissolves (mixes) in water and does not substantially dissolve an inorganic salt used. However, since the temperature rises during salt milling and the solvent easily evaporates, those having a high boiling point of 120° C. or higher are preferable in consideration of safety.

Examples of water-soluble organic solvents include 2-methoxyethanol, 2-butoxyethanol, 2-(isopentyloxy)ethanol, 2-(hexyloxy)ethanol, diethylene glycol, diethylene glycol monoethyl ether, diethylene glycol monobutyl ether, triethylene glycol, triethylene glycol monomethyl ether, liquid polyethylene glycol, 1-methoxy-2-propanol, 1-ethoxy-2-propanol, dipropylene glycol, dipropylene glycol monomethyl ether, dipropylene glycol monoethyl ether, and liquid polypropylene glycol. The amount of the water-soluble organic solvent is preferably in a range of 5 to 1,000 mass %, and more preferably in a range of 50 to 500 mass % based on the total weight (100 mass %) of the squarylium dye [A].

During the solvent salt milling treatment, as necessary, a resin may be added. Here, the type of the resin used is not particularly limited, and a natural resin, a modified natural resin, a synthetic resin, a synthetic resin modified with a natural resin, and the like can be used. The resin used is a solid at room temperature and is preferably water-insoluble and more preferably partially soluble in the water-soluble organic solvent. The amount of the resin used is preferably 2 to 200 mass % based on the total weight (100 mass %) of the squarylium dye [A].

Regarding the squarylium dye [A] of the present specification, two or more types of squarylium dye [A] may be used in combination according to its application. In this case, squarylium dyes [A] that are separately produced may be used by being mixed. Alternatively, those produced by synthesizing or pigmenting two or more types of squarylium dye [A] simultaneously may be used.

<Image Forming Material>

Regarding the image forming material of the present specification, preferably, the squarylium dye [A] of the present specification that is in a dispersion state is used in order to impart resistance.

The content of the squarylium dye [A] in the image forming material is preferably 0.05 to 50 mass % and more preferably 0.1 to 30 mass %.

The squarylium dyes [A] can be used alone or two or more thereof can be used in combination.

Examples of applications of the image forming material of the present specification include in a toner for electrophotography, an ink for an inkjet printer, an ink for a thermal printer, and an ink for letterpress printing, offset printing, flexo printing, gravure printing, or silk printing.

(Electrophotographic Toner Application)

When the image forming material of the present specification is a toner for electrophotography, the image forming material may be used as a one-component developing agent alone or a two-component developing agent combined with a carrier. Regarding the carrier, a known carrier can be used. For example, a resin-coated carrier having a resin coating layer on a core material may be exemplified. A conductive powder and the like may be dispersed in the resin coating layer.

When the image forming material of the present specification is a toner for electrophotography, the image forming material can contain a binding resin. Examples of binding resins include styrenes such as styrene and chlorostyrene, monoolefins such as ethylene, propylene, butylene, and isoprene, vinyl esters such as vinyl acetate, vinyl propionate, vinyl benzoate, and vinyl butyrate, α-methylene aliphatic monocarboxylic acid esters such as methyl acrylate, ethyl acrylate, butyl acrylate, dodecyl acrylate, octyl acrylate, phenyl acrylate, methyl methacrylate, ethyl methacrylate, butyl methacrylate, and dodecyl methacrylate, vinyl ethers such as vinyl methyl ether, vinyl ethyl ether, and vinyl butyl ether, and homopolymers or copolymers of vinyl ketones such as vinyl methyl ketone, vinyl hexyl ketone, and vinyl isopropenyl ketone. Among these, polystyrene, a styrene-alkyl acrylate copolymer, a styrene-alkyl methacrylate copolymer, a styrene-acrylonitrile copolymer, a styrene-butadiene copolymer, a styrene-maleic anhydride copolymer, polyethylene, polypropylene, or the like is preferable. Here, polyester, polyurethane, an epoxy resin, a silicone resin, polyamide, a modified rosin, paraffin wax, or the like can be used as a binding resin.

When the image forming material of the present specification is a toner for electrophotography, the image forming material can further contain, as necessary, a charge control agent, an offset preventing agent, or the like. The charge control agent includes a positive charge control agent and a negative charge control agent, and examples of positive charge control agents include a quaternary ammonium compound. In addition, examples of negative charge control agents include an alkylsalicylic acid metal complex and a resin type charge control agent containing a polar group. Examples of offset preventing agents include a low-molecular-weight polyethylene and a low-molecular-weight polypropylene.

When the image forming material of the present specification is a toner for electrophotography, inorganic powder particles or organic particles may be added as an external additive to the surface of the toner in order to improve fluidity and powder storage stability and in order to improve friction charging control, transfer performance, cleaning performance, and the like. Examples of inorganic powder particles include silica, alumina, titania, calcium carbonate, magnesium carbonate, calcium phosphate, and cerium oxide. In addition, depending on the purpose, a known surface treatment may be performed on inorganic powder particles. Examples of organic particles include emulsion polymers and soap-free polymers containing vinylidene fluoride, methyl methacrylate, styrene-methyl methacrylate, or the like as constituent components.

(Application of Ink for an Inkjet Printer)

<<Aqueous IJ Ink>>

When the image forming material of the present specification is an ink for an inkjet printer, the image forming material may have a form of an aqueous ink containing water. In addition, when the image forming material is an aqueous ink, a water-soluble organic solvent may be additionally included in order to prevent drying of an ink and improve permeability. Examples of water include deionized water, ultra filtered water, and pure water.

Examples of water-soluble organic solvents include polyhydric alcohols such as ethylene glycol, diethylene glycol, polyethylene glycol, and glycerin, esters such as N-alkylpyrrolidones, ethyl acetate, and amyl acetate, lower alcohols such as methanol, ethanol, propanol, and butanol, and glycol ethers such as ethylene oxide or propylene oxide adducts of methanol, butanol, and phenol. The organic solvent may be of one type or of two or more types. The organic solvent is selected in consideration of hygroscopic properties, moisture retaining properties, squarylium dye solubility, permeability, viscosity of an ink, a freezing point, and the like. The content of the organic solvent in the ink for an inkjet printer is, for example, preferably 1 mass % or more and 60 mass % or less.

When the image forming material of the present specification is an aqueous IJ ink, the aqueous resin may be contained. Examples of aqueous resins include a water-soluble resin that dissolves in water, a water-dispersible resin that disperses in water, a colloidally dispersed resin, and a mixture thereof. Examples of aqueous resins include acrylic resins, styrene-acrylic resins, polyester resins, polyamide resins, polyurethane resins, and fluorine resins.

In addition, in order to improve dispersion of a dye and image quality, a surfactant and a dispersant may be used. Examples of surfactants include anionic, nonionic, cationic, and zwitterionic surfactants. Among these, an anionic or nonionic surfactant is preferable. Examples of anionic surfactants include fatty acid salts, alkyl sulfate ester salts, alkylbenzenesulfonates, alkylnaphthalenesulfonates, dialkylsulfosuccinates, alkyl diaryl ether disulfonates, alkyl phosphates, polyoxyethylene alkyl ether sulfates, polyoxyethylene alkyl aryl ether sulfates, naphthalenesulfonic acid formalin condensates, polyoxyethylene alkyl phosphate ester salts, glycerol borate fatty acid esters, and polyoxyethylene glycerol fatty acid esters.

Examples of nonionic surfactants include polyoxyethylene alkyl ethers, polyoxyethylene alkyl aryl ethers, polyoxyethyleneoxypropylene block copolymers, sorbitan fatty acid esters, polyoxyethylene sorbitan fatty acid esters, polyoxyethylene sorbitol fatty acid esters, glycerin fatty acid esters, polyoxyethylene fatty acid esters, polyoxyethylene alkylamines, fluorine surfactants, and silicone surfactants.

When the image forming material of the present specification has a form of an aqueous IJ ink, an aqueous resin may be contained as a fixing resin and/or a dispersant. Examples of aqueous resins include a water-soluble resin that dissolves in water, a water-dispersible resin that disperses in water, a colloidally dispersed resin, or a mixture thereof. Specific examples of aqueous resins include acrylic resins, styrene-acrylic resins, polyester resins, polyamide resins, polyurethane resins, and fluorine resins.

<<Non-Aqueous IJ Ink>>

When the image forming material of the present specification is an ink for an inkjet printer, the image forming material may have a form of a non-aqueous IJ ink. When the image forming material has a form of a non-aqueous ink, a non-aqueous vehicle may be contained as a medium. Examples of resins used for a non-aqueous vehicle include petroleum resins, casein, shellac, rosin modified maleic resins, rosin modified phenolic resins, nitrocellulose, cellulose acetate butyrate, cyclized rubbers, chlorinated rubbers, oxidized rubbers, hydrochloric acid rubbers, phenolic resins, alkyd resins, polyester resins, unsaturated polyester resins, amino resins, epoxy resins, vinyl resins, vinyl chloride, vinyl chloride-vinyl acetate copolymers, acrylic resins, methacrylic resins, polyurethane resin, silicone resins, fluorine resins, drying oil, synthetic drying oil, styrene/maleic acid resins, styrene/acrylic resins, polyamide resins, polyimide resins, benzoguanamine resins, melamine resins, urea resin chlorinated polypropylene, butyral resins, and vinylidene chloride resins. A photocurable resin may be used as a non-aqueous vehicle.

Examples of solvents used in a non-aqueous vehicle include an aromatic solvent such as toluene, xylene, and methoxybenzene, an acetate solvent such as ethyl acetate, butyl acetate, propylene glycol monomethyl ether acetate, and propylene glycol monoethyl ether acetate, a lactate ester solvent such as methyl lactate, ethyl lactate, propyl lactate, butyl lactate, ethyl hexyl lactate, amyl lactate, and isoamyl lactate, a propionate solvent such as ethoxyethyl propionate, an alcohol solvent such as methanol and ethanol, an ether solvent such as butyl cellosolve, propylene glycol monomethyl ether, diethylene glycol ethyl ether, and diethylene glycol dimethyl ether, a ketone solvent such as methyl ethyl ketone, methyl isobutyl ketone, and cyclohexanone, an aliphatic hydrocarbon solvent such as hexane, a nitrogen compound solvent such as N,N-dimethylformamide, N,N-dimethylacetamide, γ-butyrolactam, N-methyl-2-pyrrolidone, aniline, and pyridine, a lactone solvent such as γ-butyrolactone, and carbamates such as a mixture of methyl carbamate and ethyl carbamate at 48:52.

Here, a dispersant may be used in order to improve dispersion of a dye and improve image quality. The structure of the dispersant is not particularly limited as long as a dye adsorption site (main chain) and a dispersion stabilization site (side chain) are arranged in a well-balanced manner, and generally, a dispersant of a type called a comb framework is more preferably used.

Examples of dispersants include resins such as polyurethane, polyacrylic acid, polyacrylic acid ester, polyacrylonitrile, polyester, polyamide, polyimide, polyurea, polyallylamine, and polyethyleneimine in the main chain framework and polyester resins such as polyurethane, polyacrylic acid, polyacrylic ester, polyacrylonitrile, polycaprolactone, and polyvalerolactone in the side chain framework.

In order to reduce the viscosity of a dispersing element and improve storage stability of an ink, a compound in which the main chain includes polyallylamine or polyethyleneimine and the side chain includes a polyester such as polycaprolactone and polyvalerolactone, and the main chain is modified to introduce an oxyalkylenecarbonyl group is preferable. A compound in which the main chain includes polyethyleneimine and the side chain includes at least an oxyalkylenecarbonyl group is more preferable.

A dispersant in which the main chain includes polyethyleneimine and the side chain includes at least an oxyalkylenecarbonyl group can be synthesized using a known method. For example, a dispersant can be obtained using a material obtained by reacting an organic acid such as glycolic acid with a lactone such as polycaprolactone described in Published Japanese Translation No. 2002-509787 of the PCT International Publication that is reacted with a polyamine or a polyimine such as polyethyleneimine at 100 to 180° C. under a nitrogen atmosphere.

When the image forming material of the present specification is an ink for an inkjet printer, in order to satisfy various conditions required for an inkjet printer system, the image forming material according to the present embodiment can contain an additive conventionally known as an ink component. Examples of such an additive include a pH adjusting agent, a specific resistance adjusting agent, an antioxidant, a preservative, an antifungal agent, and a metal sequestering agent. Examples of pH adjusting agents include alcoholic amines, ammonium salts, and metal hydroxides. In addition, examples of specific resistance adjusting agents include organic salts and inorganic salts. Examples of metal sequestering agents include a chelating agent.

When the image forming material of the present specification is an ink for an inkjet printer, a water-soluble resin such as a polyvinyl alcohol, polyvinylpyrrolidone, carboxymethylcellulose, a styrene-acrylic acid resin, or a styrene-maleic acid resin can be included to the extent that there is no blocking of a spray nozzle part or no change in the ink discharge direction.

(Other Applications)

When the image forming material of the present specification is an ink for a thermal printer or an ink for letterpress printing, offset printing, flexo printing, gravure printing or silk printing, the image forming material can have a form of an oily ink containing a polymer or an organic solvent. Generally, examples of polymers include natural resins such as proteins, rubber, celluloses, sierac, copal, starch, and rosin; thermoplastic resins such as vinyl resins, acrylic resins, styrene resins, polyolefin resins, and novolac phenolic resins; and thermosetting resins such as resole type phenolic resin urea resins, melamine resins, polyurethane resins, epoxies, and unsaturated polyester. In addition, regarding the organic solvent, the organic solvents exemplified in the description of the ink for an inkjet printer may be exemplified.

When the image forming material of the present specification is an ink for a thermal printer or an ink for letterpress printing, offset printing, flexo printing, gravure printing or silk printing, the image forming material can further contain additives such as a plasticizer for improving flexibility and strength of a printed film, a solvent for adjusting viscosity and improving drying properties, a drying agent, a viscosity adjusting agent, a dispersant, and various reactants.

Then image forming material of the present specification may further contain a stabilizer. The stabilizer receives energy from an organic near-infrared absorbing dye in an excited state, and a compound having an absorption band in a longer wavelength range than an absorption band of the organic near-infrared absorbing dye is preferable. In addition, a stabilizer is preferable because it does not easily decompose due to singlet oxygen and it has high compatibility with the squarylium dye [A] of the present specification. Examples of stabilizers include an organic metal complex compound. Here, regarding the stabilizer, a Ni complex compound is preferable.

(Method of Producing Image Forming Material)

An exemplary method of producing an image forming material of the present specification will be described below.

For example, when it is used in a dispersion state, a method of mixing a squarylium dye [A] and a dispersant and performing a pigmentation treatment on the liquid mixture may be exemplified. Here, as will be described below, any known dispersant can be used without limitation as long as it can disperse the squarylium dye [A] of the present specification. A low-molecular-weight dispersant such as an active agent can be used and a high-molecular-weight dispersant such as a resin dispersant can be used. In addition, examples of adsorbing groups in the dispersant include acidic groups such as a carboxylic acid group, a sulfonic acid group, and a phosphate group, basic groups such as a primary amino group, a secondary amino group, a tertiary amino group, and a quaternary ammonium salt, and neutral groups such as a hydroxyl group, and they can be used without particular limitation.

(Method of Evaluating Image Forming Material)

The squarylium dye [A] of the present specification has a sufficiently low absorbance in a visible light wave length region of 400 nm or more and 750 nm or less and has a sufficiently high absorbance in a near-infrared wavelength region of 750 nm or more and 1,000 nm or less. In addition, the squarylium dye [A] of the present specification has excellent light resistance. The image forming material containing the squarylium dye [A] of the present specification can achieve invisibility of information and readability of invisible information, and additionally achieve long-term stability in a recording medium in which invisible information is recorded.

It is preferable for the squarylium dye [A] of the present specification to satisfy conditions represented by the following Formulae (I) and (II). When conditions represented by the following Formulae (I) and (II) are satisfied, regardless of the color of the image forming material, it is possible to achieve both invisibility of information and readability of invisible information, and additionally, long-term reliability in a recording medium in which invisible information is recorded can be realized.

$$0 \leq \Delta E \leq 15 \quad (I)$$

$$(100-R) \geq 75 \quad (II)$$

[in Formula (II), $\Delta E$ represents a color difference in the CIE1976L*a*b* color system represented by the following Formula (III):

$$\Delta E = \sqrt{(L_1-L_2)^3 + (a_1-a_2)^2 + (b_1-b_2)^2} \quad (III)$$

[in Formula (III), $L_1$, $a_1$, and $b_1$ represent the L value, the a value, and the b value on the surface of the recording medium before image formation, respectively, and $L_2$, $a_2$, and $b_2$ represent the L value, the a value, and the b value in an image area when a fixed image having an adhesion amount of 4 g/m² is formed on the surface of the recording medium using the image forming material), and in Formula (II), R (unit: %) represents an infrared reflectance at a wavelength of 850 nm in the image area.]

$L_1$, $a_1$, $b_1$, $L_2$, $a_2$, and $b_2$ can be obtained using a reflection spectral densitometer. $L_1$, $a_1$, $b_1$, $L_2$, $a_2$, and $b_2$ in the present specification can be measured using an x-rite939 (commercially available from X-Rite Inc.) as a reflection spectral densitometer.

Regarding invisible information recorded using the image forming material of the present specification, for example, a semiconductor laser or a light emitting diode that emits light at any wavelength of 750 nm or more and 1,000 nm or less is used as a light source for optical reading. When a general-purpose light-receiving element having high spectral sensitivity for near infrared light is used, it is possible to read out information very easily and with high sensitivity. Examples of light-receiving elements include a light-receiving element (CCD, etc.) made of silicon.

<Paint, Pressure-Sensitive Adhesive or Adhesive>

The squarylium dye [A] of the present specification can be included in a paint, a pressure-sensitive adhesive, or an adhesive. As an example of production, when the squarylium dye [A] of the present specification is used in a "dispersion state," in addition to the squarylium dye [A] and a resin [B], a dispersant [C] that can disperse the squarylium dye [A], other components, and the like may be added so that a dispersed resin composition can be produced using a known dispersion device. Examples of known dispersion devices include a kneader, a 2-roll mill, a 3-roll mill, a ball mill, a horizontal sand mill, a vertical sand mill, an annular type bead mill, and an attritor.

<Masterbatch>

The squarylium dye [A] of the present specification with a high concentration can be included in and used in a masterbatch. A method of obtaining a masterbatch is shown below and is not limited thereto. Preferably, the squarylium dye [A], a thermoplastic resin as the resin [B], and other additives are mixed, melted and kneaded and molded into a pellet form to produce a masterbatch. Mixing is preferably performed using a general high speed shear mixer or a rotary mixer such as a Henschel mixer, a super mixer, or a tumbler mixer. In addition, examples of a melting and kneading device include a 2-roller, a 3-roller, a pressure kneader, a Banbury mixer, a single-screw kneading extruder, and a twin-screw kneading extruder. A heating temperature during melting and kneading is not particularly limited as long as it is a temperature at which the thermoplastic resin melts, such as for example, about 180 to 350° C.

<Layer and Laminate>

The squarylium dye [A] of the present specification can be applied to a known substrate using a known method, and thus a layer and laminate containing the squarylium dye [A] can be obtained.

(Substrate)

Preferable examples of known substrates include a plastic film, a plastic sheet, a plastic plate, paper, a metal foil, a metal plate, glass, a ceramic, and wood.

(Coating Method)

Examples of a coating method include spray coating, spin coating, slit coating, roll coating, and inkjet, screen, gravure, offset, and flexo coating.

<Molded Product (Including a Film)>

The molded product (including a film) is not particularly limited and any known molding method can be used. For example, a (1) method in which a thermoplastic resin and the squarylium dye [A] of the present specification are mixed, and then melted and kneaded and then molded and a (2) method in which a thermoplastic resin, the squarylium dye [A] of the present specification, and a polymerization initiator are polymerized in a frame and molded may be exemplified. Examples of molding methods include known molding methods such as an injection molding method (also including a gas injection mold), an ultra-high speed injection molding method, an injection compression molding method (press injection), a two-color molding method, a hollow molding method such as a gas assist method, a molding method using a heat insulation mold, a molding method using a rapid heating mold, foam molding (also including a supercritical fluid), insert molding, an in a mold coating mold (IMC) molding method, an extrusion molding method, hollow molding, a calendar molding method, a sheet molding method, a film molding method, a thermoforming method, a rotational molding method, a laminate molding method, a press molding method, and a blow molding method.

Examples of a device for producing a molded product include a single screw extruder, a twin screw extruder, a Banbury mixer, a roll kneader, a kneader, and a Brabender Plastograph.

The molded product can be formed into a flat shape, a curved shape, or any shape. In addition, regarding the thickness of the molded product, it can be arbitrarily adjusted for a film shape, a plate shape, or the like. A molded product that has been formed temporarily can be post-processed to mold any complicated shape.

Figure 4:
FIG. 4 is a cross-sectional view schematically showing a molded product.

The molded sheet in FIG. 4 will be exemplified as a molded product. A molded sheet 401 is produced by melting and kneading a composition containing the squarylium dye [A] and a thermoplastic resin as the resin [B] using, for example, a calendar molding machine, and performing film molding. The thickness of the molded sheet 401 is generally about 1 an to 1 mm.

<Near-Infrared Absorbing Composition>

The near-infrared absorbing composition of the present specification contains at least one component selected from the group consisting of the squarylium dye [A], the resin [B], the dispersant [C], a photopolymerizable monomer, a photopolymerization initiator, an organic solvent, and water. In addition, components such as a curing agent, a curing accelerator, a chain transfer agent, an antioxidant, a leveling agent, a light absorbing dye, a light stabilizer, a UV absorber, inorganic fine particles, an active agent, and an anti-foaming agent may be contained.

The squarylium dye [A] used in the near-infrared absorbing composition of the present specification that is in a dispersion state is preferably used in order to impart resistance.

A near-infrared absorbing composition containing the squarylium dye [A] of the present specification has excellent optical properties (invisibility and near-infrared absorption capability) as a near-infrared absorbing dye and various resistances, and is unlikely to aggregate, that is, easily dispersed, and has excellent storage stability. Therefore, it can be used for various applications such as in a paint, an adhesive, a pressure-sensitive adhesive, a masterbatch, a molded product, a film, a near-infrared cut filter, a solid-state image sensing device, a heat radiation cutting material, a photothermal conversion material, and a laser welding material.

<Resin [B]>

Regarding the resin [B], as will be described below, depending on applications and required performance, a known aqueous or solvent resin can be used without limitation, and depending on applications, one type thereof can be appropriately selected and used or two or more types thereof can be used in combination.

(When Used for Coating)

In an application in which the near-infrared absorbing composition of the present specification is used for coating such as a paint, the resin [B] preferably has a binding ability. Examples of the resin [B] include an aliphatic ester resin, an acrylic resin, a methacrylic resin, a melamine resin, a urethane resin, an aromatic ester resin, a polycarbonate resin, an aliphatic polyolefin resin, an aromatic polyolefin resin, a polyvinyl resin, a polyvinyl alcohol resin, a modified polyvinyl resin, a polyvinyl chloride resin, a styrene-butadiene copolymer, a polystyrene resin, a polyamide resin, a butyral resin, a styrene-maleic acid copolymer, chlorinated polyethylene, chlorinated polypropylene, a vinyl chloride-vinyl acetate copolymer, polyvinyl acetate, an alkyd resin, a rubber resin, a cyclized rubber resin, polybutadiene, a polyimide resin, and a copolymer resin thereof, and the resin [B] is not limited thereto. In addition, natural polymer materials such as gelatin, casein, starch, cellulose derivatives, and alginate may be exemplified.

(When Used for Inkjet Ink)

In an application in which the near-infrared absorbing composition of the present specification is used for an inkjet ink, regarding the resin [B], the resins described in the ink for an inkjet printer application in the section of the above image forming material can be appropriately selected and used.

(When used to form alkali developable resist material)

When the near-infrared absorbing composition of the present specification is used to form an alkali developable resist material, an alkali-soluble vinyl resin obtained by copolymerizing monomers containing an acidic group is preferably used as a binder resin. In addition, in order to improve light sensitivity and improve solvent resistance, an active energy ray curable resin having an ethylenically unsaturated double bond can be used.

Examples of a vinyl-based alkali-soluble resin obtained by copolymerizing ethylenically unsaturated monomers containing an acidic group include resins containing an acidic group such as an aliphatic carboxyl group and a sulfone group. Examples of alkali-soluble resins include an acrylic resin containing an acidic group, an α-olefin/(anhydrous)maleic acid copolymer, a styrene/styrene sulfonic acid copolymer, an ethylene/(meth)acrylic acid copolymer, and an isobutylene/(anhydrous)maleic acid copolymer. Among these, at least one resin selected from among an acrylic resin containing an acidic group and a styrene/styrene sulfonic acid copolymer, particularly, an acrylic resin containing an acidic group, is appropriately used because it has high heat resistance and transparency.

Examples of an active energy ray curable resin having an ethylenically unsaturated double bond include resins having an unsaturated ethylenic double bond introduced by, for example, the following method (a) or (b).

[Method (a)]

Method (a) is, for example, a method in which a carboxyl group of an unsaturated monobasic acid having an unsaturated ethylenic double bond is addition-reacted with a side chain epoxy group of a copolymer obtained by copolymerizing monomers containing an epoxy group and one or more other monomers, and additionally, a polybasic acid anhydride is reacted with the generated hydroxyl group, and thus an unsaturated ethylenic double bond and a carboxyl group are introduced.

Examples of monomers containing an epoxy group include glycidyl (meth)acrylate, methylglycidyl (meth)acrylate, 2-glycidoxyethyl (meth)acrylate, 3,4-epoxybutyl (meth)acrylate, and 3,4-epoxycyclohexyl (meth)acrylate. Among these, glycidyl (meth)acrylate is preferable in consideration of reactivity with an unsaturated monobasic acid in the next process.

Examples of unsaturated monobasic acids include monocarboxylic acids such as (meth)acrylic acid, crotonic acid, and substituted (meth)acrylic acids with haloalkyl group, alkoxyl group, halogen, nitro group, or cyano group substituents at the α-position.

Examples of polybasic acid anhydrides include succinic anhydride and maleic anhydride.

As a method similar to Method (a), for example, there is a method in which monomers containing an epoxy group are addition-reacted with some of side chain aliphatic carboxyl groups of a copolymer obtained by copolymerizing monomers containing an aliphatic carboxyl group and one or more other monomers and thus an ethylenic double bond and an aliphatic carboxyl group are introduced.

[Method (b)]

Method (b) is a method in which monomers having a hydroxyl group are used, and an isocyanate group of monomers having an isocyanate group is reacted with a side chain hydroxyl group of a copolymer obtained by copolymerizing monomers of an unsaturated monobasic acid having other aliphatic carboxyl groups and other monomers.

Examples of monomers having a hydroxyl group include hydroxyalkyl (meth)acrylates such as 2-hydroxyethyl (meth)acrylate, 2- or 3-hydroxypropyl (meth)acrylate, 2-, or 3-, or 4-hydroxybutyl (meth)acrylate, glycerol (meth)acrylate, and cyclohexanedimethanol mono(meth)acrylate. In addition, polyether mono(meth)acrylates obtained by addition polymerization of ethylene oxide, propylene oxide, and/or butylene oxide, or the like with respect to the above hydroxyalkyl (meth)acrylates, and (poly)ester mono(meth)acrylates obtained by adding (poly)γ-valerolactone, (poly)ε-caprolactone, and/or (poly)12-hydroxystearic acid can also be used. In order to avoid foreign substances in the coating film, 2-hydroxyethyl (meth)acrylate or glycerol (meth)acrylate is preferable.

Examples of monomers having an isocyanate group include 2-(meth)acryloyloxyethyl isocyanate and 1,1-bis[(meth)acryloyloxy]ethyl isocyanate.

Monomers used for synthesizing the resin [B] can be used alone or two or more thereof can be used in combination.

(When Used for Pressure-Sensitive Adhesive)

When the near-infrared absorbing composition of the present specification is used for a pressure-sensitive adhesive, the resin [B] is preferably a pressure-sensitive resin.

Examples of pressure-sensitive adhesives include a (meth)acrylic pressure-sensitive adhesive, a urethane pressure-sensitive adhesive, a silicone pressure-sensitive adhesive, a polyvinyl butyral pressure-sensitive adhesive, an ethylene-vinyl acetate (EVA) pressure-sensitive adhesive, a polyvinyl ether pressure-sensitive adhesive, a saturated amorphous polyester pressure-sensitive adhesive, a melamine pressure-sensitive adhesive, and a rubber pressure-sensitive adhesive. Among these, a (meth)acrylic pressure-sensitive adhesive or a urethane pressure-sensitive adhesive is preferable because these have excellent transparency and various resistances, and effects of the present specification can be better exhibited.

For example, the (meth)acrylic pressure-sensitive adhesive may include a (meth)acrylic acid alkyl ester having an alkyl group having 1 to 20 carbon atoms as a main component. In addition, in order to impart a functional group to the resin [B], a (meth)acrylic resin obtained by copolymerizing monomers containing a functional group such as (meth)acrylic acid and 2-hydroxyethyl (meth)acrylate, or a (meth)acrylic resin copolymerized with other copolymerizable monomers and oligomers, and additionally, a (meth)acrylic resin composition to which a cross-linking agent that reacts with a functional group of the (meth)acrylic resin is added may be used.

Examples of (meth)acrylic acid alkyl esters include methyl (meth)acrylate, ethyl (meth)acrylate, propyl (meth)acrylate, n-butyl (meth)acrylate, iso-butyl (meth)acrylate, t-butyl (meth)acrylate, n-pentyl (meth)acrylate, n-hexyl (meth)acrylate, 2-ethylhexyl (meth)acrylate, n-octyl (meth)acrylate, iso-octyl (meth)acrylate, n-decyl (meth)acrylate, iso-decyl (meth)acrylate, lauryl (meth)acrylate, and stearyl (meth)acrylate.

Examples of monomers having a functional group in the molecule include acrylic acid, methacrylic acid, 2-hydroxyethyl (meth)acrylate, 4-hydroxybutyl (meth)acrylate, 2-hydroxypropyl (meth)acrylate, and 6-hydroxyhexyl (meth)acrylate.

The cross-linking agent need only include two or more functional groups that can react with an acrylic resin in the molecule, and examples thereof include an isocyanate compound, an epoxy compound, an amine compound, an aziridine compound, a melamine compound, a urea resin, and a metal chelating agent.

The urethane pressure-sensitive adhesive contains a urethane resin obtained by reacting a polyol and a polyisocyanate compound. Examples of polyols include polyether polyol, polyester polyol, polycarbonate polyol, and polycaprolactone polyol. Examples of polyisocyanate compounds include diphenylmethane diisocyanate, tolylene diisocyanate, and hexamethylene diisocyanate.

Regarding the silicone pressure-sensitive adhesive, for example, those obtained in which a silicone resin is incorporated or is aggregated can be used.

Examples of silicone pressure-sensitive adhesives include an addition reaction curable silicone pressure-sensitive adhesive and a peroxide curable silicone pressure-sensitive adhesive. Among these, an addition reaction curable silicone pressure-sensitive adhesive is preferable because no peroxide (benzoyl peroxide, etc.) is used therein and no decomposition products are generated.

Regarding the curing reaction of the addition reaction curable silicone pressure-sensitive adhesive, for example, for obtaining a polyalkyl silicone pressure-sensitive adhesive, generally, a method of curing a polyalkyl hydrogen siloxane composition in the presence of a platinum catalyst may be exemplified.

As necessary, the pressure-sensitive adhesive can contain an aging inhibitor, a tackifier, a plasticizer, a softening agent, a surface lubricant, a leveling agent, an antioxidant, a corrosion inhibitor, a light stabilizer, a UV absorber, a heat stabilizer, a polymerization inhibitor, a silane coupling agent, a lubricant, an inorganic or organic filler, a metal powder, and the like.

Examples of aging inhibitors include phenolic derivatives, amine derivatives, phosphorus derivatives, and organic thioates.

Examples of tackifiers include a rosin, a natural resin such as damar, a modified rosin, a polyterpene resin, a modified terpene, an aliphatic hydrocarbon resin, a cyclopentadiene resin, an aromatic petroleum resin, a phenolic resin, an alkyl phenol-acetylene resin, a styrene resin, a xylene resin, a coumarone indene resin, and a vinyltoluene-α-methylstyrene copolymer.

Examples of plasticizers include a phthalic acid plasticizer, a phosphoric acid ester plasticizer, an adipic acid ester plasticizer, a sebacic acid ester plasticizer, a ricinoleic ester plasticizer, a polyester plasticizer, and an epoxy plasticizer.

The pressure-sensitive adhesive for the resin [B] can be synthesized according to, for example, solution polymerization, emulsion polymerization, bulk polymerization, suspension polymerization, or ultraviolet (UV) polymerization. In addition, any suitable crosslinking method may be used, and as necessary, any suitable additive may be used for production.

(When Used for Adhesive)

When the near-infrared absorbing composition of the present specification is used for an adhesive, the resin [B] itself is preferably an adhesive.

Examples of adhesives include a (meth)acrylic adhesive, an α-olefin adhesive, a cellulosic adhesive, a vinyl acetate adhesive, an ethylene-vinyl acetate copolymer (EVA) adhesive, a vinyl chloride adhesive, an epoxy adhesive, a rubber adhesive, a cyanoacrylate adhesive, a silicone adhesive, an isocyanate adhesive, a phenolic adhesive, a polyamide adhesive, a polyimide adhesive, a urethane adhesive, a styrene adhesive, a polyvinyl alcohol adhesive, a polyvinylpyrrolidone adhesive, a polyvinyl butyral adhesive, a melamine adhesive, a urea adhesive, and a resorcinol adhesive. Among these, a urethane adhesive or an epoxy adhesive is preferable because these have excellent transparency and various resistances.

The urethane adhesive includes, for example, a polyol and an isocyanate curing agent component. Examples of polyols include polyether polyol, polyester polyol, polyesterurethane polyol, polycarbonate polyol, and polycaprolactone polyol. Among these, polyester polyol or polyurethane polyol is preferable. The polyester polyol can be generally synthesized by reacting an acid component and a polyol component. Examples of acid components include terephthalic acid, isophthalic acid, sebacic acid, adipic acid, and trimellitic anhydride. Examples of polyol component include ethylene glycol, neopentyl glycol, 1,6-hexanediol, trimethylolpropane, and pentaerythritol. Acid components and polyol components can be used alone or two or more thereof can be used in combination.

A polyesterurethane polyol can be synthesized by reacting a polyester polyol with a diisocyanate compound such as hexamethylene diisocyanate, isophorone diisocyanate, xylylene diisocyanate, or the like.

Regarding the isocyanate curing agent component, a diisocyanate compound such as hexamethylene diisocyanate, isophorone diisocyanate, and xylylene diisocyanate or derivatives of such a diisocyanate compound can be used.

The polyol component and the isocyanate curing agent component are preferably mixed so that a proportion of isocyanate groups in the isocyanate curing agent with respect to hydroxyl groups in the polyol component is 0.8 to 5 equivalents, and more preferably mixed so that a proportion thereof is 1.5 to 3 equivalents. When they are used in a suitable ratio, the crosslinking density is improved, and adhesion is further improved.

The epoxy adhesive includes an epoxy resin and a curing agent component. Examples of epoxy resins include a bisphenol type epoxy resin, a multifunctional polyphenol type epoxy resin, an alicyclic epoxy resin, and a multi-functional epoxy resin in which an epoxy group is bonded to a multi-functional compound (for example, a multi-functional compound or oligomer having a plurality of hydroxyl groups or amino groups).

In the curing agent component, for example, examples of one-component epoxy adhesives include amines other than aliphatic amines such as dicyandiamide and aromatic diamines, amine compounds in a broad sense, acid anhydrides, and phenolic resins. In addition, examples of two-component epoxy adhesives include chain aliphatic polyamines such as diethylenetriamine, triethylenetetramine, and diethylaminopropylamine, cycloaliphatic polyamines such as isophoronediamine, aromatic polyamines such as m-xylylenediamine, and aliphatic polyamine compounds such as modified aliphatic polyamines.

Epoxy resins and curing agent components can be used alone or two or more thereof can be used in combination.

The adhesive may contain additives, for example, a curing aid, a filling agent, an antioxidant, a UV absorber, a hydrolysis preventing agent, a tackifier, a fungicide, a thickener, a plasticizer, a pigment, an anti-foaming agent, a silane coupling agent, and an adhesion aid such as phosphoric acid depending on the purpose.

(When Used for Masterbatch)

In an application in which the near-infrared absorbing composition of the present specification is used as a masterbatch, the resin [B] is preferably a thermoplastic resin. Examples of thermoplastic resins include polyethylene, polypropylene, polyvinyl chloride, polystyrene, polyvinyl acetate, polyurethane, Teflon (registered trademark), an ABS resin, an AS resin, an acrylic resin, polyamide, polyacetal, polycarbonate, modified polyphenylene ether, polyester, polyethylene terephthalate, polybutylene terephthalate, cyclic polyolefins, polyphenylene sulfide, polytetrafluoroethylene, polysulfone, polyethersulfone, polyetheretherketone, thermoplastic polyimides, and polyamideimide.

(Thermosetting Resin)

A thermosetting resin may be used as the resin [B] of the present specification. Examples of thermosetting resins include a phenolic resin, an epoxy resin, a melamine resin, a urea resin, an unsaturated polyester resin, an alkyd resin, polyurethane, thermosetting polyimides, a benzoguanamine resin, a rosin-modified maleic resin, a rosin-modified fumaric acid resin, and a cardo resin.

Examples of epoxy resins that can be used as the resin [B] include a bisphenol A type epoxy compound/or resin, a hydrogenated bisphenol A type epoxy compound/or resin, a bisphenol F type epoxy compound/or resin, a hydrogenated bisphenol F type epoxy compound/or resin, a novolak epoxy compound/or resin, a cycloaliphatic epoxy compound/or resin, a heterocyclic epoxy compound/or resin, a glycidyl ether compound/or resin, a glycidyl ester compound/or resin, a glycidylamine compound/or resin, an epoxy compound/or resin such as epoxidized oil; brominated derivatives of an epoxy compound/or resin, tris(glycidylphenyl) methane, and triglycidyl isocyanurate. Epoxy compounds and resins can be used alone or two or more thereof can be used in combination.

Examples of commercial epoxy resin products include Epikote 807, Epikote 815, Epikote 825, Epikote 827, Epikote 828, Epikote 190P, and Epikote 191P (these are product names; commercially available from Yuka Shell Epoxy Co., Ltd.), Epikote 1004 and Epikote 1256 (these are product names; commercially available from Japan Epoxy Resin Co., Ltd.), TECHMORE VG3101L (product name; commercially available from Mitsui Chemicals Inc), EPPN-501H, 502H (product name; commercially available from Nippon Kayaku Co., Ltd.), JER1032H60 (product name; commercially available from Japan Epoxy Resin Co., Ltd.), JER157S65, 157S70 (product name; commercially available from Japan Epoxy Resin Co., Ltd.), EPPN-201 (product name; commercially available from Nippon Kayaku Co., Ltd.), JER152 and JER154 (these are product names; commercially available from Japan Epoxy Resin Co., Ltd.), Ethyleneoxy CN-102S, Ethyleneoxy CN-103S, Ethyleneoxy CN-104S, and Ethyleneoxy CN-1020 (these are product names; commercially available from Nippon Kayaku Co., Ltd.), Celloxide 2021P, and EHPE-3150 (these are product names; commercially available from Daicel Corporation), and Danocol EX-810, EX-830, EX-851, EX-611, EX-512, EX-421, EX-411, EX-321, EX-313, EX-201, and EX-111

(these are product names; commercially available from Nagase ChemteX Corporation).

<Dispersant [C]>

The dispersant [C] that can be used for the near-infrared absorbing composition of the present specification is not limited as long as it can disperse the squarylium dye [A] of the present specification. Regarding the dispersant [C], a low-molecular-weight dispersant and a high-molecular-weight dispersant such as a resin dispersant can be used. Examples of functional groups in the dispersant include acidic groups such as a carboxylic acid group, a sulfonic acid group, and a phosphate group, basic groups such as a primary amino group, a secondary amino group, a tertiary amino group, and a quaternary ammonium base, and neutral groups such as a hydroxyl group. Dispersants can be used alone or two or more thereof can be used in combination.

(Dispersant Containing Tertiary Amino Group and/or Quaternary Ammonium Base)

The dispersant [C] is preferably a dispersant containing a tertiary amino group and/or a quaternary ammonium base in consideration of viscosity and storage stability. In particular, the form of a resin dispersant is more preferable, and also, a resin dispersant containing a tertiary amino group and a quaternary ammonium base is preferable. In addition, the dispersant [C] preferably has a block structure.

A resin dispersant containing the tertiary amino group and quaternary ammonium base and having an amine value of 10 to 250 mg KOH/g and a quaternary ammonium salt value of 10 to 90 mg KOH/g is preferable, and a resin dispersant containing a tertiary amino group and quaternary ammonium base having an amine value of 50 to 200 mg KOH/g and a quaternary ammonium salt value of 10 to 50 mg KOH/g is more preferable. In addition, the weight average molecular weight (Mw) of the dispersant [C] is preferably 3,000 to 300,000 and more preferably 5,000 to 30,000.

The dispersant [C] containing a tertiary amino group and a quaternary ammonium base is preferably a copolymer obtained by copolymerizing monomers containing a tertiary amino group, monomers containing a quaternary ammonium base, and as necessary, other monomers. In the copolymerization, change to a monomer containing a quaternary ammonium salt occurs, and a copolymer including monomers containing a tertiary amine is synthesized and then the copolymer is reacted with a halogenated hydrocarbon compound such as benzyl chloride, and the tertiary amino group can be partially modified to a quaternary ammonium base.

The monomer containing a tertiary amino group preferably has a structure represented by the following General Formula (5).

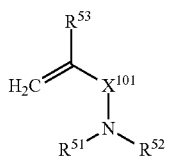

General Formula (5)

[In General Formula (5), $R^{51}$ and $R^{52}$ each independently represent a hydrogen atom or a chain or cyclic hydrocarbon group which may have a substituent, and $R^{51}$ and $R^{52}$ may be bonded to each other to form a cyclic structure. $R^{53}$ represents a hydrogen atom or a methyl group, and $X^{101}$ represents a divalent linking group.]

Among substituents on the hydrocarbon group represented by $R^{51}$ and $R^{52}$ in General Formula (5), examples of substituents on the chain hydrocarbon group include a halogen atom, an alkoxy group, a benzoyl group, and a hydroxyl group. In addition, examples of substituents on the cyclic hydrocarbon group include a chain alkyl group, a halogen atom, an alkoxy group, and a hydroxyl group. In addition, the chain hydrocarbon group represented by $R^{51}$ and $R^{52}$ includes both linear and branched chain groups.

$R^{51}$ and $R^{52}$ in General Formula (5) are more preferably an alkyl group having 1 to 4 carbon atoms which may have a substituent, and particularly preferably a methyl group, an ethyl group, a propyl group or a butyl group.

In General Formula (5), examples of a cyclic structure in which $R^{51}$ and $R^{52}$ are bonded to each other include a nitrogen-containing heterocyclic monocycle with a 5- to 7-membered ring and a condensed ring formed by condensing two or more thereof. The nitrogen-containing heterocycle preferably has no aromaticity and is more preferably a saturated ring. Specifically, for example, the following structures may be exemplified. Such cyclic structures may further contain a substituent.

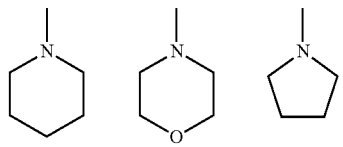

In General Formula (5), examples of divalent linking groups $X^{101}$ include a methylene group, an alkylene group having 2 to 10 carbon atoms, an arylene group, a —CONH—$R^{58}$— group, and a —COO—$R^{59}$— group [provided that, $R^{58}$ and $R^{59}$ represent a single bond, a methylene group, an alkylene group having 2 to 10 carbon atoms, or an ether group having 2 to 10 carbon atoms (including an alkyloxyalkyl group and the like)], and a —COO—$R^{59}$— group is preferable.

Examples of monomers containing a tertiary amino group represented by General Formula (5) include dimethylaminoethyl (meth)acrylate, diethylaminoethyl (meth)acrylate, dimethylaminopropyl (meth)acrylate, diethylaminopropyl (meth)acrylate, and dimethylaminopropyl (meth)acrylamide.

The monomer containing a quaternary ammonium base preferably has a structure represented by the following General Formula (7).

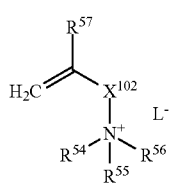

General Formula (7)

[In General Formula (7), $R^{54}$ to $R^{56}$ each independently represent a hydrogen atom or a chain or cyclic hydrocarbon group which may have a substituent, and two or more of $R^{54}$ to $R^{56}$ may be bonded to each other to form a cyclic structure. $R^{57}$ represents a hydrogen atom or a methyl group, $X^{102}$ represents a divalent linking group, and L represents a counter anion.]

Among substituents on the hydrocarbon group represented by $R^{54}$ to $R^{56}$ in General Formula (7), examples of substituents on the chain hydrocarbon group include a halogen atom, an alkoxy group, a benzoyl group, and a hydroxyl group. In addition, examples of substituents on the cyclic hydrocarbon group include a chain alkyl group, a halogen atom, an alkoxy group, and a hydroxyl group. In addition, the chain hydrocarbon group represented by $R^{54}$ to $R^{56}$ includes both linear and branched chain groups.

$R^{54}$ to $R^{56}$ in General Formula (7) are more preferably an alkyl group having 1 to 4 carbon atoms which may have a substituent, and particularly preferably a methyl group, an ethyl group, a propyl group or a butyl group.

In General Formula (7), examples of a cyclic structure formed by bonding two or more of $R^{54}$ to $R^{56}$ include a nitrogen-containing heterocyclic monocycle with a 5- to 7-membered ring and a condensed ring formed by condensing two or more thereof. The nitrogen-containing heterocycle preferably has no aromaticity and is more preferably a saturated ring. Specifically, for example, the following structures may be exemplified.

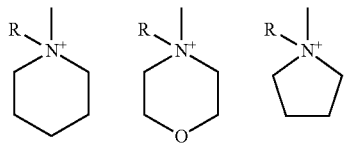

In General Formula (7), R is any one of $R^{54}$ to $R^{56}$. Such cyclic structures may further contain a substituent.

In General Formula (7), the divalent linking group $X^{102}$ is the same as $X^{101}$ in General Formula (5). In addition, examples of counter anions L in General Formula (7) include $Cl^-$, $Br^-$, $I^-$, $ClO_4^-$, $BF_4^-$, $CH_3COO^-$, and $PF_6^-$.

Examples of monomers containing a quaternary ammonium base represented by General Formula (7) include (meth)acryloylaminopropyltrimethylammonium chloride, (meth)acryloyloxyethyltrimethylammonium chloride, (meth)acryloyloxyethyltriethylammonium chloride, (meth)acryloyloxyethyl(4-benzoylbenzyl)dimethylammonium bromide, (meth)acryloyloxyethylbenzyldimethylammonium chloride, and (meth)acryloyloxyethylbenzyldiethylammonium chloride. Among these, (meth)acryloyloxyethyltrimethylammonium chloride is preferable.

<Photopolymerizable Monomer>

Compositions such as the near-infrared absorbing composition of the present specification can contain photopolymerizable monomers. Photopolymerizable monomers include monomers or oligomers that are cured due to ultraviolet rays or heat to generate a transparent resin.

Examples of photopolymerizable monomers include phenoxytetraethylene glycol (meth)acrylate, phenoxyhexaethylene glycol (meth)acrylate, ethyleneoxy-modified phthalic acid (meth)acrylate, propyleneoxy-modified phthalic acid (meth)acrylate, acrylicized isocyanurate, bis(acryloxyneopentyl glycol)adipate, polyethylene glycol 200 di(meth)acrylate, polyethylene glycol 400 di(meth)acrylate, tetraethylene glycol di(meth)acrylate, ethyleneoxy-modified trimethylolpropane triacrylate, propyleneoxy-modified trimethylolpropane tri(meth)acrylate, tripropylene glycol di(meth)acrylate, tris(acryloxyethyl)isocyanurate, caprolactone-modified tris(acryloxyethyl)isocyanurate, hydroxypivalic acid neopentyl glycol di(meth)acrylate, pentaerythritol tri(meth)acrylate, dicyclopentanyl di(meth)acrylate, ethyleneoxy-modified bisphenol A di(meth)acrylate, dipentaerythritol hexa(meth)acrylate, dipentaerythritol monohydroxypenta(meth)acrylate, alkyl-modified dipentaerythritol penta(meth)acrylate, and caprolactone-modified dipentaerythritol hexa(meth)acrylate.

Examples of commercial products thereof include KAYARAD DPHA, KAYARAD DPEA-12, KAYARAD DPHA-2C, KAYARAD D-310, KAYARAD D-330, KAYARAD DPCA-20, KAYARAD DPCA-30, KAYARAD DPCA-60, KAYARAD DPCA-120, KAYARAD R526, KAYARAD PEG400DA, KAYARAD R-167, KAYARAD HX-220, KAYARAD R-551, KAYARAD R712, KAYARAD R-604, KAYARAD R-684, KAYARAD G Propyleneoxy-303, and KAYARAD TMPTA (commercially available from Nippon Kayaku Co., Ltd.); M210, M220, M225, M305, M309, M325, M350, and M-402 (commercially available from Toagosei Co., Ltd.); and Viscoat 195, Viscoat 230, Viscoat 260, Viscoat 215, Viscoat 310, Viscoat 214HP, Viscoat 295, Viscoat 300, Viscoat 360, Viscoat GPT, Viscoat 400, Viscoat 700, Viscoat 540, Viscoat 3000, and Viscoat 3700 (commercially available from Osaka Organic Chemical Industry Ltd.).

In consideration of photocurability and developability, the amount of photopolymerizable monomers added is preferably 5 to 400 parts by mass and more preferably 10 to 300 parts by mass with respect to 100 parts by mass of the squarylium dye [A].

In addition, examples of photopolymerizable monomers other than the above examples include various acrylic esters and methacrylic esters such as methyl (meth)acrylate, ethyl (meth)acrylate, 2-hydroxyethyl (meth)acrylate, 2-hydroxypropyl (meth)acrylate, cyclohexyl (meth)acrylate, β-carboxyethyl (meth)acrylate, polyethylene glycol di(meth)acrylate, 1,6-hexanediol di(meth)acrylate, triethylene glycol di(meth)acrylate, tripropylene glycol di(meth)acrylate, trimethylolpropane tri(meth)acrylate, pentaerythritol tri(meth)acrylate, pentaerythritol tetra(meth)acrylate, 1,6-hexanediol diglycidyl ether di(meth)acrylate, bisphenol A diglycidyl ether di(meth)acrylate, neopentyl glycol diglycidyl ether di(meth)acrylate, dipentaerythritol hexa(meth)acrylate, dipentaerythritol penta(meth)acrylate, tricyclodecanyl (meth)acrylate, ester acrylate, (meth)acrylic acid ester of methylolated melamine, epoxy (meth)acrylate, and urethane acrylate and (meth)acrylic acid, styrene, vinyl acetate, hydroxyethyl vinyl ether, ethylene glycol divinyl ether, pentaerythritol trivinyl ether, (meth)acrylamide, N-hydroxymethyl (meth)acrylamide, N-vinylformamide, and acrylonitrile.

The photopolymerizable monomers preferably include a photopolymerizable monomer having 3 to 12 ethylenically unsaturated groups in one molecule.

The photopolymerizable monomer may be used alone or two or more thereof may be used in combination.

<Photopolymerization Initiator>

The near-infrared absorbing composition of the present specification can contain a photopolymerization initiator. Examples of photopolymerization initiators include an oxime ester initiator and an aminoketone photopolymerization initiator.

(Oxime Ester Photopolymerization Initiator)

Examples of oxime ester photopolymerization initiators include acetophenone, benzophenone, 4,4'-bis(diethylamino)-benzophenone, 4-(methylphenylthio)-phenylphenyl ketone, benzyldimethyl ketal, 2-methyl-1-methylthiophenyl-2-morpholinopropan-1-one, 2-benzyl-2-dimethylamino-1-(4-morpholinophenyl)butan-1-one, ethyl p-diethylaminobenzoate, thioxanthone, 2,5-diethylthioxanthone, 2-chloroxanthone, isopropylthioxanthone, 1-chloro-4-propoxy-thioxanthone, 2-(o-chlorophenyl)-4,5-diphenylimidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2-(o-chlorophenyl)-4,5-di(o-methoxyphenyl)imidazole dimer, 9-phenylacridine, 9-(p-toluyl)acridine, 1,7-bis(9,9'-acridinyl)heptane, N-phenylglycine, bis(η5-cyclopentadienyl)bis[2,6-difluoro-3-(1H-pyrrol-1-yl)phenyl]titanium, 2-ethylanthraquinone, 1-chloroanthraquinone, 2-phenyl-4,6-bis(trichloromethyl)-s-triazine, 2-(4-methoxyphenyl)-4,6-bis(trichloromethyl)-s-triazine, 2-naphthyl-4,6-bis(trichloromethyl)-s-triazine, 2-(4-methoxynaphthyl)-4,6-bis(trichloromethyl)-s-triazine, and 2-methyl-4,6-bis(trichloromethyl)-s-triazine.

(Aminoketone Photopolymerization Initiator)

Examples of aminoketone photopolymerization initiators include 2-dimethylamino-2-methyl-1-phenylpropan-1-one, 2-diethylamino-2-methyl-1-phenylpropan-1-one, 2-methyl-2-morpholino-1-phenylpropan-1-one, 2-dimethylamino-2-methyl-1-(4-methylphenyl) propan-1-one, 2-dimethylamino-1-(4-ethylphenyl)-2-methylpropan-1-one, 2-dimethylamino-1-(4-isopropylphenyl)-2-methylpropan-1-one, 1-(4-butylphenyl)-2-dimethylamino-2-methylpropan-1-one, 2-dimethylamino-1-(4-methoxyphenyl)-2-methylpropan-1-one, 2-dimethylamino-2-methyl-1-(4-methylthiophenyl)propan-1-one, 2-methyl-1-(4-methylthiophenyl)-2-morpholinopropan-1-one/IRGACURE907, 2-benzyl-2-dimethylamino-1-(4-morpholinophenyl)-butan-1-one/IRGACURE369, 2-benzyl-2-dimethylamino-1-(4-dimethylaminophenyl)-butan-1-one, and 2-dimethylamino-2-[(4-methylphenyl)methyl]-1-[4-(4-morpholinyl)phenyl]-1-butanone/IRGAC URE379.

In the near-infrared absorbing composition of the present specification, other photopolymerization initiators can also be used. Examples of other photopolymerization initiators include triazine compounds such as 2,4,6-trichloro-s-triazine, 2-phenyl-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-piperonyl-4,6-bis(trichloromethyl)-s-triazine, 2,4-bis(trichloromethyl)-6-styryl-s-triazine, 2-(naphth-1-yl)-4,6-bis(trichloromethyl)-s-triazine, 2-(4-methoxy-naphth-1-yl)-4,6-bis(trichloromethyl)-s-triazine, 2,4-trichloromethyl-(piperonyl)-6-triazine, and 2,4-trichloromethyl-(4'-methoxystyryl)-6-triazine; phosphine compounds such as bis(2,4,6-trimethylbenzoyl) phenylphosphine oxide, and 2,4,6-trimethylbenzoyldiphenylphosphine oxide; quinone compounds such as 9,10-phenanthrenequinone, camphorquinone, and ethyl anthraquinone; borate compounds; carbazole compounds; imidazole compounds; and titanocene compounds.

In consideration of photocurability and developability, the amount of the photopolymerization initiator added is preferably 5 to 200 parts by mass and more preferably 10 to 150 parts by mass with respect to a total amount of 100 parts by mass of the squarylium dye [A].

The photopolymerization initiators can be used alone or two or more thereof can be used in combination. In consideration of photocurability and developability, the amount of the photopolymerization initiator added is preferably 5 to 200 mass % and more preferably 10 to 150 mass % based on (100 mass %) the squarylium dye [A].

<Organic Solvent>

The near-infrared absorbing composition of the present specification can contain an organic solvent. Examples of organic solvents include hydrocarbon solvents, alcohol solvents, ketone solvents, ester solvents, ether solvents, amide solvents, and halogen solvents.

<Other Components>

(Curing Agent, Curing Accelerator)

When a thermosetting resin is used, the near-infrared absorbing composition of the present specification can contain a curing agent, a curing accelerator, and the like. Examples of curing agents include a phenolic resin, an amine compound, acid anhydrides, active esters, a carboxylic acid compound, and a sulfonic acid compound. Among these, a compound containing a phenolic hydroxyl group or an amine curing agent is preferable. Examples of curing accelerators include an amine compound (for example, dicyandiamide, benzyldimethylamine, 4-(dimethylamino)-N,N-dimethylbenzylamine, 4-methoxy-N,N-dimethylbenzylamine, 4-methyl-N,N-dimethylbenzylamine, etc.), a quaternary ammonium salt compound (for example, triethylbenzylammonium chloride, etc.), a block isocyanate compound (for example, dimethylamine, etc.), an imidazole derivative bicyclic amidine compound and salts thereof (for example, imidazole, 2-methylimidazole, 2-ethylimidazole, 2-ethyl-4-methylimidazole, 2-phenylimidazole, 4-phenylimidazole, 1-cyanoethyl-2-phenylimidazole, 1-(2-cyanoethyl)-2-ethyl-4-methylimidazole, etc.), a phosphorus compound (for example, triphenylphosphine, etc.), a guanamine compound (for example, melamine, guanamine, acetoguanamine, benzoguanamine, etc.), and S-triazine derivatives (for example, 2,4-diamino-6-methacryloyloxyethyl-S-triazine, 2-vinyl-2,4-diamino-S-triazine, 2-vinyl-4,6-diamino-S-triazine/isocyanuric acid adduct, and 2,4-diamino-6-methacryloyloxyethyl-S-triazine·isocyanuric acid adduct, etc.). The content of the curing accelerator is preferably 0.01 to 15 parts by mass with respect to 100 parts by mass of the thermosetting resin.

<Other Components>

(Colorant)

In the near-infrared absorbing composition of the present specification, other colorants may be included in order to make its color tone difficult to recognize with the naked eye. The colorant may be any conventionally known pigment or dye. When another colorant is used in order to adjust the color tone of the composition of the present specification, the content of the colorant is preferably 1 to 10 parts by mass with respect to 100 parts by mass of the squarylium dye [A].

Since the squarylium dye [A] of the present specification has very high invisibility, it can be appropriately used to impart a near-infrared absorption capability without impairing the color tone of the original colorant. When a near-infrared absorption capability is imparted to a conventional colorant, the content of the colorant is preferably 20 to 1,000 parts by mass with respect to 1 part by mass of the squarylium dye [A].

(Other components)

Examples of other components that can be used in the near-infrared absorbing composition of the present specification include the same chain transfer agents, antioxidants, leveling agents, light absorbing dyes, light stabilizers, UV absorbers, inorganic fine particles, active agents, and antifoaming agents as above.

<Near-Infrared Cut Filter Application>

The composition containing the squarylium dye [A] has high invisibility and near-infrared absorption capability and is preferable as a material constituting a near-infrared cut filter. Examples of a method of forming a near-infrared cut filter include a method of incorporating the composition containing the squarylium dye [A] into, for example, a substrate or an arbitrary layer constituting a near-infrared cut filter, a method of applying the composition to a substrate or an arbitrary layer, a method of incorporating the composition into a polymer binder between layers, an adhesive, or a pressure-sensitive adhesive, and a method of providing a resin layer containing the squarylium dye [A] of the present specification separately from the above respective layers. Examples of specific near-infrared cut filter applications include a semiconductor application, an electronic device application, various sensor applications, and solid-state image sensing device applications such as a contact type image sensor/CCD image sensor/CMOS image sensor. In addition, depending on other materials and filters to be combined therewith, not only a near-infrared cut filter but also an IR pass filter, a band pass filter, and the like can be used.

<Heat Radiation Cutting Material Application>

Since the composition containing the squarylium dye [A] of the present specification has high invisibility and near-infrared absorption capability, it is preferable as a heat radiation cutting material. When a heat radiation cutting material of the present specification is used, visible rays of sunlight can be effectively transmitted and heat radiation can be cut out reliably. In addition, since it has excellent weather resistance, even if it is exposed to sunlight for a long time, a heat radiation blocking ability is not easily impaired.

<Photothermal Conversion Material Application>

Since the composition containing the squarylium dye [A] of the present specification has very high near-infrared absorption capability, it is preferable as a photothermal conversion material. As an example, a laser welding material may be exemplified, and when a laser beam is selectively absorbed and heat is locally generated, a thermoplastic resin as a substrate can be melted and bonded. In addition, it can be used as a laser marking material, a temperature increase promotion material, an ink drying aid, or the like.

<Laser Welding Material Application>

When the composition containing the squarylium dye [A] of the present specification is used for welding resin materials, a color tone difference between resin materials can be reduced for bonding by irradiating with a laser. In addition, sufficient bond strength can be obtained by reliably welding the contact surfaces.

In recent years, in order to reduce the weight and reduce costs, resin molded products have been frequently used as parts in various fields such as automobile parts. In addition, in order to increase the productivity of resin molded products, a method in which a resin molded product is divided into a plurality of parts in advance and these are molded, and these separate molded products are bonded to each other may be used in many cases. Conventionally, resin materials are bonded to each other according to a laser welding method in which a transparent resin material which has transparency with respect to a laser and an absorptive resin material which has absorbency with respect to a laser are superimposed and a laser is then emitted from the side of the transparent resin material, and thus contact surfaces between the transparent resin material and the absorptive resin material are heated and melted and both are integrally bonded. In addition, in the conventional laser welding method, in bonding of resin members of the same or different types, since there are two types of resin member bonded which are a resin member having absorptivity with respect to a laser and a resin member having no absorptivity, there is a difference between color tones and there is a limit in applications of the bonded resin members. Specifically, since a resin material having no absorptivity with respect to a laser has a white or transparent laser transmission color and the absorbent material has a black laser absorption color such as carbon black, an apparent feeling of discomfort is caused. That is, when such resin materials with different colors are bonded, there are problems of an apparent bonding force feeling weak, and bond parts being noticeable.

When the composition containing the squarylium dye [A] of the present specification is used, since it has very high invisibility and near-infrared absorption capability, such problems can be addressed. In particular, transparent resin materials, that is, transparent resin materials, can be bonded to each other. For example, when the resin composition of the present specification is applied to parts to which a transparent resin material is desired to be bonded, and a resin layer coated with another transparent resin material as described above is interposed therebetween, and a laser is emitted from one side, only the coated part absorbs a laser beam, heat is generated locally and instantaneously, and the resin materials can be melted and bonded to each other. In this case, since the composition containing the squarylium dye [A] of the present specification has very high invisibility, the difference between color tones of the coated parts is not noticeable at all. In addition, since the near-infrared absorption capability is high, strong bonding can be performed by adding a small amount of the composition. Regarding another method, a method of kneading the squarylium dye [A] of the present specification into a transparent resin material itself is conceivable, but this method is thought to exhibit the same effects as those during coating. That is, when the composition containing the squarylium dye [A] of the present specification is used for a laser welding application, strong bonding can be realized while maintaining excellent design properties.

Figure 5:
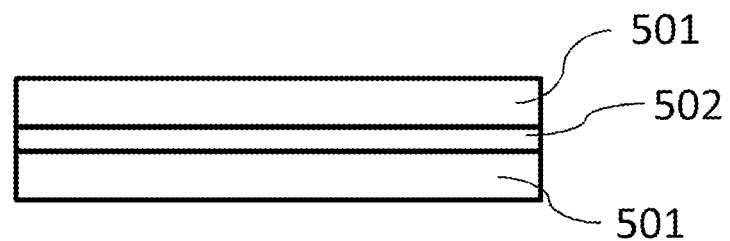
FIG. 5 is a cross-sectional view schematically showing a laser welded assembly.

An example of the laser welded assembly will be described with reference to FIG. 5. The laser welded assembly is a laminate in which a substrate 501, a near-infrared absorption layer 502, and a substrate 501 are sequentially laminated. The substrate 501 is a sheet formed of a thermoplastic resin or a thermosetting resin. The thickness of a substrate 201 is generally about 1 to 500 μm. The near-infrared absorption layer 502 absorbs near-infrared light, and converts a laser beam into heat to bond the substrates 501. The thickness of the near-infrared absorption layer 502 is generally about 0.1 to 100 μm.

<Solid-State Image Sensing Device Application>

The composition containing the squarylium dye [A] of the present specification can be used for a solid-state image sensing device application. The solid-state image sensing device composition of the present specification contains a squarylium dye [A], a resin [B], a dispersant [C], a photopolymerizable monomer, a photopolymerization initiator, and an organic solvent.

As described above, the solid-state image sensing device composition can be dispersed using the dispersant [C] that can disperse the squarylium dye [A] in addition to the squarylium dye [A] and the resin [B]. Examples of a dispersion device include a kneader, a 2-roll mill, a 3-roll mill, a ball mill, a horizontal sand mill, a vertical sand mill, annular type bead mill and an attritor.

(Removal of Coarse Particles)

In the solid-state image sensing device composition, according to a method using centrifugation, a sintered filter, a membrane filter, or the like, coarse particles with a size of 5 μm or more, preferably coarse particles with a size of 1 μm or more, more preferably coarse particles with a size of 0.5 μm or more, and mixed contaminants are preferably removed. In this manner, the near-infrared absorbing composition for a solid-state image sensing device of the present specification preferably does not substantially contain particles with a size of 0.5 μm or more. More preferably, the particle size is 0.3 μm or less.

(Near-Infrared Cut Filter)

An infrared cut filter can be produced according to a printing method, a photolithographic method, or an etching method using a solid-state image sensing device composition on the substrate.

A near-infrared cut filter has a wide viewing angle and has an excellent near-infrared cut ability, and the like. In addition, it has low absorption in a visible range (400 nm to 750 nm), has an excellent near-infrared absorption capability, and additionally has excellent durability such as heat resistance and light resistance. Therefore, it is beneficial for correcting visibility of solid-state image sensing devices such as CCD or CMOS image sensors in camera modules. In particular, it is beneficial for a digital still camera, a mobile phone camera, a digital video camera, a PC camera, a surveillance camera, an infrared camera, an automotive camera, a television, a car navigation system, a mobile information terminal, a computer, a video game, a portable game machine, a fingerprint authentication system, a digital music player, and the like.

In formation of a filter segment according to a printing method, printing and drying of a near-infrared absorbing composition prepared as a printing ink are simply repeated so that a pattern can be formed. Therefore, a filter production method is cheap and has excellent mass productivity. In addition, it is possible to print a fine pattern having high dimensional accuracy and smoothness with the development of printing technology. In order to perform printing, it is preferable that an ink does not dry nor solidify on a printing plate or a blanket in the composition. In addition, control of fluidity of an ink on the printer is also important, and the viscosity of the ink can also be adjusted using a dispersant or an extender pigment.

When a filter segment is formed according to a photolithographic method, a near-infrared absorbing composition prepared as the solvent developing type or alkali developable resist material is applied to a transparent substrate according to a coating method such as spray coating, spin coating, slit coating, or roll coating so that the dry film thickness is 0.2 to 5 μm. As necessary, the dried film is exposed with ultraviolet rays through a mask having a predetermined pattern provided in a contact or non-contact state with the film. Then, according to immersion in a solvent or an alkaline developing solution or spraying a developing solution according to spraying or the like, uncured parts are removed, a desired pattern is formed, and then the same procedure can be repeated for other colors to produce a filter. In addition, in order to promote polymerization of the resist material, heating can be performed as necessary. According to the photolithographic method, it is possible to produce a filter with higher accuracy according to the printing method.

When a filter segment is formed according to an etching method, any of dry etching and wet etching methods can be applied. Dry etching is a method of etching a material with a reactive gas (etching gas), ions, and radicals. On the other hand, wet etching is a method of etching a material with a liquid. In consideration of production costs, wet etching with an acid or alkali is preferable. On the other hand, in consideration of reproducibility of irregularity formation, dry etching suitable for microfabrication is preferable.

Examples of dry etching include a method in which a material is exposed to a reactive gas (reactive gas etching) and reactive ion etching in which a gas is ionized and radicalized due to a plasma for etching.

Examples of a dry etching device according to reactive ion etching include various types. In all types, device configurations are almost the same. That is, in a chamber maintained at a required vacuum pressure, electromagnetic waves or the like are applied to an etching gas, and thus the gas is converted into a plasma. In addition, at the same time, a high frequency voltage is applied to a cathode on which a sample substrate is placed in the chamber. Thereby, ion species and radical species in the plasma are accelerated in the sample direction and collide, sputtering by ions and a chemical reaction of an etching gas occur at the same time, and the sample is microfabricated.

In the present embodiment, a pattern is formed according to the above process, and an etching treatment can be then directly performed on the pattern. In addition, using photolithography technology, a resist pattern as a mask is formed on the colored pattern, and an etching treatment may be then performed on the colored pattern part exposed therefrom. According to this method, a colored pattern with a desired color can be selected from among a plurality of colored patterns, and irregularities can be provided, and additionally, it is possible to provide a desired degree of irregularities at desired locations.

During development, an aqueous solution such as sodium carbonate and sodium hydroxide is used as an alkaline developing solution, and an organic alkali such as dimethylbenzylamine and triethanolamine can also be used. In addition, an anti-foaming agent or a surfactant can be added to the developing solution. Here, in order to increase ultraviolet exposure sensitivity, the resist material is applied and dried, and a water-soluble or alkaline water-soluble resin, for example, a polyvinyl alcohol, a water-soluble acrylic resin, or the like, is then applied and dried to form a film that prevents polymerization inhibition due to oxygen, and ultraviolet exposure can be then performed.

The near-infrared cut filter of the present specification can be produced according to an electrodeposition method, a transfer method, an inkjet method, or the like in addition to the above method, but the near-infrared absorbing composition of the present specification can be used for any method. Here, the electrodeposition method is a method in which, using a transparent conductive film formed on a substrate, each color filter segment is electrodeposited on a transparent conductive film according to electrophoresis of colloidal particles, and thus a color filter is produced. In addition, the transfer method is a method in which a filter segment is formed in advance on the surface of a releasable transfer base sheet, and the filter segment is transferred to a desired substrate.

Figure 2:
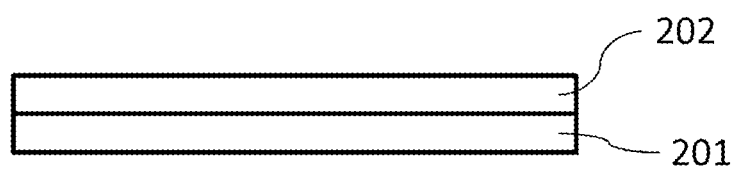
FIG. 2 is a cross-sectional view schematically showing a near-infrared cut filter.

An example of the near-infrared cut filter will be described with reference to FIG. 2. In FIG. 2, the near-infrared cut filter includes the substrate 201 and a near-infrared absorption layer 202. The substrate 201 is a sheet formed of a thermoplastic resin or a thermosetting resin. The thickness of the substrate 201 is about 1 to 500 μm. The near-infrared absorption layer 202 can be formed on the substrate 201 according to the method described above. The thickness of the near-infrared absorption layer 202 is generally about 0.1 to 100 μm.

<Solid-State Image Sensing Device>

A solid-state image sensing device of the present specification includes a near-infrared cut filter.

In recent years, imaging devices have been widely used according to the increase in image recording, communication, and broadcast content. Although various types of imaging device have been proposed, imaging devices using solid-state image sensing devices that are small, lightweight, and have multi-color high performance and are stably produced have become popular. A solid-state image sensing device includes a plurality of photoelectric conversion elements that receive an optical image from an object to be imaged and convert incident light into an electronic signal. The types of photoelectric conversion elements are roughly classified into a charge coupled device (CCD) type and a complementary metal oxide semiconductor (CMOS) type. In addition, arrangement forms of photoelectric conversion elements are roughly classified into two types: a linear sensor (line sensor) in which photoelectric conversion elements are arranged in a row and an area sensor (surface sensor) in which photoelectric conversion elements are arranged two-dimensionally vertically and horizontally. In any sensor, as the number of photoelectric conversion elements (the number of pixels) increases, the captured image becomes more precise.

In addition, various color filters that transmit light with a specific wavelength are provided along a path of light that enters photoelectric conversion elements, and thus color sensors that make it possible to obtain color information of an object are becoming popular. Regarding the color of the color filters, a three primary color system composed of three hues of red (R), blue (B), and green (G), or a complementary color system composed of three hues of colors of cyan (C), magenta (M), and yellow (Y) is general.

Figure 3:
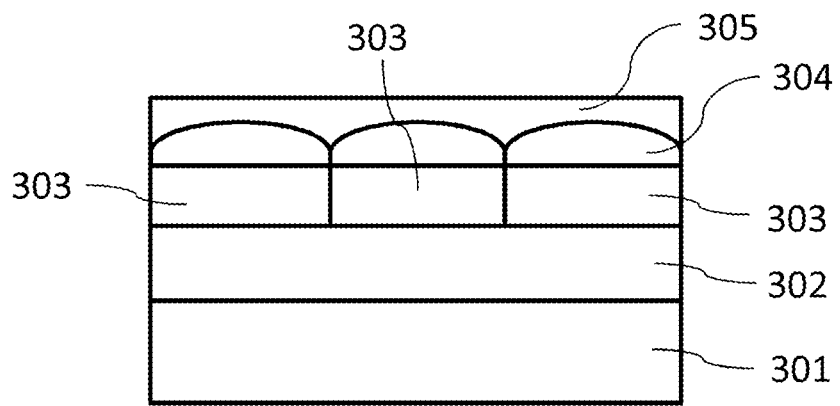
FIG. 3 is a cross-sectional view schematically showing a solid-state image sensing device.

An example of the solid-state image sensing device will be described with reference to FIG. 3. The solid-state image sensing device includes a sensor layer 301, a near-infrared cut filter 302, a color filter 303, a microlens 304, and a flattening layer 305. Examples of the sensor layer 301 include a CCD and a CMOS. Regarding the near-infrared cut filter 302, for example, a near-infrared cut filter shown in FIG. 2 can be used. The color filter 303 preferably includes a green filter segment, a blue filter segment, and a red filter segment, or includes a cyan filter segment, a magenta filter segment, and a yellow filter segment. The microlens 304 is installed to increase the apparent aperture ratio. The flattening layer 305 is formed on the microlens 304 to flatten irregularities. Here, the solid-state image sensing device may not include the flattening layer 305.

EXAMPLES

The present specification will be described below in more detail with reference to examples, but the present specification is not limited to the following examples and only by the scope of the present specification. Here, in examples and comparative examples, "parts" indicates "parts by mass" and "%" indicates "mass %." In addition, "PGMAc" refers to propylene glycol monomethyl ether acetate. Unless otherwise noted, in the evaluation results in the tables, ⊚: excellent, O: good, Δ: not practical, and x: poor.
(Method of Identifying Squarylium Dye [A])
In order to identify the squarylium dye [A] used in the present specification, elemental analysis and MALDI TOF-MS spectrums were used. 2400 CHNElemant Analyzer (commercially available from PerkinElmer Co., Ltd.) was used for elemental analysis. Regarding the MALDI TOF-MS spectrum, using MALDI mass spectrometer autoflex III (commercially available from Bruker Daltonics), the obtained dye was identified using the coincidence between the molecular ion peak of the obtained mass spectrum and the number of parts by mass obtained by calculation.

(Powder X-Ray Diffraction Measurement Method of Squarylium Dye [A])
In the powder X-ray diffraction measurement, the diffraction angle (2θ) in a range of 3° to 35° was measured according to Japanese Industrial Standards JIS K0131 (general rules for X-ray diffraction analysis).
The measurement conditions were as follows.
X-ray diffractometer: RINT2100 commercially available from Rigaku Corporation
Sampling width: 0.02°
Scan speed: 2.0°/min
Divergence slit: 1°
Divergence length restriction slit: 10 mm
Scattering slit: 2°
Light receiving slit: 0.3 mm
Tube: Cu
Tube voltage: 40 kV
Tube current: 40 mA
(Weight Average Molecular Weight (Mw) of Resin [B] and Dispersant [C])
The weight average molecular weight (Mw) of the resin [B] and the dispersant [C] is a weight average molecular weight (Mw) in terms of polystyrene which was measured using a TSKgel column (commercially available from Tosoh Corporation) in GPC (HLC-8120GPC, commercially available from Tosoh Corporation) including an RI detector and using THF in a developing solvent.
(Quaternary Ammonium Salt Value of Dispersant [C])
The quaternary ammonium salt value of the dispersant [C] was determined by performing titration in a 0.1 N silver nitrate aqueous solution using a 5% potassium chromate aqueous solution as an indicator, and then performing conversion into an equivalent of potassium hydroxide. The quaternary ammonium salt value indicates an quaternary ammonium salt value of the solid content.
(Acid Value of Resin [B] and Dispersant [C])
The acid value of the resin [B] and the dispersant [C] was determined using a 0.1 N potassium hydroxide/ethanol solution according to a potentiometric titration method. The acid value of the resin [B] and the dispersant [C] indicates the acid value of the solid content.
(Amine value of dispersant [C])
The amine value of the dispersant [C] was determined using a 0.1 N hydrochloric acid aqueous solution according to a potentiometric titration method, and then performing conversion into an equivalent of potassium hydroxide. The amine value of the dispersant [C] indicates an amine value of the solid content.
<Production of squarylium dye>

Example 1

(Production of Squarylium Dye [A-1])
40.0 parts of 1,8-diaminonaphthalene, 46.0 parts of 9-fluorenone, and 0.087 parts of p-toluenesulfonic acid monohydrate were mixed into 400 parts of toluene, and the mixture was heated and stirred in a nitrogen gas atmosphere and refluxed for 3 hours. Water generated during the reaction was removed from the system by azeotropic distillation. After the reaction was completed, a dark brown solid obtained by distilling toluene was extracted in acetone, and purified by recrystallization from a solvent in which acetone and ethanol were mixed. The obtained brown solid was dissolved in a solvent in which 240 parts of toluene and 160 parts of n-butanol were mixed, and 13.8 parts of 3,4-dihydroxy-3-cyclobutene-1,2-dione was added thereto, and the mixture was heated and stirred in a nitrogen gas atmosphere, and refluxed and reacted for 8 hours. Water generated during the reaction was removed from the system by azeotropic distillation. After the reaction was completed, the solvent was distilled, and 200 parts of hexane was added while stirring the obtained reaction mixture. The obtained black brown precipitate was filtered, washing with hexane, ethanol and acetone was then sequentially performed and drying was performed under a reduced pressure.

550 parts of N-methylpyrrolidone was added to the obtained black solid, and the mixture was stirred at 25° C. for 3 hours. In addition, 295 parts of methanol was added thereto, the mixture was stirred for 10 minutes, the obtained black brown precipitate was filtered, washing with methanol was then performed, and drying was performed under a reduced pressure, and thereby 76.1 parts of a squarylium dye [A-1] (yield: 87%) was obtained. Based on the result of mass spectrometry and elemental analysis according to TOF-MS, it was identified as a squarylium dye [A-1]. In addition, when an X-ray diffraction pattern according to CuKα rays was measured, it had peaks at Bragg angles 2θ=8.6°, 12.4°, 17.5°, 20.2°, 22.2° and 25.4° as shown in FIG. 1.

Squarylium dye [A-1]

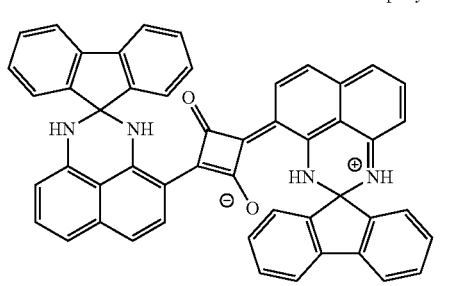

Example 2

(Production of Squarylium Dye [A-2])

The same procedures as in the production of the squarylium dye [A-1] were performed except that 49.6 parts of 2-methyl-9-fluorenone was used in place of 46.0 parts of 9-fluorenone used in the production of the squarylium dye [A-1], and thereby 75.3 parts of a squarylium dye [A-2] (yield: 83%) was obtained. Based on the result of mass spectrometry and elemental analysis according to TOF-MS, it was identified as a squarylium dye [A-2]. In addition, when an X-ray diffraction pattern according to CuKα rays was measured, it had peaks at Bragg angles 2θ=8.6°, 12.4°, 17.5°, 20.2°, 22.2° and 25.4°.

Squarylium dye [A-2]

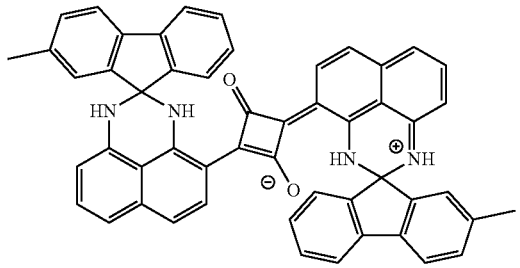

Example 3

(Production of Squarylium Dye [A-3])

The same procedures as in the production of the squarylium dye [A-1] were performed except that 53.2 parts of 1,8-dimethyl-9-fluorenone was used in place of 46.0 parts of 9-fluorenone used in the production of the squarylium dye [A-1], and thereby 75.3 parts of a squarylium dye [A-3] (yield: 80%) was obtained. Based on the result of mass spectrometry and elemental analysis according to TOF-MS, it was identified as a squarylium dye [A-3]. In addition, when an X-ray diffraction pattern according to CuKα rays was measured, it had peaks at Bragg angles 2θ=8.6°, 12.4°, 17.5°, 20.2°, 22.2° and 25.4°.

Squarylium dye [A-3]

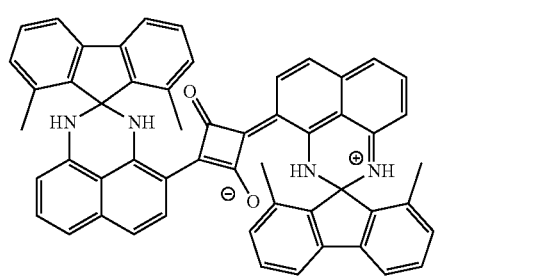

Example 4

(Production of Squarylium Dye [A-4])

The same procedures as in the production of the squarylium dye [A-1] were performed except that 60.3 parts of 3,6-diethyl-9-fluorenone was used in place of 46.0 parts of 9-fluorenone used in the production of the squarylium dye [A-1], and thereby 83.3 parts of a squarylium dye [A-4] (yield: 83%) was obtained. Based on the result of mass spectrometry and elemental analysis according to TOF-MS, it was identified as a squarylium dye [A-4]. In addition, when an X-ray diffraction pattern according to CuKα rays was measured, it had peaks at Bragg angles 2θ=8.6°, 12.4°, 17.5°, 20.2°, 22.2° and 25.4°.

Squarylium dye [A-4]

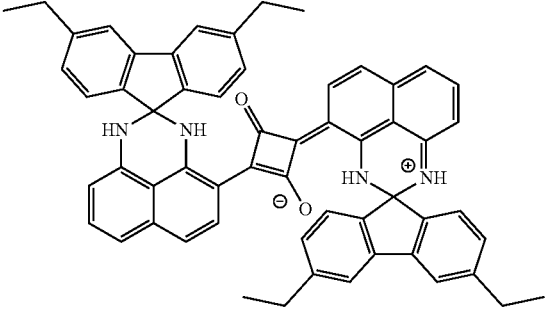

Example 5

(Production of Squarylium Dye [A-5])

The same procedures as in the production of the squarylium dye [A-1] were performed except that 74.7 parts of 4,5-diisopropyl-9-fluorenone was used in place of 46.0 parts of 9-fluorenone used in the production of the squarylium dye [A-1], and thereby 91.2 parts of a squarylium dye [A-5]

(yield: 80%) was obtained. Based on the result of mass spectrometry and elemental analysis according to TOF-MS, it was identified as a squarylium dye [A-5]. In addition, when an X-ray diffraction pattern according to CuKα rays was measured, it had peaks at Bragg angles 2θ=8.6°, 12.4°, 17.5°, 20.2°, 22.2° and 25.4°.

Squarylium dye [A-5]

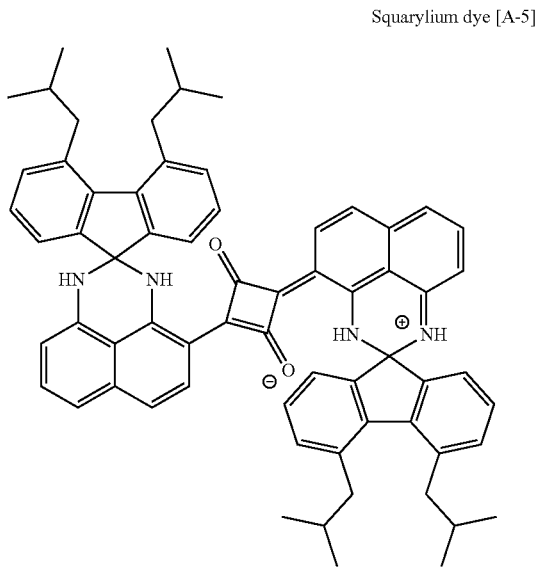

Example 6

(Production of Squarylium Dye [A-6])

The same procedures as in the production of the squarylium dye [A-1] were performed except that 80.7 parts of 2,7-bis(trifluoromethyl)-9-fluorenone was used in place of 46.0 parts of 9-fluorenone used in the production of the squarylium dye [A-1], and thereby 94.4 parts of a squarylium dye [A-6] (yield: 79%) was obtained. Based on the result of mass spectrometry and elemental analysis according to TOF-MS, it was identified as a squarylium dye [A-6]. In addition, when an X-ray diffraction pattern according to CuKα rays was measured, it had peaks at Bragg angles 2θ=8.6°, 12.4°, 17.5°, 20.2°, 22.2° and 25.4°.

Squarylium dye [A-6]

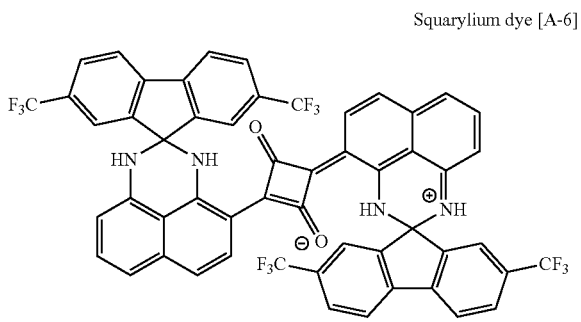

Example 7

(Production of Squarylium Dye [A-7])

The same procedures as in the production of the squarylium dye [A-1] were performed except that 59.3 parts of 2,3-divinyl-9-fluorenone was used in place of 46.0 parts of 9-fluorenone used in the production of the squarylium dye [A-1], and thereby 84.9 parts of a squarylium dye [A-7] (yield: 85%) was obtained. Based on the result of mass spectrometry and elemental analysis according to TOF-MS, it was identified as a squarylium dye [A-7]. In addition, when an X-ray diffraction pattern according to CuKα rays was measured, it had peaks at Bragg angles 2θ=8.6°, 12.4°, 17.5°, 20.2°, 22.2° and 25.4°.

Squarylium dye [A-7]

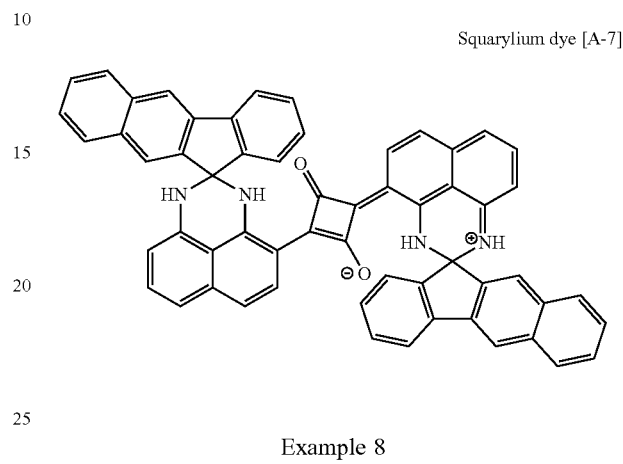

Example 8

(Production of Squarylium Dye [A-8])

The same procedures as in the production of the squarylium dye [A-1] were performed except that 65.5 parts of 2-phenyl-9-fluorenone was used in place of 46.0 parts of 9-fluorenone used in the production of the squarylium dye [A-1], and thereby 85.5 parts of a squarylium dye [A-8] (yield: 81%) was obtained. Based on the result of mass spectrometry and elemental analysis according to TOF-MS, it was identified as a squarylium dye [A-8]. In addition, when an X-ray diffraction pattern according to CuKα rays was measured, it had peaks at Bragg angles 2θ=8.6°, 12.4°, 17.5°, 20.2°, 22.2° and 25.4°.

Squarylium dye [A-8]

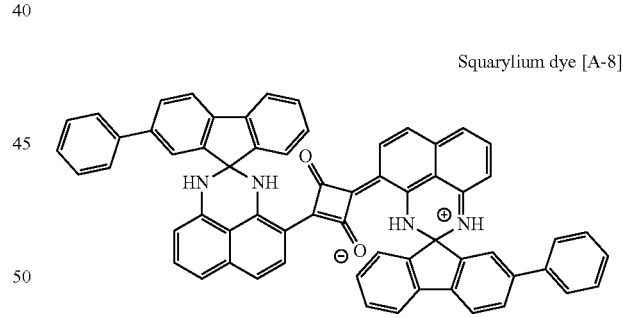

Example 9

(Production of Squarylium Dye [A-9])

The same procedures as in the production of the squarylium dye [A-1] were performed except that 69.0 parts of 2-p-tolyl-9-fluorenone was used in place of 46.0 parts of 9-fluorenone used in the production of the squarylium dye [A-1], and thereby 86.4 parts of a squarylium dye [A-9] (yield: 79%) was obtained. Based on the result of mass spectrometry and elemental analysis according to TOF-MS, it was identified as a squarylium dye [A-9]. In addition, when an X-ray diffraction pattern according to CuKα rays was measured, it had peaks at Bragg angles 2θ=8.6°, 12.4°, 17.5°, 20.2°, 22.2° and 25.4°.

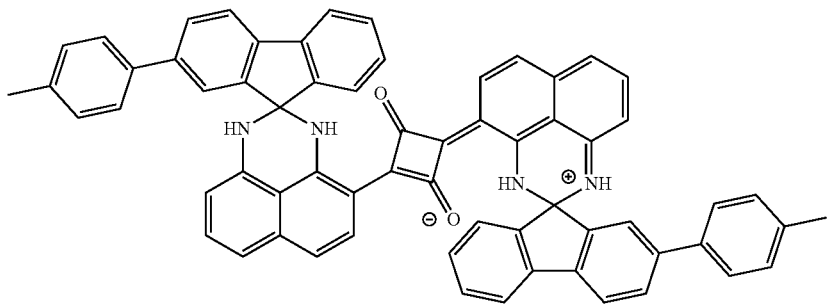

Squarylium dye [A-9]

Example 10

(Production of Squarylium Dye [A-10])

The same procedures as in the production of the squarylium dye [A-1] were performed except that 69.0 parts of 3-benzyl-9-fluorenone was used in place of 46.0 parts of 9-fluorenone used in the production of the squarylium dye [A-1], and thereby 87.8 parts of a squarylium dye [A-10] (yield: 80%) was obtained. Based on the result of mass spectrometry and elemental analysis according to TOF-MS, it was identified as a squarylium dye [A-10]. In addition, when an X-ray diffraction pattern according to CuKα rays was measured, it had peaks at Bragg angles 2θ=8.6°, 12.4°, 17.5°, 20.2°, 22.2° and 25.4°.

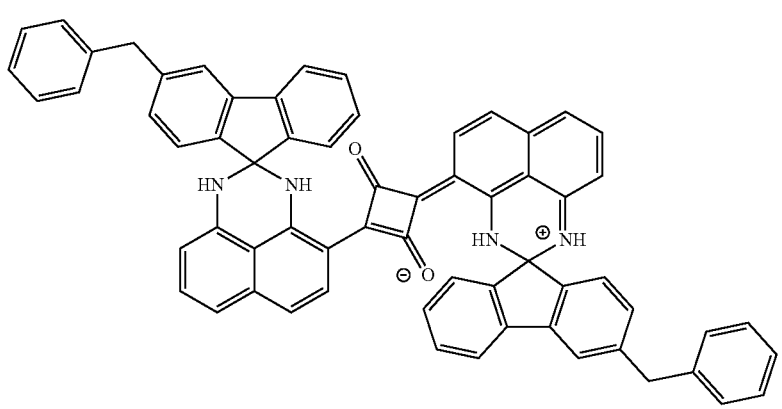

Squarylium dye [A-10]

Example 11

(Production of Squarylium Dye [A-11])

The same procedures as in the production of the squarylium dye [A-1] were performed except that 61.4 parts of 2,3-dimethoxy-9-fluorenone was used in place of 46.0 parts of 9-fluorenone used in the production of the squarylium dye [A-1], and thereby 83.9 parts of a squarylium dye [A-11] (yield: 82%) was obtained. Based on the result of mass spectrometry and elemental analysis according to TOF-MS, it was identified as a squarylium dye [A-11]. In addition, when an X-ray diffraction pattern according to CuKα rays was measured, it had peaks at Bragg angles 2θ=8.6°, 12.4°, 17.5°, 20.2°, 22.2° and 25.4°.

Squarylium dye [A-11]

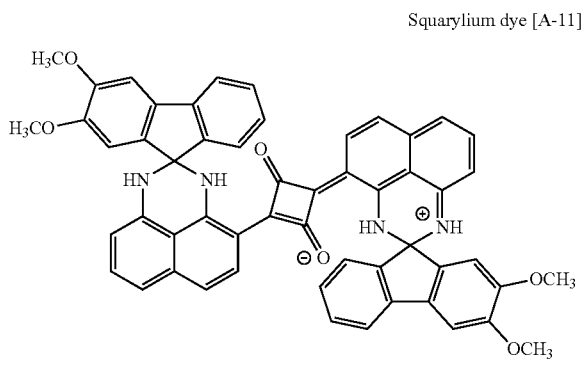

Example 12

Squarylium dye [A-12]

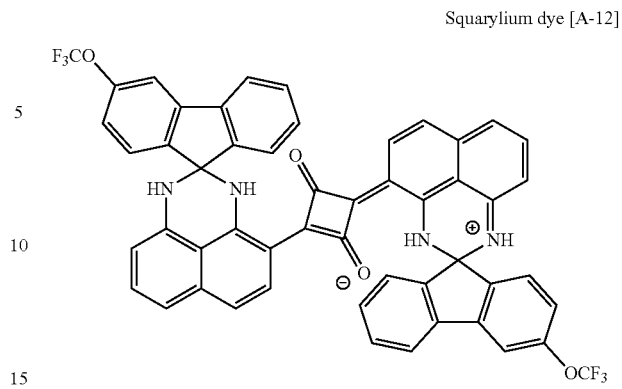

Example 13

(Production of Squarylium Dye [A-12])

The same procedures as in the production of the squarylium dye [A-1] were performed except that 67.5 parts of 3-(trifluoromethoxy)-9-fluorenone was used in place of 46.0 parts of 9-fluorenone used in the production of the squarylium dye [A-1], and thereby 90.1 parts of a squarylium dye [A-12] (yield: 84%) was obtained. Based on the result of mass spectrometry and elemental analysis according to TOF-MS, it was identified as a squarylium dye [A-12]. In addition, when an X-ray diffraction pattern according to CuKα rays was measured, it had peaks at Bragg angles 2θ=8.6°, 12.4°, 17.5°, 20.2°, 22.2° and 25.4°.

(Production of Squarylium Dye [A-13])

The same procedures as in the production of the squarylium dye [A-1] were performed except that 104.8 parts of 2,7-bis(2-(diethylamino)ethoxy)-9-fluorenone was used in place of 46.0 parts of 9-fluorenone used in the production of the squarylium dye [A-1], and thereby 118.5 parts of a squarylium dye [A-13] (yield: 83%) was obtained. Based on the result of mass spectrometry and elemental analysis according to TOF-MS, it was identified as a squarylium dye [A-13]. In addition, when an X-ray diffraction pattern according to CuKα rays was measured, it had peaks at Bragg angles 2θ=8.6°, 12.4°, 17.5°, 20.2°, 22.2° and 25.4°.

Squarylium dye [A-13]

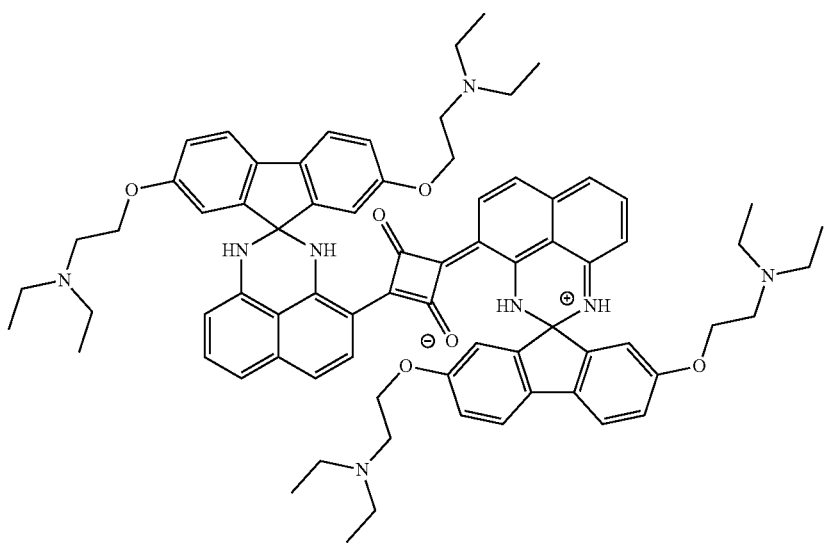

Example 14

(Production of Squarylium Dye [A-14])

The same procedures as in the production of the squarylium dye [A-1] were performed except that 69.5 parts of 3-phenoxy-9-fluorenone was used in place of 46.0 parts of 9-fluorenone used in the production of the squarylium dye [A-1], and thereby 89.1 parts of a squarylium dye [A-14] (yield: 81%) was obtained. Based on the result of mass spectrometry and elemental analysis according to TOF-MS, it was identified as a squarylium dye [A-14]. In addition, when an X-ray diffraction pattern according to CuKα rays was measured, it had peaks at Bragg angles 2θ=8.6°, 12.4°, 17.5°, 20.2°, 22.2° and 25.4°.

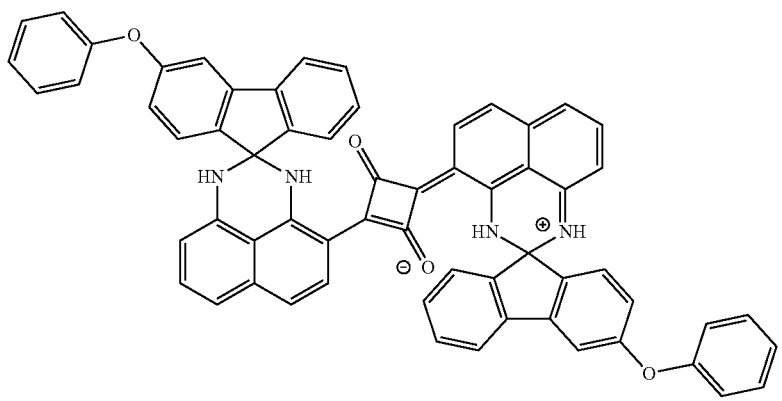

Squarylium dye [A-14]

Example 15

(Production of Squarylium Dye [A-15])

The same procedures as in the production of the squarylium dye [A-1] were performed except that 50.1 parts of 1-hydroxy-9-fluorenone was used in place of 46.0 parts of 9-fluorenone used in the production of the squarylium dye [A-1], and thereby 72.3 parts of a squarylium dye [A-15] (yield: 79%) was obtained. Based on the result of mass spectrometry and elemental analysis according to TOF-MS, it was identified as a squarylium dye [A-15]. In addition, when an X-ray diffraction pattern according to CuKα rays was measured, it had peaks at Bragg angles 2θ=8.6°, 12.4°, 17.5°, 20.2°, 22.2° and 25.4°.

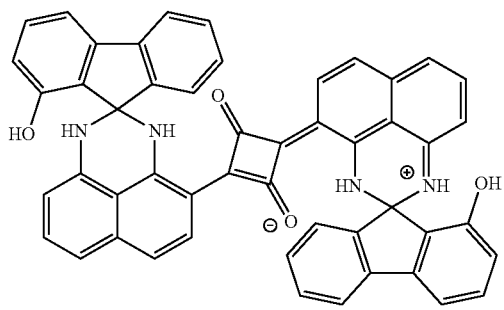

Squarylium dye [A-15]

Example 16

(Production of Squarylium Dye [A-16])

The same procedures as in the production of the squarylium dye [A-1] were performed except that 50.1 parts of 2-hydroxy-9-fluorenone was used in place of 46.0 parts of 9-fluorenone used in the production of the squarylium dye [A-1], and thereby 71.4 parts of a squarylium dye [A-16] (yield: 78%) was obtained. Based on the result of mass spectrometry and elemental analysis according to TOF-MS, it was identified as a squarylium dye [A-16]. In addition, when an X-ray diffraction pattern according to CuKα rays was measured, it had peaks at Bragg angles 2θ=8.6°, 12.4°, 17.5°, 20.2°, 22.2° and 25.4°.

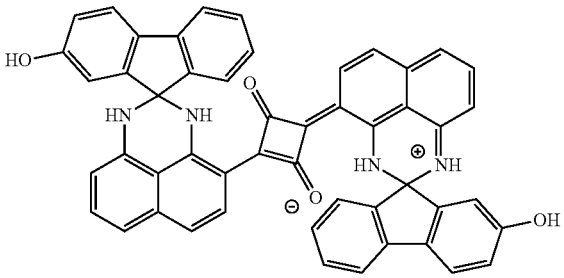

Squarylium dye [A-16]

Example 17

(Production of Squarylium Dye [A-17])

The same procedures as in the production of the squarylium dye [A-1] were performed except that 54.2 parts of 2,7-dihydroxy-9-fluorenone was used in place of 46.0 parts of 9-fluorenone used in the production of the squarylium dye [A-1], and thereby 81.8 parts of a squarylium dye [A-17] (yield: 86%) was obtained. Based on the result of mass spectrometry and elemental analysis according to TOF-MS, it was identified as a squarylium dye [A-17]. In addition, when an X-ray diffraction pattern according to CuKα rays was measured, it had peaks at Bragg angles 2θ=8.6°, 12.4°, 17.5°, 20.2°, 22.2° and 25.4°.

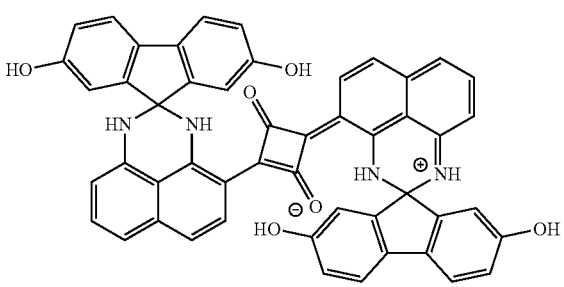

Squarylium dye [A-17]

Example 18

(Production of Squarylium Dye [A-18])

The same procedures as in the production of the squarylium dye [A-1] were performed except that 49.9 parts of 2-amino-9-fluorenone was used in place of 46.0 parts of 9-fluorenone used in the production of the squarylium dye [A-1], and thereby 74.7 parts of a squarylium dye [A-18] (yield: 82%) was obtained. Based on the result of mass spectrometry and elemental analysis according to TOF-MS, it was identified as a squarylium dye [A-18]. In addition, when an X-ray diffraction pattern according to CuKα rays was measured, it had peaks at Bragg angles 2θ=8.6°, 12.4°, 17.5°, 20.2°, 22.2° and 25.4°.

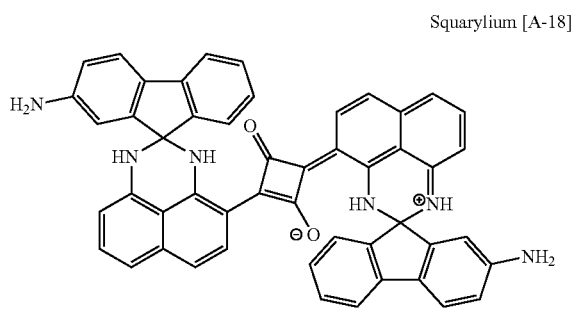 [SMILES: Nc1ccc2c(c1)C1(Nc3cccc4ccc(C5=C([O-])/C(=c6/ccc7cccc8c7c6NC6([NH+]=8)c7ccccc7-c7ccc(N)cc76)C5=O)c(c34)N1)c1ccccc1-2]

Squarylium [A-18]

Example 19

(Production of Squarylium Dye [A-19])

The same procedures as in the production of the squarylium dye [A-1] were performed except that 53.7 parts of 4,5-diamino-9-fluorenone was used in place of 46.0 parts of 9-fluorenone used in the production of the squarylium dye [A-1], and thereby 76.8 parts of a squarylium dye [A-19] (yield: 81%) was obtained. Based on the result of mass spectrometry and elemental analysis according to TOF-MS, it was identified as a squarylium dye [A-19]. In addition, when an X-ray diffraction pattern according to CuKα rays was measured, it had peaks at Bragg angles 2θ=8.6°, 12.4°, 17.5°, 20.2°, 22.2° and 25.4°.

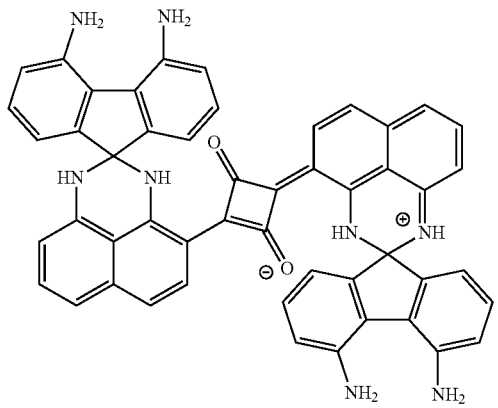

Squarylium dye [A-19]

Example 20

(Production of Squarylium Dye [A-20])

The same procedures as in the production of the squarylium dye [A-1] were performed except that 70.0 parts of 2-amino-3-bromo-9-fluorenone was used in place of 46.0 parts of 9-fluorenone used in the production of the squarylium dye [A-1], and thereby 87.2 parts of a squarylium dye [A-20] (yield: 79%) was obtained. Based on the result of mass spectrometry and elemental analysis according to TOF-MS, it was identified as a squarylium dye [A-20]. In addition, when an X-ray diffraction pattern according to CuKα rays was measured, it had peaks at Bragg angles 2θ=8.6°, 12.4°, 17.5°, 20.2°, 22.2° and 25.4°.

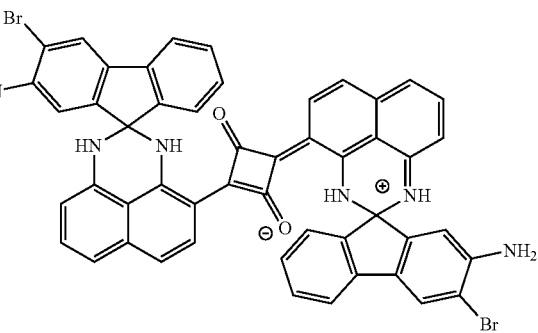

Squarylium dye [A-20]

Example 21

(Production of Squarylium Dye [A-21])

The same procedures as in the production of the squarylium dye [A-1] were performed except that 70.0 parts of 2-amino-7-bromo-9-fluorenone was used in place of 46.0 parts of 9-fluorenone used in the production of the squarylium dye [A-1], and thereby 91.6 parts of a squarylium dye [A-21] (yield: 83%) was obtained. Based on the result of mass spectrometry and elemental analysis according to TOF-MS, it was identified as a squarylium dye [A-21]. In addition, when an X-ray diffraction pattern according to CuKα rays was measured, it had peaks at Bragg angles 2θ=8.6°, 12.4°, 17.5°, 20.2°, 22.2° and 25.4°.

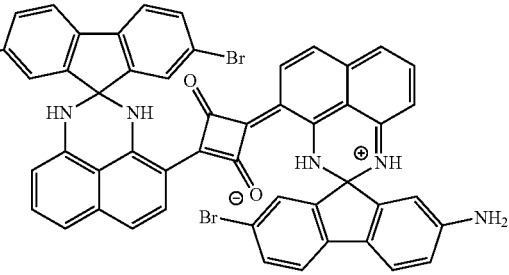

Squarylium dye [A-21]

Example 22

(Production of Squarylium Dye [A-22])

The same procedures as in the production of the squarylium dye [A-1] were performed except that 57.0 parts of 2-(dimethylamino)-9-fluorenone was used in place of 46.0 parts of 9-fluorenone used in the production of the squarylium dye [A-1], and thereby 81.4 parts of a squarylium dye [A-22] (yield: 83%) was obtained. Based on the result of mass spectrometry and elemental analysis according to TOF-MS, it was identified as a squarylium dye [A-22]. In addition, when an X-ray diffraction pattern according to CuKα rays was measured, it had peaks at Bragg angles 2θ=8.6°, 12.4°, 17.5°, 20.2°, 22.2° and 25.4°.

Squarylium dye [A-22]

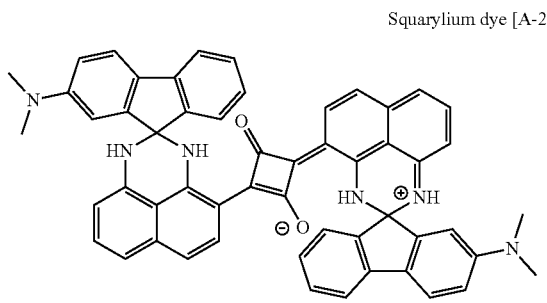

Example 23

(Production of Squarylium Dye [A-23])

The same procedures as in the production of the squarylium dye [A-1] were performed except that 60.6 parts of N-(9-oxo-9H-fluorene-4-yl)acetamide was used in place of 46.0 parts of 9-fluorenone used in the production of the squarylium dye [A-1], and thereby 82.2 parts of a squarylium dye [A-23] (yield: 81%) was obtained. Based on the result of mass spectrometry and elemental analysis according to TOF-MS, it was identified as a squarylium dye [A-23]. In addition, when an X-ray diffraction pattern according to CuKα rays was measured, it had peaks at Bragg angles 2θ=8.6°, 12.4°, 17.5°, 20.2°, 22.2° and 25.4°.

Squarylium due [A-23]

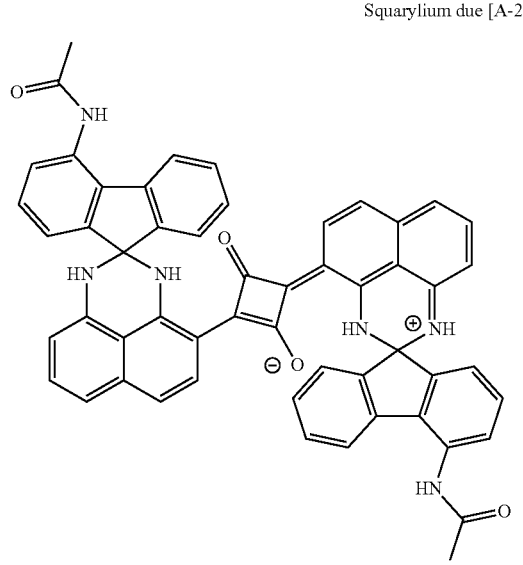

Example 24

(Production of Squarylium Dye [A-24])

The same procedures as in the production of the squarylium dye [A-1] were performed except that 60.6 parts of N-(9-oxo-9H-fluorene-3-yl)acetamide was used in place of 46.0 parts of 9-fluorenone used in the production of the squarylium dye [A-1], and thereby 81.6 parts of a squarylium dye [A-24] (yield: 81%) was obtained. Based on the result of mass spectrometry and elemental analysis according to TOF-MS, it was identified as a squarylium dye [A-24]. In addition, when an X-ray diffraction pattern according to CuKα rays was measured, it had peaks at Bragg angles 2θ=8.6°, 12.4°, 17.5°, 20.2°, 22.2° and 25.4°.

Squarylium dye [A-24]

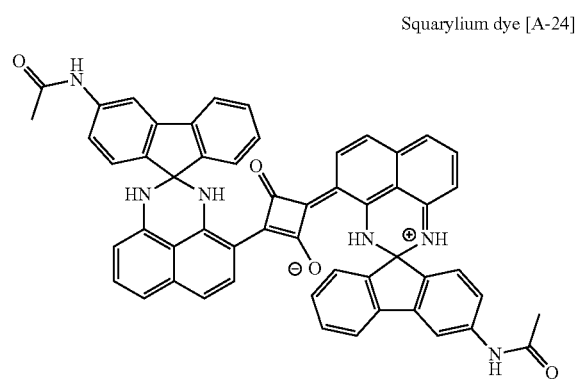 [SMILES: CC(=O)Nc1ccc2c(c1)-c1ccccc1C21Nc2cccc3ccc(C4=C([O-])/C(=c5/ccc6cccc7c6c5NC5([NH+]=7)c6ccccc6-c6cc(NC(C)=O)ccc65)C4=O)c(c23)N1]

Example 25

(Production of Squarylium Dye [A-25])

The same procedures as in the production of the squarylium dye [A-1] were performed except that 66.5 parts of 9-oxo-9H-fluorene-2-sulfonic acid was used in place of 46.0 parts of 9-fluorenone used in the production of the squarylium dye [A-1], and thereby 85.4 parts of a squarylium dye [A-25] (yield: 80%) was obtained. Based on the result of mass spectrometry and elemental analysis according to TOF-MS, it was identified as a squarylium dye [A-25]. In addition, when an X-ray diffraction pattern according to CuKα rays was measured, it had peaks at Bragg angles 2θ=8.6°, 12.4°, 17.5°, 20.2°, 22.2° and 25.4°.

Squarylium dye [A-25]

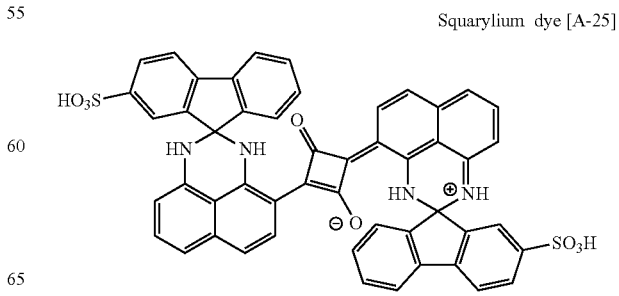

Example 26

(Production of Squarylium Dye [A-26])

The same procedures as in the production of the squarylium dye [A-1] were performed except that 86.9 parts of 9-oxo-9H-fluorene-2,7-disulfonic acid was used in place of 46.0 parts of 9-fluorenone used in the production of the squarylium dye [A-1], and thereby 105.6 parts of a squarylium dye [A-26] (yield: 84%) was obtained. Based on the result of mass spectrometry and elemental analysis according to TOF-MS, it was identified as a squarylium dye [A-26]. In addition, when an X-ray diffraction pattern according to CuKα rays was measured, it had peaks at Bragg angles 2θ=8.6°, 12.4°, 17.5°, 20.2°, 22.2° and 25.4°.

Squarylium dye [A-26]

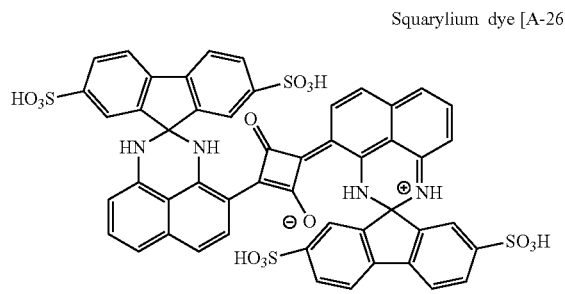 [SMILES: O=C1C(c2ccc3cccc4c3c2NC2(N4)c3cc(S(=O)(=O)O)ccc3-c3ccc(S(=O)(=O)O)cc32)=C([O-])/C1=c1/ccc2cccc3c2c1NC1([NH+]=3)c2cc(S(=O)(=O)O)ccc2-c2ccc(S(=O)(=O)O)cc21]

Example 27

(Production of Squarylium Dye [A-27])

The same procedures as in the production of the squarylium dye [A-1] were performed except that 115.1 parts of $N^2,N^7$-di-sec-butyl-9-oxo-9H-fluorene-2,7-disulfonamide was used in place of 46.0 parts of 9-fluorenone used in the production of the squarylium dye [A-1], and thereby 123.9 parts of a squarylium dye [A-27] (yield: 81%) was obtained. Based on the result of mass spectrometry and elemental analysis according to TOF-MS, it was identified as a squarylium dye [A-27]. In addition, when an X-ray diffraction pattern according to CuKα rays was measured, it had peaks at Bragg angles 2θ=8.6°, 12.4°, 17.5°, 20.2°, 22.2° and 25.4°.

Squarylium dye [A-27]

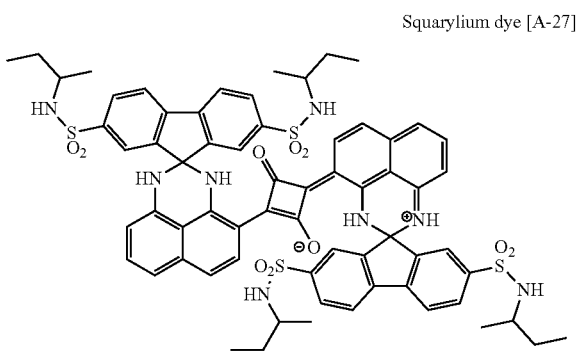 [SMILES: CCC(C)NS(=O)(=O)c1ccc2c(c1)C1(Nc3cccc4ccc(C5=C([O-])/C(=c6/ccc7cccc8c7c6NC6([NH+]=8)c7cc(S(=O)(=O)NC(C)CC)ccc7-c7ccc(S(=O)(=O)NC(C)CC)cc76)C5=O)c(c34)N1)c1cc(S(=O)(=O)NC(C)CC)ccc1-2]

Example 28

(Production of Squarylium Dye [A-28])

The same procedures as in the production of the squarylium dye [A-1] were performed except that 139.6 parts of $N^2,N^7$-bis(2,4-dimethylphenyl)-9-oxo-9H-fluorene-2,7-disulfonamide was used in place of 46.0 parts of 9-fluorenone used in the production of the squarylium dye [A-1], and thereby 143.9 parts of a squarylium dye [A-28] (yield: 82%) was obtained. Based on the result of mass spectrometry and elemental analysis according to TOF-MS, it was identified as a squarylium dye [A-28]. In addition, when an X-ray diffraction pattern according to CuKα rays was measured, it had peaks at Bragg angles 2θ=8.6°, 12.4°, 17.5°, 20.2°, 22.2° and 25.4°.

Squarylium dye [A-28]

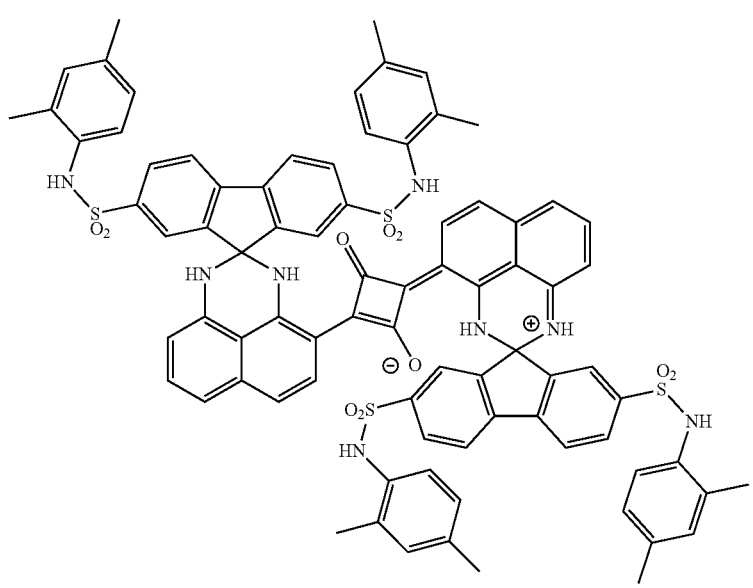

Example 29

(Production of Squarylium Dye [A-29])

The same procedures as in the production of the squarylium dye [A-1] were performed except that 142.9 parts of $N^2,N^7$-bis(4-chlorophenyl)-9-oxo-9H-fluorene-2,7-disulfonamide was used in place of 46.0 parts of 9-fluorenone used in the production of the squarylium dye [A-1], and thereby 147.4 parts of a squarylium dye [A-29] (yield: 82%) was obtained. Based on the result of mass spectrometry and elemental analysis according to TOF-MS, it was identified as a squarylium dye [A-29]. In addition, when an X-ray diffraction pattern according to CuKα rays was measured, it had peaks at Bragg angles 2θ=8.6°, 12.4°, 17.5°, 20.2°, 22.2° and 25.4°.

Squarylium dye [A-29]

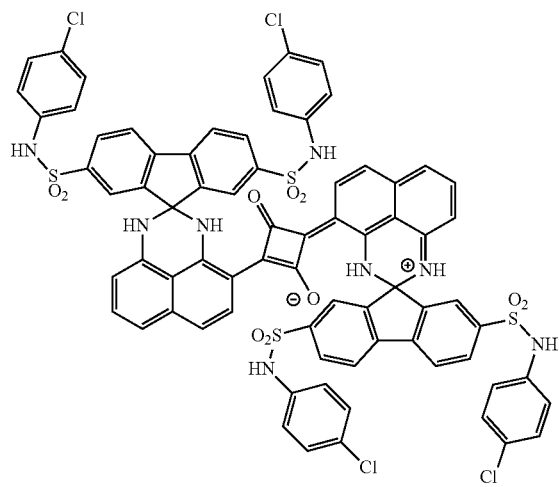

Example 30

(Production of Squarylium Dye [A-30])

The same procedures as in the production of the squarylium dye [A-1] were performed except that 107.9 parts of $N^2,N^7$-diacetyl-9-oxo-9H-fluorene-2,7-disulfonamide was used in place of 46.0 parts of 9-fluorenone used in the production of the squarylium dye [A-1], and thereby 117.4 parts of a squarylium dye [A-30] (yield: 80%) was obtained. Based on the result of mass spectrometry and elemental analysis according to TOF-MS, it was identified as a squarylium dye [A-30]. In addition, when an X-ray diffraction pattern according to CuKα rays was measured, it had peaks at Bragg angles 2θ=8.6°, 12.4°, 17.5°, 20.2°, 22.2° and 25.4°.

Squarylium dye [A-30]

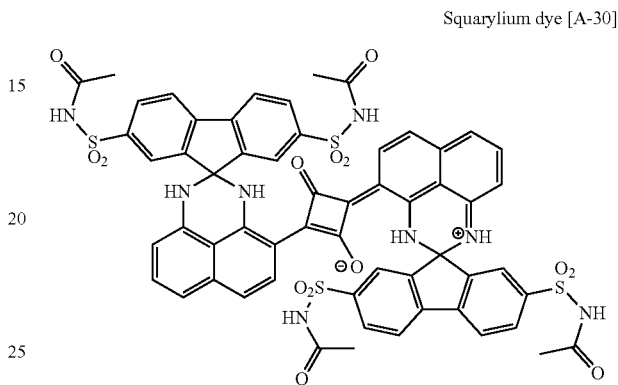

Example 31

(Production of Squarylium Dye [A-31])

The same procedures as in the production of the squarylium dye [A-1] were performed except that 125.8 parts of 9-oxo-$N^2,N^7$-di(pyridin-4-yl)-9H-fluorene-2,7-disulfonamide was used in place of 46.0 parts of 9-fluorenone used in the production of the squarylium dye [A-1], and thereby 132.7 parts of a squarylium dye [A-31] (yield: 81%) was obtained. Based on the result of mass spectrometry and elemental analysis according to TOF-MS, it was identified as a squarylium dye [A-31]. In addition, when an X-ray diffraction pattern according to CuKα rays was measured, it had peaks at Bragg angles 2θ=8.6°, 12.4°, 17.5°, 20.2°, 22.2° and 25.4°.

Squaryliuym dye [A-31]

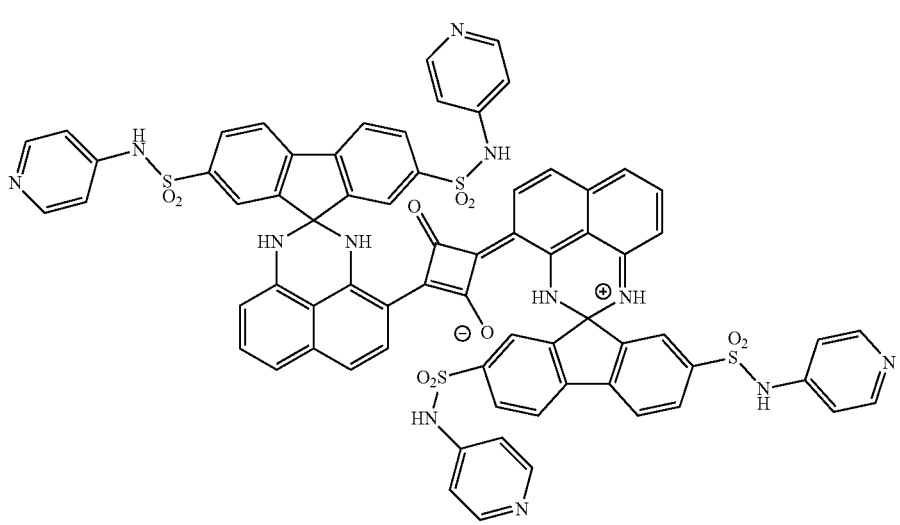

Example 32

(Production of Squarylium Dye [A-32])

The same procedures as in the production of the squarylium dye [A-1] were performed except that 135.5 parts of $N^2,N^7$-bis(3,5-dimethylpiperidin-1-ylsulfonyl)-9H-fluoren-9-one was used in place of 46.0 parts of 9-fluorenone used in the production of the squarylium dye [A-1], and thereby 137.5 parts of a squarylium dye [A-32] (yield: 80%) was obtained. Based on the result of mass spectrometry and elemental analysis according to TOF-MS, it was identified as a squarylium dye [A-32]. In addition, when an X-ray diffraction pattern according to CuKα rays was measured, it had peaks at Bragg angles 2θ=8.6°, 12.4°, 17.5°, 20.2°, 22.2° and 25.4°.

Example 33

(Production of Squarylium Dye [A-33])

The same procedures as in the production of the squarylium dye [A-1] were performed except that 57.3 parts of 9-oxo-9H-fluorene-1-carboxylic acid was used in place of 46.0 parts of 9-fluorenone used in the production of the squarylium dye [A-1], and thereby 84.1 parts of a squarylium dye [A-33] (yield: 86%) was obtained. Based on the result of mass spectrometry and elemental analysis according to TOF-MS, it was identified as a squarylium dye [A-33]. In addition, when an X-ray diffraction pattern according to CuKα rays was measured, it had peaks at Bragg angles 2θ=8.6°, 12.4°, 17.5°, 20.2°, 22.2° and 25.4°.

Example 34

(Production of Squarylium Dye [A-34])

The same procedures as in the production of the squarylium dye [A-1] were performed except that 57.3 parts of 9-oxo-9H-fluorene-4-carboxylic acid was used in place of 46.0 parts of 9-fluorenone used in the production of the squarylium dye [A-1], and thereby 79.7 parts of a squarylium dye [A-34] (yield: 81%) was obtained. Based on the result of mass spectrometry and elemental analysis according to TOF-MS, it was identified as a squarylium dye [A-34]. In addition, when an X-ray diffraction pattern according to CuKα rays was measured, it had peaks at Bragg angles 2θ=8.6°, 12.4°, 17.5°, 20.2°, 22.2° and 25.4°.

Squaryliym dye [A-32]

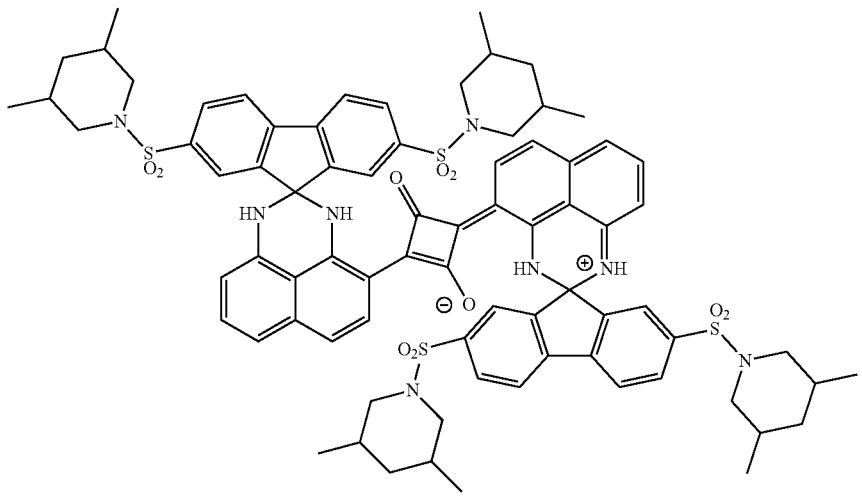

Squarylium dye [A-33]

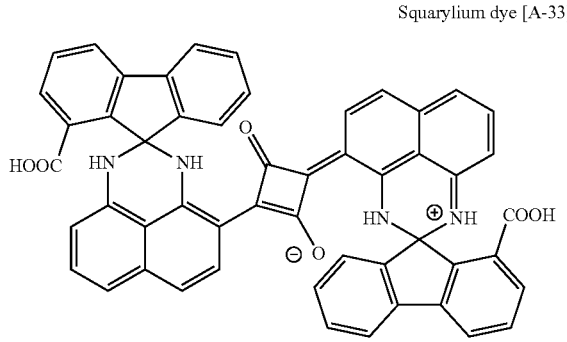 [SMILES: O=C1C(c2ccc3cccc4c3c2NC2(N4)c3ccccc3-c3cccc(C(=O)O)c32)=C([O-])/C1=c1/ccc2cccc3c2c1NC1([NH+]=3)c2ccccc2-c2cccc(C(=O)O)c21]

Squarylium dye [A-34]

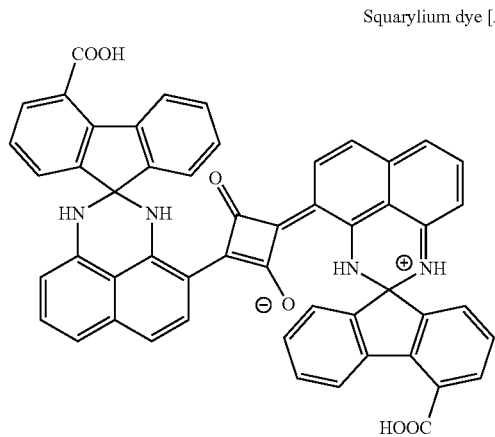

Example 35

(Production of Squarylium Dye [A-35])

The same procedures as in the production of the squarylium dye [A-1] were performed except that 60.8 parts of methyl 9-oxo-9H-fluorene-1-carboxylate was used in place of 46.0 parts of 9-fluorenone used in the production of the squarylium dye [A-1], and thereby 82.8 parts of a squarylium dye [A-35] (yield: 82%) was obtained. Based on the result of mass spectrometry and elemental analysis according to TOF-MS, it was identified as a squarylium dye

[A-35]. In addition, when an X-ray diffraction pattern according to CuKα rays was measured, it had peaks at Bragg angles 2θ=8.6°, 12.4°, 17.5°, 20.2°, 22.2° and 25.4°.

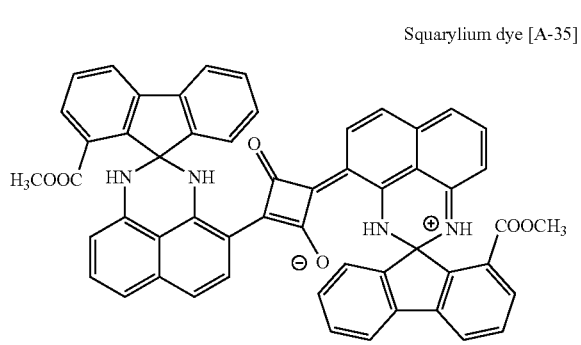

Squarylium dye [A-35]

Example 36

(Production of Squarylium Dye [A-36])

The same procedures as in the production of the squarylium dye [A-1] were performed except that 64.4 parts of ethyl 9-oxo-9H-fluorene-4-carboxylate was used in place of 46.0 parts of 9-fluorenone used in the production of the squarylium dye [A-1], and thereby 85.9 parts of a squarylium dye [A-36] (yield: 82%) was obtained. Based on the result of mass spectrometry and elemental analysis according to TOF-MS, it was identified as a squarylium dye [A-36]. In addition, when an X-ray diffraction pattern according to CuKα rays was measured, it had peaks at Bragg angles 2θ=8.6°, 12.4°, 17.5°, 20.2°, 22.2° and 25.4°.

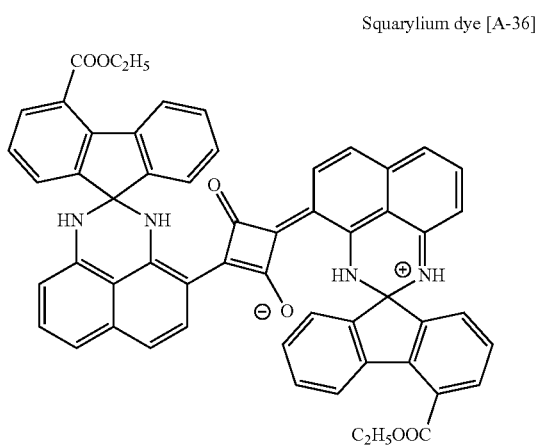

Squarylium dye [A-36]

Example 37

(Production of Squarylium Dye [A-37])

The same procedures as in the production of the squarylium dye [A-1] were performed except that 57.0 parts of 9-oxo-9H-fluorene-2-carboxamide was used in place of 46.0 parts of 9-fluorenone used in the production of the squarylium dye [A-1], and thereby 79.3 parts of a squarylium dye [A-37] (yield: 81%) was obtained. Based on the result of mass spectrometry and elemental analysis according to TOF-MS, it was identified as a squarylium dye [A-37]. In addition, when an X-ray diffraction pattern according to CuKα rays was measured, it had peaks at Bragg angles 2θ=8.6°, 12.4°, 17.5°, 20.2°, 22.2° and 25.4°.

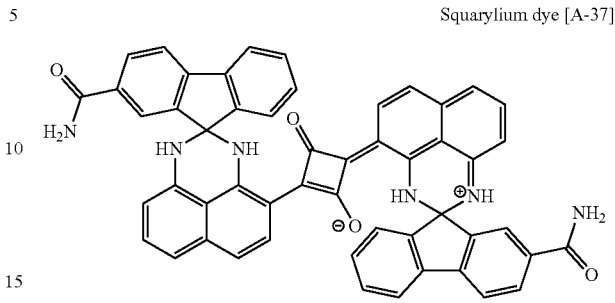

Squarylium dye [A-37]

Example 38

(Production of Squarylium Dye [A-38])

The same procedures as in the production of the squarylium dye [A-1] were performed except that 57.5 parts of 2-nitro-9-fluorenone was used in place of 46.0 parts of 9-fluorenone used in the production of the squarylium dye [A-1], and thereby 80.7 parts of a squarylium dye [A-38] (yield: 82%) was obtained. Based on the result of mass spectrometry and elemental analysis according to TOF-MS, it was identified as a squarylium dye [A-38]. In addition, when an X-ray diffraction pattern according to CuKα rays was measured, it had peaks at Bragg angles 2θ=8.6°, 12.4°, 17.5°, 20.2°, 22.2° and 25.4°.

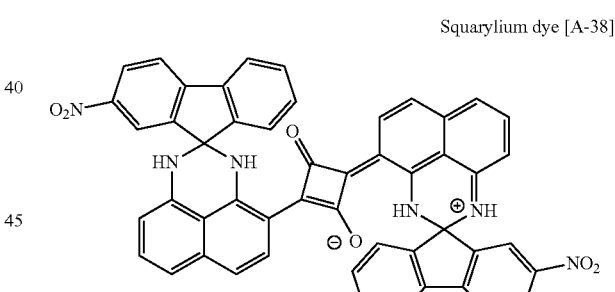

Squarylium dye [A-38]

Example 39

(Production of Squarylium Dye [A-39])

The same procedures as in the production of the squarylium dye [A-1] were performed except that 69.0 parts of 2,7-dinitro-9-fluorenone was used in place of 46.0 parts of 9-fluorenone used in the production of the squarylium dye [A-1], and thereby 89.1 parts of a squarylium dye [A-39] (yield: 82%) was obtained. Based on the result of mass spectrometry and elemental analysis according to TOF-MS, it was identified as a squarylium dye [A-39]. In addition, when an X-ray diffraction pattern according to CuKα rays was measured, it had peaks at Bragg angles 2θ=8.6°, 12.4°, 17.5°, 20.2°, 22.2° and 25.4°.

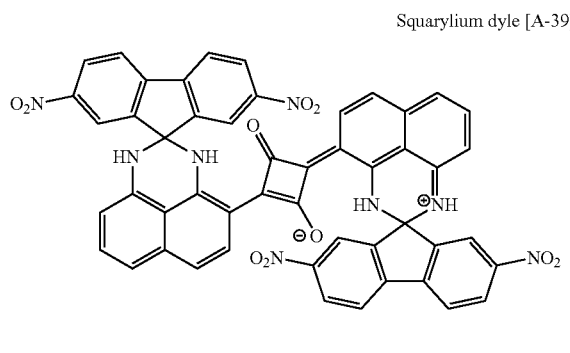 [SMILES: O=C1C(c2ccc3cccc4c3c2NC2(N4)c3cc([N+](=O)[O-])ccc3-c3ccc([N+](=O)[O-])cc32)=C([O-])/C1=c1/ccc2cccc3c2c1NC1([NH+]=3)c2cc([N+](=O)[O-])ccc2-c2ccc([N+](=O)[O-])cc21]

Squarylium dyle [A-39]

Example 40

(Production of Squarylium Dye [A-40])

The same procedures as in the production of the squarylium dye [A-1] were performed except that 52.4 parts of 9-oxo-9H-fluorene-3-carbonitrile was used in place of 46.0 parts of 9-fluorenone used in the production of the squarylium dye [A-1], and thereby 75.5 parts of a squarylium dye [A-40] (yield: 81%) was obtained. Based on the result of mass spectrometry and elemental analysis according to TOF-MS, it was identified as a squarylium dye [A-40]. In addition, when an X-ray diffraction pattern according to CuKα rays was measured, it had peaks at Bragg angles 2θ=8.6°, 12.4°, 17.5°, 20.2°, 22.2° and 25.4°.

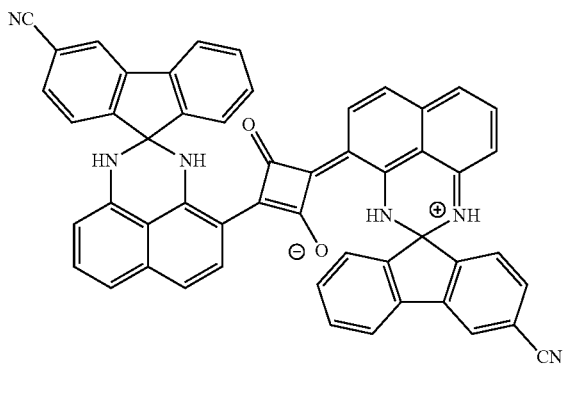

Squarylium dye [A-40]

Example 41

(Production of Squarylium Dye [A-41])

The same procedures as in the production of the squarylium dye [A-1] were performed except that 50.6 parts of 2-fluoro-9-fluorenone was used in place of 46.0 parts of 9-fluorenone used in the production of the squarylium dye [A-1], and thereby 74.8 parts of a squarylium dye [A-41] (yield: 82%) was obtained. Based on the result of mass spectrometry and elemental analysis according to TOF-MS, it was identified as a squarylium dye [A-41]. In addition, when an X-ray diffraction pattern according to CuKα rays was measured, it had peaks at Bragg angles 2θ=8.6°, 12.4°, 17.5°, 20.2°, 22.2° and 25.4°.

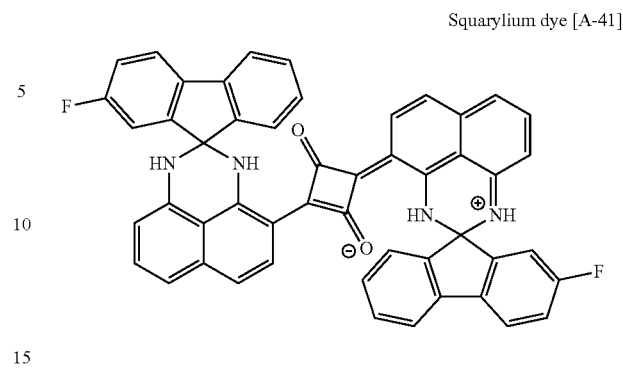

Squarylium dye [A-41]

Example 42

(Production of Squarylium Dye [A-42])

The same procedures as in the production of the squarylium dye [A-1] were performed except that 50.6 parts of 3-fluoro-9-fluorenone was used in place of 46.0 parts of 9-fluorenone used in the production of the squarylium dye [A-1], and thereby 75.3 parts of a squarylium dye [A-42] (yield: 82%) was obtained. Based on the result of mass spectrometry and elemental analysis according to TOF-MS, it was identified as a squarylium dye [A-42]. In addition, when an X-ray diffraction pattern according to CuKα rays was measured, it had peaks at Bragg angles 2θ=8.6°, 12.4°, 17.5°, 20.2°, 22.2° and 25.4°.

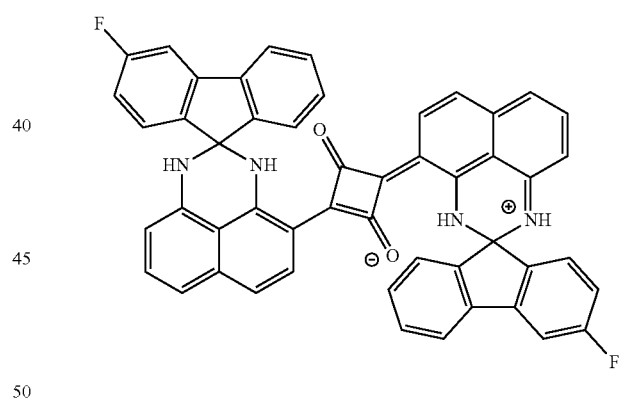

Squarylium dye [A-42]

Example 43

(Production of Squarylium Dye [A-43])

The same procedures as in the production of the squarylium dye [A-1] were performed except that 55.2 parts of 2,5-difluoro-9-fluorenone was used in place of 46.0 parts of 9-fluorenone used in the production of the squarylium dye [A-1], and thereby 75.1 parts of a squarylium dye [A-43] (yield: 78%) was obtained. Based on the result of mass spectrometry and elemental analysis according to TOF-MS, it was identified as a squarylium dye [A-43]. In addition, when an X-ray diffraction pattern according to CuKα rays was measured, it had peaks at Bragg angles 2θ=8.6°, 12.4°, 17.5°, 20.2°, 22.2° and 25.4°.

Squarylium dye [A-43]

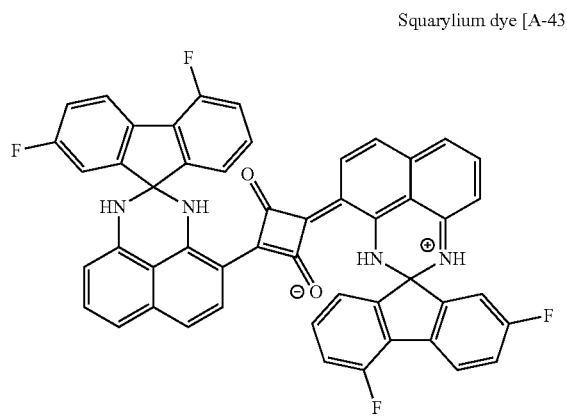

Example 44

(Production of Squarylium Dye [A-44])

The same procedures as in the production of the squarylium dye [A-1] were performed except that 63.6 parts of 2,7-dichloro-9-fluorenone was used in place of 46.0 parts of 9-fluorenone used in the production of the squarylium dye [A-1], and thereby 84.1 parts of a squarylium dye [A-44] (yield: 81%) was obtained. Based on the result of mass spectrometry and elemental analysis according to TOF-MS, it was identified as a squarylium dye [A-44]. In addition, when an X-ray diffraction pattern according to CuKα rays was measured, it had peaks at Bragg angles 2θ=8.6°, 12.4°, 17.5°, 20.2°, 22.2° and 25.4°.

Squarylium dye [A-44]

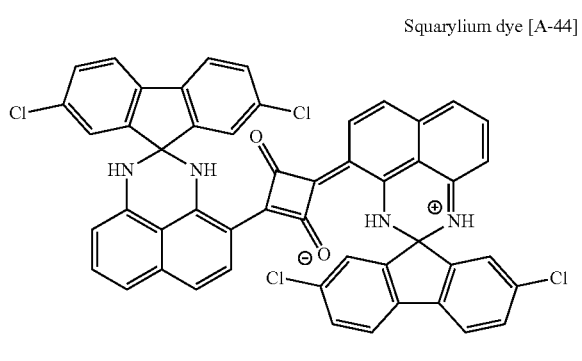

Example 45

(Production of Squarylium Dye [A-45])

The same procedures as in the production of the squarylium dye [A-1] were performed except that 63.6 parts of 2,4-dichloro-9-fluorenone was used in place of 46.0 parts of 9-fluorenone used in the production of the squarylium dye [A-1], and thereby 86.4 parts of a squarylium dye [A-45] (yield: 83%) was obtained. Based on the result of mass spectrometry and elemental analysis according to TOF-MS, it was identified as a squarylium dye [A-45]. In addition, when an X-ray diffraction pattern according to CuKα rays was measured, it had peaks at Bragg angles 2θ=8.6°, 12.4°, 17.5°, 20.2°, 22.2° and 25.4°.

Squarylium dye [A-45]

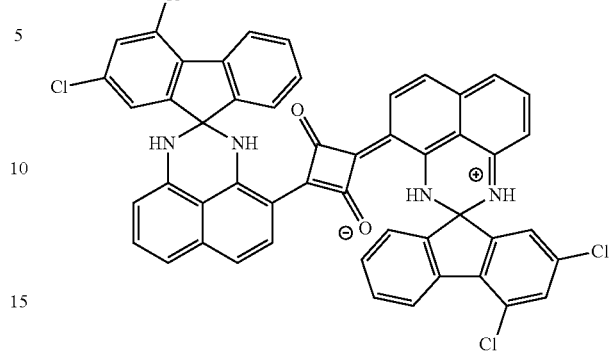

Example 46

(Production of Squarylium Dye [A-46])

The same procedures as in the production of the squarylium dye [A-1] were performed except that 66.2 parts of 2-bromo-9-fluorenone was used in place of 46.0 parts of 9-fluorenone used in the production of the squarylium dye [A-1], and thereby 89.3 parts of a squarylium dye [A-46] (yield: 84%) was obtained. Based on the result of mass spectrometry and elemental analysis according to TOF-MS, it was identified as a squarylium dye [A-46]. In addition, when an X-ray diffraction pattern according to CuKα rays was measured, it had peaks at Bragg angles 2θ=8.6°, 12.4°, 17.5°, 20.2°, 22.2° and 25.4°.

Squarylium dye [A-46]

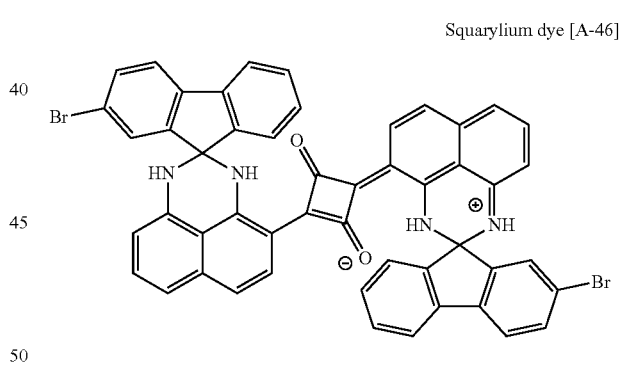

Example 47

(Production of Squarylium Dye [A-47])

The same procedures as in the production of the squarylium dye [A-1] were performed except that 66.2 parts of 4-bromo-9-fluorenone was used in place of 46.0 parts of 9-fluorenone used in the production of the squarylium dye [A-1], and thereby 86.5 parts of a squarylium dye [A-47] (yield: 81%) was obtained. Based on the result of mass spectrometry and elemental analysis according to TOF-MS, it was identified as a squarylium dye [A-47]. In addition, when an X-ray diffraction pattern according to CuKα rays was measured, it had peaks at Bragg angles 2θ=8.6°, 12.4°, 17.5°, 20.2°, 22.2° and 25.4°.

Example 48

(Production of Squarylium Dye [A-48])

The same procedures as in the production of the squarylium dye [A-1] were performed except that 86.3 parts of 2,7-dibromo-9-fluorenone was used in place of 46.0 parts of 9-fluorenone used in the production of the squarylium dye [A-1], and thereby 104.6 parts of a squarylium dye [A-48] (yield: 83%) was obtained. Based on the result of mass spectrometry and elemental analysis according to TOF-MS, it was identified as a squarylium dye [A-48]. In addition, when an X-ray diffraction pattern according to CuKα rays was measured, it had peaks at Bragg angles 2θ=8.6°, 12.4°, 17.5°, 20.2°, 22.2° and 25.4°.

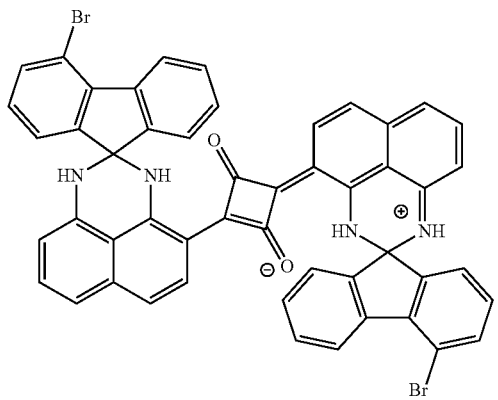

Squarylium dye [A-47]

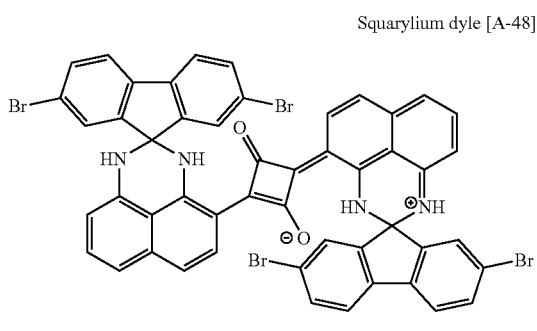 [SMILES: O=C1C(c2ccc3cccc4c3c2NC2(N4)c3cc(Br)ccc3-c3ccc(Br)cc32)=C([O-])/C1=c1/ccc2cccc3c2c1NC1([NH+]=3)c2cc(Br)ccc2-c2ccc(Br)cc21]

Squarylium dyle [A-48]

Example 49

(Production of Squarylium Dye [A-49])

The same procedures as in the production of the squarylium dye [A-1] were performed except that 60.2 parts of 4,5-diaminonaphthalene-1-sulfonic acid was used in place of 40.0 parts of 1,8-diaminonaphthalene used in the production of the squarylium dye [A-1], and thereby 85.5 parts of a squarylium dye [A-49] (yield: 80%) was obtained. Based on the result of mass spectrometry and elemental analysis according to TOF-MS, it was identified as a squarylium dye [A-49]. In addition, when an X-ray diffraction pattern according to CuKα rays was measured, it had peaks at Bragg angles 2θ=8.6°, 12.4°, 17.5°, 20.2°, 22.2° and 25.4°.

Example 50

(Production of Squarylium Dye [A-50])

The same procedures as in the production of the squarylium dye [A-1] were performed except that 80.5 parts of 4,5-diaminonaphthalene-1,8-disulfonic acid was used in place of 40.0 parts of 1,8-diaminonaphthalene used in the production of the squarylium dye [A-1], and thereby 103.6 parts of a squarylium dye [A-50] (yield: 82%) was obtained. Based on the result of mass spectrometry and elemental analysis according to TOF-MS, it was identified as a squarylium dye [A-50]. In addition, when an X-ray diffraction pattern according to CuKα rays was measured, it had peaks at Bragg angles 2θ=8.6°, 12.4°, 17.5°, 20.2°, 22.2° and 25.4°.

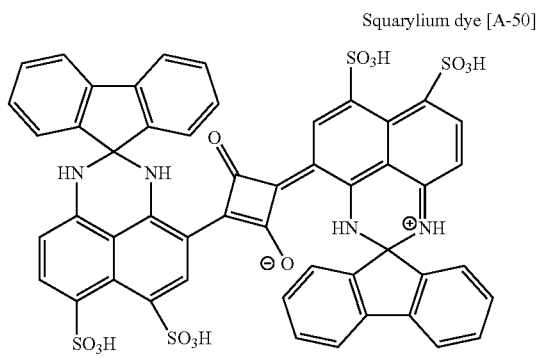 [SMILES: O=C1C(c2cc(S(=O)(=O)O)c3c(S(=O)(=O)O)ccc4c3c2NC2(N4)c3ccccc3-c3ccccc32)=C([O-])/C1=c1/cc(S(=O)(=O)O)c2c(S(=O)(=O)O)ccc3c2c1NC1([NH+]=3)c2ccccc2-c2ccccc21]

Squarylium dye [A-50]

Example 51

(Production of Squarylium Dye [A-51])

The same procedures as in the production of the squarylium dye [A-1] were performed except that 49.1 parts of 1,8-diamino-2,4-difluoronaphthalene was used in place of 40.0 parts of 1,8-diaminonaphthalene used in the production of the squarylium dye [A-1], and thereby 76.8 parts of a squarylium dye [A-51] (yield: 80%) was obtained. Based on the result of mass spectrometry and elemental analysis according to TOF-MS, it was identified as a squarylium dye [A-51]. In addition, when an X-ray diffraction pattern according to CuKα rays was measured, it had peaks at Bragg angles 2θ=8.6°, 12.4°, 17.5°, 20.2°, 22.2° and 25.4°.

Squarylium dye [A-51]

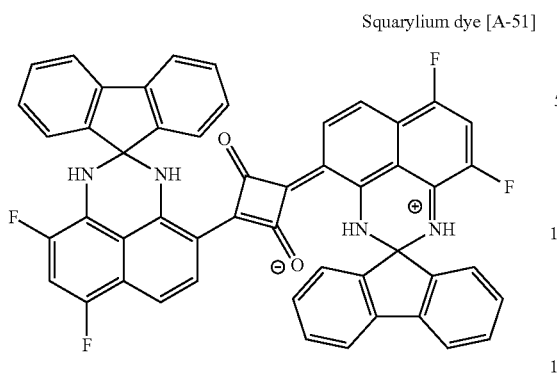

Example 52

(Production of Squarylium Dye [A-52])

The same procedures as in the production of the squarylium dye [A-1] were performed except that 57.4 parts of 1,8-diamino-3,6-dichloronaphthalene was used in place of 40.0 parts of 1,8-diaminonaphthalene used in the production of the squarylium dye [A-1], and thereby 87.5 parts of a squarylium dye [A-52] (yield: 84%) was obtained. Based on the result of mass spectrometry and elemental analysis according to TOF-MS, it was identified as a squarylium dye [A-52]. In addition, when an X-ray diffraction pattern according to CuKα rays was measured, it had peaks at Bragg angles 2θ=8.6°, 12.4°, 17.5°, 20.2°, 22.2° and 25.4°.

Squarylium dye [A-52]

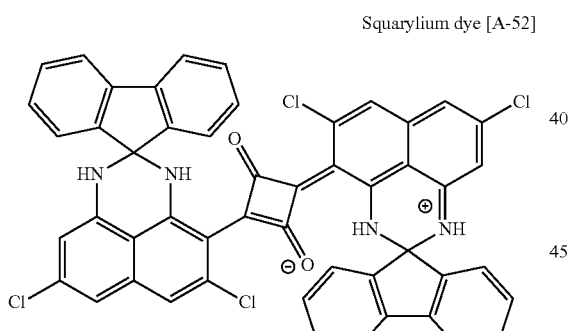

Example 53

(Production of Squarylium Dye [A-53])

The same procedures as in the production of the squarylium dye [A-1] were performed except that 59.9 parts of 1,8-diamino-4-bromonaphthalene was used in place of 40.0 parts of 1,8-diaminonaphthalene used in the production of the squarylium dye [A-1], and thereby 89.7 parts of a squarylium dye [A-53] (yield: 84%) was obtained. Based on the result of mass spectrometry and elemental analysis according to TOF-MS, it was identified as a squarylium dye [A-53]. In addition, when an X-ray diffraction pattern according to CuKα rays was measured, it had peaks at Bragg angles 2θ=8.6°, 12.4°, 17.5°, 20.2°, 22.2° and 25.4°.

Squarylium dye [A-53]

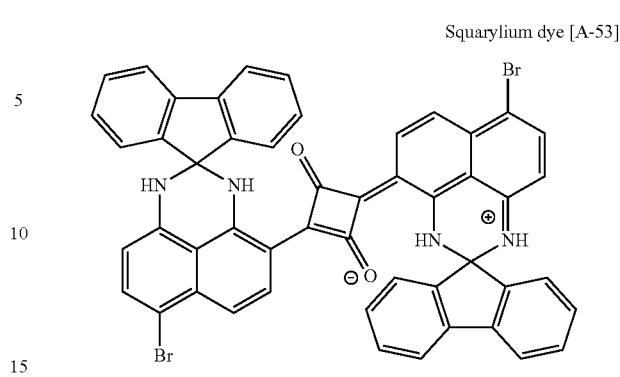

The results obtained by performing mass spectrometry and elemental analysis on the squarylium dyes synthesized in Examples 1 to 53 described above are shown in Table 1 and Table 2.

TABLE 1

| Example | Squarylium | Mass spectrometry (calculated value/measured value) |
|---|---|---|
| 1 | [A-1] | 718.80/718.78 |
| 2 | [A-2] | 746.85/746.84 |
| 3 | [A-3] | 774.91/774.88 |
| 4 | [A-4] | 831.01/831.00 |
| 5 | [A-5] | 943.22/943.19 |
| 6 | [A-6] | 990.79/990.77 |
| 7 | [A-7] | 822.95/822.92 |
| 8 | [A-8] | 870.99/870.96 |
| 9 | [A-9] | 899.04/899.02 |
| 10 | [A-10] | 899.04/899.02 |
| 11 | [A-11] | 838.90/838.89 |
| 12 | [A-12] | 886.79/886.77 |
| 13 | [A-13] | 1179.49/1179.47 |
| 14 | [A-14] | 902.99/902.97 |
| 15 | [A-15] | 750.80/750.77 |
| 16 | [A-16] | 750.80/750.78 |
| 17 | [A-17] | 782.80/782.79 |
| 18 | [A-18] | 748.83/748.81 |
| 19 | [A-19] | 778.86/778.85 |
| 20 | [A-20] | 906.62/906.59 |
| 21 | [A-21] | 906.62/906.59 |
| 22 | [A-22] | 804.93/804.90 |
| 23 | [A-23] | 832.90/832.89 |
| 24 | [A-24] | 832.90/832.88 |
| 25 | [A-25] | 878.93/878.91 |
| 26 | [A-26] | 1039.05/1039.03 |
| 27 | [A-27] | 1259.54/1259.52 |
| 28 | [A-28] | 1451.71/1451.68 |
| 29 | [A-29] | 1477.28/1477.25 |
| 30 | [A-30] | 1203.26/1203.25 |
| 31 | [A-31] | 1343.45/1343.42 |
| 32 | [A-32] | 1419.79/1419.78 |
| 33 | [A-33] | 806.82/806.79 |
| 34 | [A-34] | 806.82/806.80 |
| 35 | [A-35] | 834.87/834.85 |
| 36 | [A-36] | 862.92/862.90 |
| 37 | [A-37] | 804.85/804.84 |
| 38 | [A-38] | 808.79/808.78 |
| 39 | [A-39] | 898.79/898.77 |
| 40 | [A-40] | 768.82/768.79 |
| 41 | [A-41] | 754.78/754.75 |

TABLE 1-continued

| Example | Squarylium | Mass spectrometry (calculated value/measured value) |
|---|---|---|
| 42 | [A-42] | 754.78/754.76 |
| 43 | [A-43] | 790.76/790.74 |
| 44 | [A-44] | 856.58/856.56 |
| 45 | [A-45] | 856.58/856.57 |
| 46 | [A-46] | 876.59/876.57 |
| 47 | [A-47] | 876.59/876.56 |
| 48 | [A-48] | 1034.38/1034.36 |
| 49 | [A-49] | 878.93/878.90 |
| 50 | [A-50] | 1039.05/1039.03 |
| 51 | [A-51] | 790.76/790.74 |
| 52 | [A-52] | 856.58/856.57 |
| 53 | [A-53] | 876.59/876.57 |

TABLE 2

| Example | Squarylium | C | H | O | N | Cl | Br | F | S |
|---|---|---|---|---|---|---|---|---|---|
| 1 | [A-1] | 83.55/83.57 | 4.21/4.19 | 4.45/4.44 | 7.79/7.79 | — | — | — | — |
| 2 | [A-2] | 83.63/83.61 | 4.59/4.58 | 4.28/4.29 | 7.50/7.52 | — | — | — | — |
| 3 | [A-3] | 83.70/83.71 | 4.94/4.94 | 4.13/4.12 | 7.23/7.23 | — | — | — | — |
| 4 | [A-4] | 83.83/83.82 | 5.58/5.57 | 3.85/3.86 | 6.74/6.75 | — | — | — | — |
| 5 | [A-5] | 84.04/84.03 | 6.83/6.63 | 3.39/3.40 | 5.94/5.95 | — | — | — | — |
| 6 | [A-6] | 65.46/65.46 | 2.65/2.64 | 3.23/3.25 | 5.65/5.65 | — | — | 23.01/23.00 | — |
| 7 | [A-7] | 84.65/84.66 | 4.65/4.65 | 3.89/3.88 | 6.81/6.80 | — | — | — | — |
| 8 | [A-8] | 85.50/85.51 | 4.40/4.39 | 3.67/3.68 | 6.43/6.42 | — | — | — | — |
| 9 | [A-9] | 85.50/85.48 | 4.71/4.73 | 3.56/3.55 | 6.23/6.24 | — | — | — | — |
| 10 | [A-10] | 85.50/85.51 | 4.71/4.70 | 3.56/3.58 | 6.23/6.21 | — | — | — | — |
| 11 | [A-11] | 77.31/77.33 | 4.57/4.56 | 11.44/11.42 | 6.68/8.70 | — | — | — | — |
| 12 | [A-12] | 70.43/70.44 | 3.18/3.20 | 7.22/7.21 | 6.32/6.32 | — | — | 12.85/12.83 | — |
| 13 | [A-13] | 75.35/75.34 | 7.01/7.03 | 8.14/8.13 | 9.50/9.50 | — | — | — | — |
| 14 | [A-14] | 82.47/82.48 | 4.24/4.24 | 7.09/7.07 | 6.20/6.20 | — | — | — | — |
| 15 | [A-15] | 79.99/79.98 | 4.03/4.04 | 8.52/8.51 | 7.46/7.47 | — | — | — | — |
| 16 | [A-16] | 79.99/80.00 | 4.03/4.03 | 8.52/8.53 | 7.46/7.44 | — | — | — | — |
| 17 | [A-17] | 76.72/76.71 | 3.86/3.86 | 12.26/12.27 | 7.16/7.17 | — | — | — | — |
| 18 | [A-18] | 80.20/80.21 | 4.31/4.31 | 4.27/4.26 | 11.22/11.22 | — | — | — | — |
| 19 | [A-19] | 77.10/77.11 | 4.40/4.41 | 4.11/4.10 | 14.39/14.38 | — | — | — | — |
| 20 | [A-20] | 66.24/66.24 | 3.34/3.34 | 3.53/3.53 | 9.27/9.26 | — | 17.63/17.63 | — | — |
| 21 | [A-21] | 66.24/66.23 | 3.34/3.35 | 3.53/3.52 | 9.27/9.25 | — | 17.63/17.65 | — | — |
| 22 | [A-22] | 80.58/80.57 | 5.01/5.03 | 3.98/3.97 | 10.44/10.44 | — | — | — | — |
| 23 | [A-23] | 77.87/77.88 | 4.36/4.35 | 7.68/7.66 | 10.09/10.11 | — | — | — | — |
| 24 | [A-24] | 77.87/77.85 | 4.36/4.36 | 7.68/7.69 | 10.09/10.09 | — | — | — | — |
| 25 | [A-25] | 68.33/68.34 | 3.44/3.45 | 14.56/14.55 | 6.37/6.37 | — | — | — | 7.30/7.29 |
| 26 | [A-26] | 57.80/57.81 | 2.91/2.91 | 21.56/21.55 | 5.39/5.40 | — | — | — | 12.34/12.33 |
| 27 | [A-27] | 62.94/62.93 | 5.28/5.28 | 12.70/12.72 | 8.90/8.89 | — | — | — | 10.18/10.18 |
| 28 | [A-28] | 67.84/67.85 | 4.58/4.58 | 11.02/11.01 | 7.72/7.73 | — | — | — | 8.84/8.84 |
| 29 | [A-29] | 60.16/60.14 | 3.14/3.13 | 10.83/10.85 | 7.59/7.58 | — | — | — | 8.68/8.68 |
| 30 | [A-30] | 57.89/57.89 | 3.52/3.52 | 18.62/18.63 | 9.31/9.30 | — | — | — | 10.66/10.66 |
| 31 | [A-31] | 62.58/62.58 | 3.45/3.45 | 11.91/11.91 | 12.51/12.52 | — | — | — | 9.55/9.54 |
| 32 | [A-32] | 65.98/65.98 | 5.82/5.82 | 11.27/11.29 | 7.89/7.88 | — | — | — | 9.03/9.03 |
| 33 | [A-33] | 77.41/77.41 | 3.75/3.73 | 11.90/11.91 | 6.94/6.94 | — | — | — | — |
| 34 | [A-34] | 77.41/77.43 | 3.75/3.73 | 11.90/11.89 | 6.94/6.95 | — | — | — | — |
| 35 | [A-35] | 77.69/77.70 | 4.10/4.10 | 11.50/11.51 | 6.71/6.69 | — | — | — | — |
| 36 | [A-36] | 77.94/77.95 | 4.44/4.43 | 11.12/11.14 | 6.49/6.48 | — | — | — | — |
| 37 | [A-37] | 77.60/77.61 | 4.01/4.01 | 7.95/7.94 | 10.44/10.44 | — | — | — | — |
| 38 | [A-38] | 74.25/74.24 | 3.49/3.49 | 11.87/11.88 | 10.39/10.39 | — | — | — | — |
| 39 | [A-39] | 66.82/66.81 | 2.92/2.92 | 17.80/17.81 | 12.47/12.46 | — | — | — | — |
| 40 | [A-40] | 81.24/81.26 | 3.67/3.65 | 4.16/4.17 | 10.93/10.92 | — | — | — | — |
| 41 | [A-41] | 79.56/79.54 | 3.74/3.74 | 4.24/4.24 | 7.42/7.44 | — | — | 5.03/5.04 | — |
| 42 | [A-42] | 79.56/79.57 | 3.74/3.74 | 4.24/4.24 | 7.42/7.43 | — | — | 5.03/5.03 | — |
| 43 | [A-43] | 75.94/75.93 | 3.31/3.31 | 4.05/4.06 | 7.09/7.08 | — | — | 9.61/9.62 | — |
| 44 | [A-44] | 70.11/70.12 | 3.06/3.06 | 3.74/3.73 | 6.54/6.55 | 16.56/16.54 | — | — | — |
| 45 | [A-45] | 70.11/70.09 | 3.06/3.07 | 3.74/3.75 | 6.54/6.53 | 16.56/16.56 | — | — | — |
| 46 | [A-46] | 68.51/68.52 | 3.22/3.22 | 3.65/3.65 | 6.39/6.39 | — | 18.23/18.23 | — | — |
| 47 | [A-47] | 68.51/68.49 | 3.22/3.24 | 3.65/3.63 | 6.39/6.31 | — | 18.23/18.24 | — | — |
| 48 | [A-48] | 58.06/58.06 | 2.53/2.52 | 3.09/3.10 | 5.42/5.41 | — | 30.90/30.91 | — | — |
| 49 | [A-49] | 68.33/68.34 | 3.44/3.43 | 14.56/14.58 | 6.37/6.36 | — | — | — | 7.30/7.29 |
| 50 | [A-50] | 57.80/57.78 | 2.91/2.90 | 21.56/21.68 | 5.39/5.38 | — | — | — | 12.34/12.36 |
| 51 | [A-51] | 75.94/75.93 | 3.31/3.30 | 4.05/4.07 | 7.09/7.09 | — | — | 9.61/9.61 | — |
| 52 | [A-52] | 70.11/70.11 | 3.06/3.06 | 3.74/3.74 | 6.54/6.54 | 16.58/16.55 | — | — | — |
| 53 | [A-53] | 68.51/68.53 | 3.22/3.20 | 3.65/3.63 | 6.39/6.40 | — | 18.23/18.24 | — | — |

Comparative Example 1

(Production of Squarylium Dye [D-1])

The following squarylium dye [D-1] was synthesized according to Japanese Patent Laid-Open No. 2009-91517.

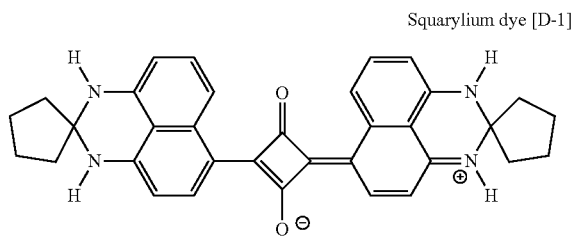 [SMILES: O=C1C(c2ccc3c4c(cccc24)NC2(CCCC2)N3)=C([O-])/C1=c1\ccc2c3c(cccc13)NC1(CCCC1)[NH+]=2]

Squarylium dye [D-1]

Comparative Example 2

(Production of Squarylium Dye [D-2])

The following squarylium dye [D-2] was synthesized according to Japanese Patent Laid-Open No. 2010-106153.

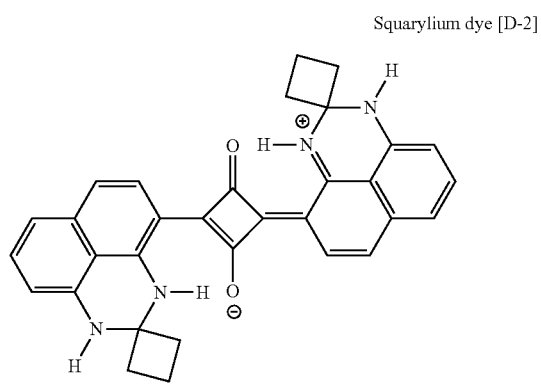 [SMILES: O=C1C(c2ccc3cccc4c3c2NC2(CCC2)N4)=C([O-])/C1=c1\ccc2cccc3c2c1=[NH+]C1(CCC1)N3]

Squarylium dye [D-2]

Comparative Example 3

(Production of Squarylium Dye [D-3])

The following squarylium dye [D-3] was synthesized according to Japanese Patent Laid-Open No. 2009-209297.

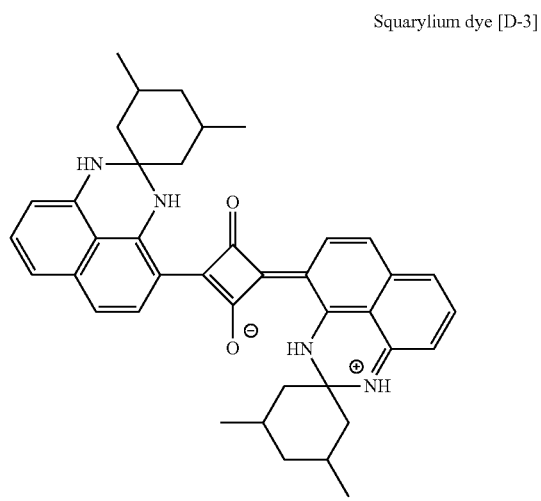 [SMILES: CC1CC(C)CC2(C1)Nc1cccc3ccc(C4=C([O-])/C(=c5/ccc6cccc7c6c5NC5(CC(C)CC(C)C5)[NH+]=7)C4=O)c(c13)N2]

Squarylium dye [D-3]

<Production and Evaluation of Image Forming Materials>

Toners and inkjet inks as image forming materials were produced as follows.

<<Production of Toner>>

Example 54

(Production of Toner T1)

An aggregation toner T1 was obtained according to the following method using the squarylium dye [A-1] produced in Example 1.

(1) Preparation of Dispersion Solution 70 parts of deionized water and 3 parts of sodium dodecylbenzenesulfonate (NEOPELEX G-15, commercially available from Kao Corporation) were added to 20 parts of the squarylium dye [A-1], and the mixture was dispersed in an Eiger Mill for 4 hours, and thereby a dye dispersion solution was obtained.

(2) Preparation of Polymer Emulsion 320 parts of an ester wax emulsion as a solid content (SELOSOL R-586, commercially available from Chukyo Yushi Co., Ltd.) and 14,000 parts of deionized water were put into a reactor, the temperature was raised to 90° C., and 3 parts of sodium dodecylbenzenesulfonate, 2,500 parts of styrene, 650 parts of n-butyl acrylate, 170 parts of methacrylic acid, 330 parts of a 8% hydrogen peroxide aqueous solution, and 330 parts of a 8% ascorbic acid aqueous solution were added thereto. The reaction continued at 90° C. for 7 hours and thereby a polymer emulsion was obtained.

(3) Production of Toner 9.5 parts of the dispersion solution was poured into 150 parts of the polymer emulsion, and mixed and stirred. 40 parts of a 0.5% aluminum sulfate solution was poured thereinto while stirring. The temperature was raised to 60° C., and stirring continued for 2 hours, filtering, washing, and drying were performed, and thereby a toner T1 of the present specification was obtained.

Examples 55 to 106, and Comparative Examples 4 to 6

(Production of Toners T2 to T56)

Aggregation toners T2 to T56 were obtained in the same manner as in the toner T1 except that squarylium dyes described in Table 3 were used in place of the squarylium dye [A-1].

<<Evaluation of Toners>>

The following evaluations were performed on the obtained toners T1 to T56. The results are shown in Table 3.

(Dispersibility)

The obtained toners T1 to T56 were formed into slices with a thickness of 0.9 µm using a microtome, and the dispersion state of the squarylium dyes was observed under a transmission electron microscope. The evaluation criteria are as follows.

⊚: There were no pigment aggregates, and the squarylium dye was very uniformly dispersed O: There were substantially no pigment aggregates, and the squarylium dye was uniformly dispersed Δ: There were pigment aggregates, and the squarylium dye was not uniformly dispersed x: There were many pigment aggregates, and the squarylium dye was not uniformly dispersed (Invisibility and Near-Infrared Absorption Capability)

0.3 parts of hydrophobic silica was externally added to 50 parts of each of the obtained toners T1 to T56, a solid image was printed on a high quality sheet using an electrophotographic printer, and evaluation was performed according to the following method.

The image obtained by printing a solid image on the high quality sheet was measured using a reflection spectral densitometer (commercially available from X-Rite Inc, x-rite939), and ΔE in Formula (I) and R in Formula (II) in the above described <The method of evaluating image forming material> section were determined. The evaluation criteria are as follows.

<Invisibility>

◎: ΔE less than 10

O: ΔE 10 or more less than 15 x: ΔE 15 or more

<Near-Infrared Absorption Capability>

◎: (100−R) 80 or more

O: (100−R) 75 or more and less than 80 x: (100−R) less than 75

(Light Resistance (1))

A test piece obtained in the same manner as in the production when the invisibility and near-infrared absorption capability were evaluated was put into a light resistance tester ("SUNTEST CPS+" commercially available from TOYOSEIKI), and left for 24 hours. In this case, the test was performed at a radiation illuminance of 47 mW/cm², and a light in a broad band of 300 to 800 nm. The images before and after the light resistance test were measured using a reflection spectral densitometer (commercially available from X-Rite Inc, x-rite939), and R in Formula (II) was determined. The residual rate with respect to that before light irradiation was determined, and the light resistance was evaluated based on the following criteria. Here, the residual rate was calculated using the following formula.

Residual rate=<(100−R) after irradiation>÷<(100−R) before irradiation>×100

◎: The residual rate was 95% or more

O: The residual rate was 92.5% or more and less than 95%

Δ: The residual rate was 90% or more and less than 92.5% x: The residual rate was less than 90%

(Light Resistance (2))

A test piece obtained in the same manner as in the production when the invisibility and near-infrared absorption capability were evaluated was put into a light resistance tester ("SUNTEST CPS+" commercially available from TOYOSEIKI), and left for 48 hours. In this case, the test was performed at a radiation illuminance of 47 mW/cm², and a light in a broad band of 300 to 800 nm. The images before and after the light resistance test were measured using a reflection spectral densitometer (commercially available from X-Rite Inc, x-rite939), and R in Formula (II) was determined. The residual rate with respect to that before light irradiation was determined, and the light resistance was evaluated based on the following criteria. Here, the residual rate was calculated using the following formula.

Residual rate=<(100−R) after irradiation>÷<(100−R) before irradiation>×100

◎: The residual rate was 95% or more

O: The residual rate was 92.5% or more and less than 95%

Δ: The residual rate was 90% or more and less than 92.5% x: The residual rate was less than 90%

TABLE 3

| | Toner | Squarylium dye | Dispersibility | Invisibility | Near-infrared absorption capability | Light resistance (1) | Light resistance (2) |
|---|---|---|---|---|---|---|---|
| Example 54 | T1 | A-1 | ◎ | ◎ | ◎ | ◎ | ◎ |
| Example 55 | T2 | A-2 | O | ◎ | ◎ | ◎ | ◎ |
| Example 56 | T3 | A-3 | O | ◎ | ◎ | ◎ | ◎ |
| Example 57 | T4 | A-4 | O | ◎ | ◎ | ◎ | ◎ |
| Example 58 | T5 | A-5 | O | ◎ | ◎ | ◎ | ◎ |
| Example 59 | T6 | A-6 | O | ◎ | ◎ | ◎ | ◎ |
| Example 60 | T7 | A-7 | O | ◎ | ◎ | ◎ | ◎ |
| Example 61 | T8 | A-8 | O | ◎ | ◎ | ◎ | ◎ |
| Example 62 | T9 | A-9 | O | ◎ | ◎ | ◎ | ◎ |
| Example 63 | T10 | A-10 | O | ◎ | ◎ | ◎ | ◎ |
| Example 64 | T11 | A-11 | O | ◎ | ◎ | ◎ | ◎ |
| Example 65 | T12 | A-12 | O | ◎ | ◎ | ◎ | ◎ |
| Example 66 | T13 | A-13 | O | ◎ | ◎ | ◎ | ◎ |
| Example 67 | T14 | A-14 | O | ◎ | ◎ | ◎ | ◎ |
| Example 68 | T15 | A-15 | O | ◎ | ◎ | ◎ | ◎ |
| Example 69 | T16 | A-16 | O | ◎ | ◎ | ◎ | ◎ |
| Example 70 | T17 | A-17 | O | ◎ | ◎ | ◎ | ◎ |
| Example 71 | T18 | A-18 | O | ◎ | ◎ | ◎ | ◎ |
| Example 72 | T19 | A-19 | O | ◎ | ◎ | ◎ | ◎ |
| Example 73 | T20 | A-20 | O | ◎ | ◎ | ◎ | ◎ |
| Example 74 | T21 | A-21 | O | ◎ | ◎ | ◎ | ◎ |
| Example 75 | T22 | A-22 | O | ◎ | ◎ | ◎ | ◎ |
| Example 76 | T23 | A-23 | O | ◎ | ◎ | ◎ | ◎ |
| Example 77 | T24 | A-24 | O | ◎ | ◎ | ◎ | ◎ |
| Example 78 | T25 | A-25 | O | ◎ | ◎ | ◎ | ◎ |
| Example 79 | T26 | A-26 | O | ◎ | ◎ | ◎ | ◎ |
| Example 80 | T27 | A-27 | O | ◎ | ◎ | ◎ | ◎ |
| Example 81 | T28 | A-28 | O | ◎ | ◎ | ◎ | ◎ |
| Example 82 | T29 | A-29 | O | ◎ | ◎ | ◎ | ◎ |
| Example 83 | T30 | A-30 | O | ◎ | ◎ | ◎ | ◎ |
| Example 84 | T31 | A-31 | O | ◎ | ◎ | ◎ | ◎ |
| Example 85 | T32 | A-32 | O | ◎ | ◎ | ◎ | ◎ |
| Example 86 | T33 | A-33 | O | ◎ | ◎ | ◎ | ◎ |
| Example 87 | T34 | A-34 | O | ◎ | ◎ | ◎ | ◎ |
| Example 88 | T35 | A-35 | O | ◎ | ◎ | ◎ | ◎ |
| Example 89 | T36 | A-36 | O | ◎ | ◎ | ◎ | ◎ |
| Example 90 | T37 | A-37 | O | ◎ | ◎ | ◎ | ◎ |
| Example 91 | T38 | A-38 | O | ◎ | ◎ | ◎ | ◎ |
| Example 92 | T39 | A-39 | O | ◎ | ◎ | ◎ | ◎ |
| Example 93 | T40 | A-40 | O | ◎ | ◎ | ◎ | ◎ |
| Example 94 | T41 | A-41 | O | ◎ | ◎ | ◎ | ◎ |
| Example 95 | T42 | A-42 | O | ◎ | ◎ | ◎ | ◎ |
| Example 96 | T43 | A-43 | O | ◎ | ◎ | ◎ | ◎ |
| Example 97 | T44 | A-44 | O | ◎ | ◎ | ◎ | ◎ |
| Example 98 | T45 | A-45 | O | ◎ | ◎ | ◎ | ◎ |
| Example 99 | T46 | A-46 | O | ◎ | ◎ | ◎ | ◎ |
| Example 100 | T47 | A-47 | O | ◎ | ◎ | ◎ | ◎ |
| Example 101 | T48 | A-48 | O | ◎ | ◎ | ◎ | ◎ |
| Example 102 | T49 | A-49 | ◎ | ◎ | ◎ | ◎ | ◎ |
| Example 103 | T50 | A-50 | O | ◎ | ◎ | O | O |
| Example 104 | T51 | A-51 | O | ◎ | ◎ | O | O |
| Example 105 | T52 | A-52 | O | ◎ | ◎ | O | O |
| Example 106 | T53 | A-53 | ◎ | ◎ | ◎ | ◎ | ◎ |
| Comparative Example 4 | T54 | D-1 | Δ | O | ◎ | X | X |
| Comparative Example 5 | T55 | D-2 | Δ | ◎ | O | X | X |
| Comparative Example 6 | T56 | D-3 | X | ◎ | ◎ | ◎ | O |

The toners containing the squarylium dye [A] of the present specification were shown to have very high dispersibility, invisibility, near-infrared absorption capability, and light resistance. In particular, toners containing [A-1] in which $X_1$ to $X_8$ in the squarylium dye [A] were a hydrogen atom and $R_1$ to $R_5$ were a hydrogen atom, and [A-49] and [A-53] in which $X_1$ to $X_8$ were a hydrogen atom and one of $R_1$ to $R_5$ was substituted with a sulfo group or a halogen group had good results.

On the other hand, the toners containing the squarylium dyes [D-1] and [D-2] had particularly poor light resistance. In addition, the toner containing the squarylium dye [D-3]

had good invisibility, near-infrared absorption capability, and light resistance, but it was not suitable for practical use because it had very poor dispersibility.

<<Production of Inkjet Ink>>

When an IJ ink was produced, a dispersant and a fixing resin were produced.

(Preparation of Solution Containing Dispersant [C-15])

93.4 parts of triethylene glycol monomethyl ether was put into a reaction container including a gas inlet tube, a thermometer, a condenser, and a stirrer, and purging with nitrogen gas was performed. The inside of the reaction container was heated at 110° C., and a mixture containing 35.0 parts of lauryl methacrylate, 35.0 parts of styrene, 30.0 parts of acrylic acid, and 6.0 parts of V-601 (commercially available from Wako Pure Chemical Industries, Ltd.) was added dropwise for 2 hours, and a polymerization reaction was caused. After the dropwise addition was completed, the reaction was additionally caused at 110° C. for 3 hours. Then, 0.6 parts of V-601 (commercially available from Wako Pure Chemical Industries, Ltd.) was added thereto, and additionally, the reaction continued at 110° C. for 1 hour, and a solution containing a dispersant [C-15] was obtained. The weight average molecular weight (Mw) of the dispersant [C-15] was about 16,000. In addition, cooling was performed to room temperature, and 37.1 parts of dimethylaminoethanol was then added thereto for neutralization. This was an amount at which 100% of acrylic acid was neutralized. In addition, 200 parts of deionized water was added thereto so that the mixture was aqueous. 1 g of the result was sampled and heated and dried at 180° C. for 20 minutes, a non-volatile content was measured, and deionized water was added so that the non-volatile content of the previous aqueous resin solution was 20%. Thereby, an aqueous solution containing the dispersant [C-15] with a non-volatile content of 20% was obtained.

(Preparation of solution containing fixing resin [B-5]) 40 parts of deionized water and 0.2 parts of Aqualon KH-10 (commercially available from DKS Co., Ltd.) as a surfactant were put into a reaction container including a stirrer, a thermometer, an addition funnel, and a reflux device, and separately, 1% of a pre-emulsion obtained by mixing 40 parts of 2-ethylhexyl acrylate, 50 parts of methyl methacrylate, 7 parts of styrene, 2 parts of dimethylacrylamide, 1 part of methacrylic acid, 53 parts of deionized water and 1.8 parts of Aqualon KH-10 (commercially available from DKS Co., Ltd.) as a surfactant in advance was additionally added thereto. The internal temperature was raised to 60° C., and purging with nitrogen gas was sufficiently performed, and then 10 parts of a 5% aqueous solution containing potassium persulfate and 20 parts of a 1% aqueous solution containing anhydrous sodium bisulfite were added at 10% to initiate polymerization. After the inside of the reaction system was maintained at 60° C. for 5 minutes, while maintaining the internal temperature at 60° C., the remaining pre-emulsion, a 5% aqueous solution containing potassium persulfate, and the remaining 1% aqueous solution containing anhydrous sodium bisulfite were added dropwise for 1.5 hours, and additionally, stirring continued for 2 hours. It was confirmed that the conversion rate exceeded 98% in measurement of the solid content and the temperature was then lowered to 30° C. Diethylaminoethanol was added, the pH was set to 8.5, and additionally, the solid content was adjusted to 40% using deionized water, and thereby a resin fine particle aqueous dispersing element was obtained. Here, the solid content was determined from the residue baked at 150° C. for 20 minutes. The obtained resin fine particle aqueous dispersing element was used as a solution containing a fixing resin [B-5].

Example 107

(Production of inkjet ink J1)

An inkjet ink J1 was obtained using the squarylium dye [A-1] produced in Example 1 according to the following method.

(1) Preparation of Dispersion Solution 200 parts of deionized water, and 2 parts of a special aromatic sulfonic acid formalin condensate sodium salt (Demol SN-B, commercially available from Kao Corporation) were added to 20 parts of the squarylium dye [A-1], and the mixture was dispersed in an Eiger Mill for 3 hours, and thereby a dye dispersion solution was obtained.

(2) Production of ink 10 parts of glycerin, 10 parts of triethylene glycol, 10 parts of triethylene glycol monobutyl ether, 0.2 parts of triethanolamine, and 1 part of an acetylene glycol surfactant (Olefin E1010, commercially available from Nissin Chemical Co., Ltd.) were mixed into 40.3 parts of the dispersion solution, and the mixture was stirred at 35° C. for 1 hour. Here, the residue was prepared such that ultrapure water (specific resistance value of 18 MΩ·cm or more) was added and the total amount was 100 parts. Then, filtering was performed using a 1.0 μm filter, and thereby an inkjet ink J1 of the present specification was obtained.

Examples 108 to 159, and Comparative Examples 7 to 9

(Production of inkjet inks J2 to J56)

Inkjet inks J2 to J56 were obtained in the same manner as in the inkjet ink J1 except that squarylium dyes described in Table 4 were used in place of the squarylium dye [A-1].

Example 160

(Production of inkjet ink J57)

20 parts of the squarylium dye [A-1] produced in Example 1, 42.9 parts of the solution containing the dispersant [C-15], and 37.1 parts of deionized water were dispersed previously in a disper, and this dispersion was then performed for 2 hours using a dyno mill with a volume of 0.6 L into which 1,800 parts of zirconia beads with a diameter of 0.5 mm were filled, and thereby a dispersing element was obtained.

In addition, 20 parts of the dispersing element obtained above, 40 parts of triethylene glycol monomethyl ether, 27.5 parts of deionized water, and 12.5 parts of a solution containing a fixing resin [B-5] were mixed to obtain an inkjet ink J57.

Examples 161 to 164, and Comparative Examples 10 to 12

(Production of Inkjet Inks J58 to J64)

Inkjet inks J58 to J64 were obtained in the same manner as in the inkjet ink J57 except that squarylium dyes described in Table 5 were used in place of the squarylium dye [A-1].

<<Evaluation of Inkjet Inks>>

The following evaluations were performed on the obtained inkjet inks J1 to J64. The results are shown in Table 4 and Table 5.

(Storage stability)

The obtained inkjet inks J1 to J64 were stored in a thermostat at 70° C. for 1 week, and aging was accelerated, and the change in the viscosity of the ink before and after aging was then measured. The viscosity of the ink was measured using an E-type viscometer ("ELD type viscometer" commercially available from Toki Sangyo Co., Ltd.) under conditions of 25° C. and a rotational speed of 50 rpm.

⊚: The rate of change was less than ±3%
O: The rate of change was ±3% or more and less than ±5%
Δ: The rate of change was ±5% or more and less than ±15%
x: The rate of change was ±15% or more (Invisibility and Near-Infrared Absorption Capability)

The obtained inkjet inks J1 to J64 were packed in a ink cartridge for a black ink for an inkjet printer PM-A700 (product name, commercially available from EPSON), and a solid image was printed on photo glossy paper (PM Photo Paper <Glossy> (KA420PSK, EPSON) (product name) commercially available from EPSON) with color setting of "Black" and evaluated according to the following method.

An image obtained by printing the solid image on photo glossy paper was measured using a reflection spectral densitometer (commercially available from X-Rite Inc, x-rite939), and ΔE in Formula (I) and R in Formula (II) were determined. Here, the evaluation criteria are as follows.

<Invisibility>
⊚: ΔE less than 10
O: ΔE 10 or more and less than 15
x: ΔE 15 or more <Near-Infrared Absorption Capability>
⊚: (100−R) 80 or more
O: (100−R) 75 or more and less than 80
x: (100−R) less than 75

(Light Resistance (1))

A test piece obtained in the same manner as in the production when the invisibility and near-infrared absorption capability were evaluated was put into a light resistance tester ("SUNTEST CPS+" commercially available from TOYOSEIKI), and left for 24 hours. In this case, the test was performed at a radiation illuminance of 47 mW/cm², and a light in a broad band of 300 to 800 nm. The images before and after the light resistance test were measured using a reflection spectral densitometer (commercially available from X-Rite Inc, x-rite939), and R in Formula (II) was determined. The residual rate with respect to that before light irradiation was determined, and the light resistance was evaluated based on the following criteria. Here, the residual rate was calculated using the following formula.

Residual rate=<(100−R) after irradiation>÷<(100−R) before irradiation>×100

⊚: The residual rate was 95% or more
O: The residual rate was 92.5% or more and less than 95%
Δ: The residual rate was 90% or more and less than 92.5%
x: The residual rate was less than 90%

(Light Resistance (2))

A test piece obtained in the same manner as in the production when the invisibility and near-infrared absorption capability were evaluated was put into a light resistance tester ("SUNTEST CPS+" commercially available from TOYOSEIKI), and left for 48 hours. In this case, the test was performed at a radiation illuminance of 47 mW/cm², and a light in a broad band of 300 to 800 nm. The images before and after the light resistance test were measured using a reflection spectral densitometer (commercially available from X-Rite Inc, x-rite939), and R in Formula (II) was determined. The residual rate with respect to that before light irradiation was determined, and the light resistance was evaluated based on the following criteria. Here, the residual rate was calculated using the following formula.

Residual rate=<(100−R) after irradiation>÷<(100−R) before irradiation>×100

⊚: The residual rate was 95% or more
O: The residual rate was 92.5% or more and less than 95%
Δ: The residual rate was 90% or more and less than 92.5%
x: The residual rate was less than 90%

TABLE 4

| | Inkjet ink | Squarylium dye | Storage stability | Invisibility | Near-infrared absorption capability | Light resistance (1) | Light resistance (2) |
|---|---|---|---|---|---|---|---|
| Example 107 | J1 | A-1 | ⊚ | ⊚ | ⊚ | ⊚ | ⊚ |
| Example 108 | J2 | A-2 | O | ⊚ | ⊚ | ⊚ | ⊚ |
| Example 109 | J3 | A-3 | O | ⊚ | ⊚ | ⊚ | ⊚ |
| Example 110 | J4 | A-4 | O | ⊚ | ⊚ | ⊚ | ⊚ |
| Example 111 | J5 | A-5 | O | ⊚ | ⊚ | ⊚ | ⊚ |
| Example 112 | J6 | A-6 | O | ⊚ | ⊚ | ⊚ | ⊚ |
| Example 113 | J7 | A-7 | O | ⊚ | ⊚ | ⊚ | ⊚ |
| Example 114 | J8 | A-8 | O | ⊚ | ⊚ | ⊚ | ⊚ |
| Example 115 | J9 | A-9 | O | ⊚ | ⊚ | ⊚ | ⊚ |
| Example 116 | J10 | A-10 | O | ⊚ | ⊚ | ⊚ | ⊚ |
| Example 117 | J11 | A-11 | O | ⊚ | ⊚ | ⊚ | ⊚ |
| Example 118 | J12 | A-12 | O | ⊚ | ⊚ | ⊚ | ⊚ |
| Example 119 | J13 | A-13 | O | ⊚ | ⊚ | ⊚ | ⊚ |
| Example 120 | J14 | A-14 | O | ⊚ | ⊚ | ⊚ | ⊚ |
| Example 121 | J15 | A-15 | O | ⊚ | ⊚ | ⊚ | ⊚ |
| Example 122 | J16 | A-16 | O | ⊚ | ⊚ | ⊚ | ⊚ |
| Example 123 | J17 | A-17 | O | ⊚ | ⊚ | ⊚ | ⊚ |
| Example 124 | J18 | A-18 | O | ⊚ | ⊚ | ⊚ | ⊚ |
| Example 125 | J19 | A-19 | O | ⊚ | ⊚ | ⊚ | ⊚ |
| Example 126 | J20 | A-20 | O | ⊚ | ⊚ | ⊚ | ⊚ |
| Example 127 | J21 | A-21 | O | ⊚ | ⊚ | ⊚ | ⊚ |
| Example 128 | J22 | A-22 | O | ⊚ | ⊚ | ⊚ | ⊚ |
| Example 129 | J23 | A-23 | O | ⊚ | ⊚ | ⊚ | ⊚ |
| Example 130 | J24 | A-24 | O | ⊚ | ⊚ | ⊚ | ⊚ |
| Example 131 | J25 | A-25 | O | ⊚ | ⊚ | ⊚ | ⊚ |
| Example 132 | J26 | A-26 | O | ⊚ | ⊚ | ⊚ | ⊚ |
| Example 133 | J27 | A-27 | O | ⊚ | ⊚ | ⊚ | ⊚ |
| Example 134 | J28 | A-28 | O | ⊚ | ⊚ | ⊚ | ⊚ |
| Example 135 | J29 | A-29 | O | ⊚ | ⊚ | ⊚ | ⊚ |
| Example 136 | J30 | A-30 | O | ⊚ | ⊚ | ⊚ | ⊚ |
| Example 137 | J31 | A-31 | O | ⊚ | ⊚ | ⊚ | ⊚ |
| Example 138 | J32 | A-32 | O | ⊚ | ⊚ | ⊚ | ⊚ |
| Example 139 | J33 | A-33 | O | ⊚ | ⊚ | ⊚ | ⊚ |
| Example 140 | J34 | A-34 | O | ⊚ | ⊚ | ⊚ | ⊚ |
| Example 141 | J35 | A-35 | O | ⊚ | ⊚ | ⊚ | ⊚ |
| Example 142 | J36 | A-36 | O | ⊚ | ⊚ | ⊚ | ⊚ |
| Example 143 | J37 | A-37 | O | ⊚ | ⊚ | ⊚ | ⊚ |
| Example 144 | J38 | A-38 | O | ⊚ | ⊚ | ⊚ | ⊚ |
| Example 145 | J39 | A-39 | O | ⊚ | ⊚ | ⊚ | ⊚ |
| Example 146 | J40 | A-40 | O | ⊚ | ⊚ | ⊚ | ⊚ |
| Example 147 | J41 | A-41 | O | ⊚ | ⊚ | ⊚ | ⊚ |
| Example 148 | J42 | A-42 | O | ⊚ | ⊚ | ⊚ | ⊚ |
| Example 149 | J43 | A-43 | O | ⊚ | ⊚ | ⊚ | ⊚ |
| Example 150 | J44 | A-44 | O | ⊚ | ⊚ | ⊚ | ⊚ |
| Example 151 | J45 | A-45 | O | ⊚ | ⊚ | ⊚ | ⊚ |
| Example 152 | J46 | A-46 | O | ⊚ | ⊚ | ⊚ | ⊚ |
| Example 153 | J47 | A-47 | O | ⊚ | ⊚ | ⊚ | ⊚ |
| Example 154 | J48 | A-48 | O | ⊚ | ⊚ | ⊚ | ⊚ |
| Example 155 | J49 | A-49 | ⊚ | ⊚ | ⊚ | ⊚ | ⊚ |
| Example 156 | J50 | A-50 | O | ⊚ | ⊚ | O | O |
| Example 157 | J51 | A-51 | O | ⊚ | ⊚ | O | O |
| Example 158 | J52 | A-52 | O | ⊚ | ⊚ | O | O |
| Example 159 | J53 | A-53 | ⊚ | ⊚ | ⊚ | O | O |
| Comparative Example 7 | J54 | D-1 | Δ | O | ⊚ | X | X |
| Comparative Example 8 | J55 | D-2 | Δ | ⊚ | O | X | X |
| Comparative Example 9 | J56 | D-3 | X | ⊚ | ⊚ | ⊚ | O |

TABLE 5

| | Ink-jet ink | Squary-lium dye | Storage stability | Invis-ibility | Near-infrared absorption capability | Light resis-tance (1) | Light resis-tance (2) |
|---|---|---|---|---|---|---|---|
| Example 160 | J57 | A-1 | ◎ | ◎ | ◎ | ◎ | ◎ |
| Example 161 | J58 | A-38 | O | ◎ | ◎ | ◎ | ◎ |
| Example 162 | J59 | A-46 | O | ◎ | ◎ | ◎ | ◎ |
| Example 163 | J60 | A-49 | ◎ | ◎ | ◎ | ◎ | ◎ |
| Example 164 | J61 | A-53 | ◎ | ◎ | ◎ | ◎ | ◎ |
| Comparative Example 10 | J62 | D-1 | Δ | O | ◎ | X | X |
| Comparative Example 11 | J63 | D-2 | Δ | ◎ | O | X | X |
| Comparative Example 12 | J64 | D-3 | X | ◎ | ◎ | ◎ | O |

The inkjet inks containing the squarylium dye [A] of the present specification were shown to have very high invisibility, near-infrared absorption capability, light resistance, and storage stability. In particular, inkjet inks containing [A-1] in which $X_1$ to $X_8$ in the squarylium dye [A] were a hydrogen atom and $R_1$ to $R_5$ were a hydrogen atom, and [A-49] and [A-53] in which $X_1$ to $X_8$ were a hydrogen atom and one of $R_1$ to $R_5$ was substituted with a sulfo group or a halogen group had good results.

On the other hand, the inkjet inks containing the squarylium dyes [D-1] and [D-2] had particularly poor light resistance. In addition, the inkjet ink containing the squarylium dye [D-3] had good invisibility, near-infrared absorption capability, and light resistance, but it was not able to be stably used as an inkjet ink because it had very poor storage stability.

The image forming material produced in this manner had low absorption in a visible range (400 nm to 750 nm) and had an excellent near-infrared absorption capability and thus can be said to have very excellent spectral characteristics. In addition, light resistance was also excellent and aggregation was unlikely to occur and thus dispersibility as the toner and storage stability as the inkjet ink were also excellent. Therefore, it can be said that it had excellent performance as image forming materials for recording invisible information.

<Method of Producing Solution Containing Resin [B] (Binder Resin)>
(Preparation of Solution Containing Binder Resin [B-1]): Random Copolymer 70.0 parts of cyclohexanone was put into a reaction container including a thermometer, a cooling pipe, a nitrogen gas inlet tube, and a stirring device attached to a separable 4-neck flask, the temperature was raised to 80° C., the inside of the reaction container was purged with nitrogen gas, and a mixture containing 12.4 parts of n-butyl methacrylate, 4.6 parts of 2-hydroxyethyl methacrylate, 4.3 parts of methacrylic acid, 7.3 parts of paracumylphenol ethylene oxide modified acrylate ("ARONIXM110" commercially available from Toagosei Co., Ltd.) (n-butyl methacrylate/2-hydroxyethyl methacrylate/methacrylic acid/paracumylphenol ethylene oxide modified acrylate at a weight ratio of 10.5/15.5/17.1/25.0), and 0.7 parts of 2,2'-azobisisobutyronitrile was then added dropwise through a dripping pipe for 2 hours. After the dropwise addition was completed, additionally, the reaction continued for 3 hours, and a solution containing an acrylic resin having an acid value of 110 mg KOH/g and a weight average molecular weight (Mw) of 10,000 was obtained. The temperature was lowered to room temperature, about 2 g of the resin solution was then sampled and heated and dried at 180° C. for 20 minutes, the non-volatile content was measured, propylene glycol monoethyl ether acetate was added to the resin solution synthesized previously so that the non-volatile content was 20 mass %, and thereby a solution containing a binder resin [B-1] was prepared.

<Method of Producing Dispersant [C]>
(Preparation of Solution Containing Dispersant [C-1]): Graft Copolymer Containing Tertiary Amino Group 150 parts of PGMAc and 100 parts of n-butyl tacrylate were put into a reaction container including a gas inlet tube, a thermometer, a condenser, and a stirrer, and purging with nitrogen gas was performed. The inside of the reaction container was heated at 80° C. and a solution in which 0.5 parts of 2,2'-azobisisobutyronitrile was dissolved in 4 parts of 2-mercaptoethanol was added and the reaction was caused for 10 hours. It was confirmed that 95% was reacted in measurement of the solid content, and a reaction product (dispersant 1a) having a number average molecular weight of 3,900 and a weight average molecular weight of 7,900 was obtained.

7.9 parts of 2-methacryloyloxyethyl isocyanate, 0.05 parts of methyldibutyltin dilaurate, and 0.05 parts of methylhydroquinone were additionally added to the reaction product, and the reaction container was heated at 100° C., and the reaction was caused for 4 hours. Then, the temperature was lowered to 40° C., and a reaction product (a solution containing a resin dispersant 1b) was obtained.

122 parts of PGMAc was put into a reaction tank including a gas inlet tube, a condenser, a stirring blade, and a thermometer, and the temperature was raised to 100° C. while purging with nitrogen gas. The reaction product, 150 parts of pentamethylpiperidyl methacrylate (commercially available from ADEKA Corporation, ADK STAB LA-82), 10 parts of hydroxyethyl methacrylate and 4 parts of 2,2'-azobis(2,4-dimethylbutyronitrile) were put into a dripping tank, and the mixture was stirred until it became uniform, and then added dropwise into the reaction tank for 2 hours, and then the reaction continued at the same temperature for 3 hours. In this manner, a solution containing a dispersant [C-1] including a tertiary amino group having an amine value per solid content of 42 mg KOH/g, a weight average molecular weight (Mw) of 23,500, and a poly(meth)acrylate framework having a non-volatile content of 40 mass % was obtained.

(Preparation of Solution Containing Dispersant [C-2]): Block Copolymer Containing Tertiary Amino Group 60 parts of methyl methacrylate, 20 parts of n-butyl methacrylate, and 13.2 parts of tetramethylethylenediamine were put into a reaction device including a gas inlet tube, a condenser, a stirring blade, and a thermometer, and the mixture was stirred at 50° C. for 1 hour while flowing nitrogen gas, and the inside of the system was purged with nitrogen gas. Next, 9.3 parts of ethyl bromoisobutyrate, 5.6 parts of cuprous chloride, and 133 parts of PGMAc were put thereinto, the temperature was raised to 110° C. under a nitrogen stream, and polymerization of a first block initiated. After polymerization for 4 hours, a polymerization solution was sampled, the solid content was measured, and it was confirmed that the polymerization conversion rate was 98% or more in terms of the non-volatile content.

Next, 61 parts of PGMAc, and 20 parts of dimethylaminoethyl methacrylate (hereinafter referred to as DM) as a second block monomer were put into the reaction device, and stirred while being maintained at 110° C. under a nitrogen atmosphere, and the reaction continued. 2 hours after dimethylaminoethyl methacrylate was added, the polymerization solution was sampled, the solid content was measured, and it was confirmed that the polymerization conversion rate of a second block was 98% or more in terms of the non-volatile content, and the reaction solution was cooled to room temperature, and the polymerization was stopped.

Propylene glycol monomethyl ether acetate was added to the block copolymer solution synthesized previously so that the non-volatile content was 40 mass %. In this manner, a solution containing a dispersant [C-2] including a tertiary amino group having an amine value per solid content of 71.4 mg KOH/g, a weight average molecular weight (Mw) of 9,900, and a poly(meth)acrylate framework having a non-volatile content of 40 mass % was obtained.

(Preparation of Solution Containing Dispersant [C-3]): Block Copolymer Containing Quaternary Ammonium Base 60 parts of methyl methacrylate, 20 parts of n-butyl methacrylate, and 13.2 parts of tetramethylethylenediamine were put into a reaction device including a gas inlet tube, a condenser, a stirring blade, and a thermometer, and stirred at 50° C. for 1 hour while flowing nitrogen gas, and the inside of the system was purged with nitrogen gas. Next, 9.3 parts of ethyl bromoisobutyrate, 5.6 parts of cuprous chloride, and 133 parts of PGMAc were put thereinto, the temperature was raised to 110° C. under a nitrogen stream, and polymerization of a first block initiated. After polymerization for 4 hours, a polymerization solution was sampled, the solid content was measured, and it was confirmed that the polymerization conversion rate was 98% or more in terms of the non-volatile content.

Next, 61 parts of PGMAc and 25.6 parts of a methacryloyloxyethyltrimethylammonium chloride aqueous solution ("Acryester DMC78" commercially available from Mitsubishi Rayon Co., Ltd.) as a second block monomer were put into the reaction device, and stirred while being maintained at 110° C. under a nitrogen atmosphere, and the reaction continued. 2 hours after methacryloyloxyethyltrimethylammonium chloride was added, the polymerization solution was sampled, the solid content was measured, and it was confirmed that the polymerization conversion rate of a second block was 98% or more in terms of the non-volatile content, and the reaction solution was cooled to room temperature, and the polymerization was stopped.

Propylene glycol monomethyl ether acetate was added to the block copolymer solution synthesized previously so that the non-volatile content was 40 mass %. In this manner, a solution containing a dispersant [C-3] containing a quaternary ammonium base having a quaternary ammonium salt value per solid content of 29.4 mg KOH/g, a weight average molecular weight (Mw) of 9,800, and a poly(meth)acrylate framework having a non-volatile content of 40 mass % was obtained.

(Preparation of Solution Containing Dispersant [C-4]): Acidic Resin Dispersant 50 parts of methyl methacrylate, 50 parts of n-butyl methacrylate, and 45.4 parts of PGMAc were put into a reaction container including a gas inlet tube, a thermometer, a condenser, and a stirrer, and purging with nitrogen gas was performed. The inside of the reaction container was heated at 70° C., 6 parts of 3-mercapto-1,2-propanediol was added, and additionally, 0.12 parts of AIBN (azobisisobutyronitrile) was added, and the reaction was caused for 12 hours. It was confirmed that 95% was reacted in measurement of the solid content. Next, 9.7 parts of pyromellitic anhydride, 70.3 parts of PGMAc, and 0.20 parts of DBU (1,8-diazabicyclo-[5.4.0]-7-undecene) as a catalyst were added and the reaction was caused at 120° C. for 7 hours. The reaction was terminated after it was confirmed that 98% or more of acid anhydride was half-esterified in measurement of the acid value. PGMAc was added and the non-volatile content was adjusted to 50%. In this manner, a solution containing a dispersant [C-4] containing an aromatic carboxyl group having an acid value per solid content of 43 mg KOH/g, a weight average molecular weight (Mw) of 9,000, and a poly(meth)acrylate framework was obtained.

(Preparation of Solution Containing Dispersant [C-5]): Acidic Resin Dispersant 6 parts of 3-mercapto-1,2-propanediol, 9.7 parts of pyromellitic anhydride, 0.01 parts of monobutyltin oxide, and 88.9 parts of PGMAc were put into a reaction container including a gas inlet tube, a thermometer, a condenser, and a stirrer, and purging with nitrogen gas was performed. The inside of the reaction container was heated at 100° C. and the reaction was caused for 7 hours. After it was confirmed that 98% or more of acid anhydride was half-esterified in measurement of the acid value, the temperature in the system was cooled to 70° C., and 50 parts of methyl methacrylate, 30 parts of n-butyl methacrylate, and 20 parts of hydroxymethyl methacrylate were put thereinto, and 0.12 parts of AIBN and 26.8 parts of PGMAc were added and the reaction was caused for 10 hours. The reaction was terminated after it was confirmed that 95% of polymerization was progressed in measurement of the solid content. PGMAc was added and the non-volatile content was adjusted to 50%, and a solution containing a dispersant [C-5] containing an aromatic carboxyl group having an acid value per solid content of 43 mg KOH/g, a weight average molecular weight (Mw) of 9,000, and a poly(meth)acrylate framework was obtained.

(Solution Containing Dispersant [C-6])
Disperbyk-168 (commercially available from BYK Japan: non-volatile content of 30%) (solution containing dispersant [C-7])
BYK-P104 (commercially available from BYK Japan: non-volatile content of 50%) (solution containing dispersant [C-8])
Disperbyk-171 (commercially available from BYK Japan: non-volatile content of 39.5%)

[Method of Producing Dispersant Containing Tertiary Amino Group and Quaternary Ammonium Base]

(Preparation of Solution Containing Dispersant [C-9]): Block Copolymer 44.7 parts of methyl methacrylate, 14.9 parts of n-butyl methacrylate, and 13.2 parts of tetramethylethylenediamine were put into a reaction tank including a gas inlet tube, a condenser, a stirring blade, and a thermometer, and stirred at 50° C. for 1 hour while flowing nitrogen gas, and the inside of the system was purged with nitrogen gas. Next, 2.6 parts of ethyl bromoisobutyrate, 5.6 parts of cuprous chloride, and 133 parts of propylene glycol monomethyl ether acetate (hereinafter referred to as PGMAc) were put thereinto, the temperature was raised to 110° C. under a nitrogen stream, and polymerization of a first block initiated. After polymerization for 4 hours, a polymerization solution was sampled, the solid content was measured, and it was confirmed that the polymerization conversion rate was 98% or more in terms of the non-volatile content.

Next, 61 parts of PGMAc and 33.6 parts of dimethylaminoethyl methacrylate (hereinafter referred to as DM) as a second block monomer were put into a the reaction tank and stirred while being maintained at 110° C. under a nitrogen atmosphere, and the reaction continued. 2 hours after dimethylaminoethyl methacrylate was added, the polymerization solution was sampled, the solid content was measured, and it was confirmed that the polymerization conversion rate of a second block was 98% or more in terms of the non-volatile content. In addition, 6.8 parts of benzyl chloride was put into the reaction device, and stirred for 3 hours while being maintained at 110° C. under a nitrogen atmosphere, and then cooled.

PGMAc was added to the block copolymer solution synthesized previously so that the non-volatile content was 40 mass %. In this manner, a solution containing a dispersant [C-9] having an amine value per solid content of 90 mg KOH/g, a quaternary ammonium salt value of 30 mg KOH/g, a weight average molecular weight (Mw) of 9,800, and a non-volatile content of 40 mass % was obtained.

(Preparation of Solution Containing Dispersant [C-10]): Block Copolymer 47.8 parts of methyl methacrylate, 15.9 parts of n-butyl methacrylate, and 13.2 parts of tetramethylethylenediamine were put into a reaction tank including a gas inlet tube, a condenser, a stirring blade, and a thermometer, and stirred at 50° C. for 1 hour while flowing nitrogen gas, and the inside of the system was purged with nitrogen gas. Next, 2.6 parts of ethyl bromoisobutyrate, 5.6 parts of cuprous chloride, and 133 parts of PGMAc were put thereinto and the temperature was raised to 110° C. under a nitrogen stream, and polymerization of a first block initiated. After polymerization for 4 hours, a polymerization solution was sampled, the solid content was measured, and it was confirmed that the polymerization conversion rate was 98% or more in terms of the non-volatile content.

Next, 61 parts of PGMAc, 25.2 parts of DM as a second block monomer, and 13.8 parts of a methacryloyloxyethyl-trimethylammonium chloride aqueous solution ("Acryester DMC80," non-volatile content of 80% commercially available from Mitsubishi Rayon Co., Ltd.) were put into the reaction tank, and stirred while being maintained at 110° C. under a nitrogen atmosphere, and the reaction continued. After 2 hours, the polymerization solution was sampled, the solid content was measured, and it was confirmed that the polymerization conversion rate of a second block was 98% or more in terms of the non-volatile content, and the reaction solution was cooled to room temperature, and the polymerization was stopped.

PGMAc was added to the block copolymer solution synthesized previously so that the non-volatile content was 40 mass %. In this manner, a solution containing a dispersant [C-10] having an amine value per solid content of 90 mg KOH/g, a quaternary ammonium salt value of 30 mg KOH/g, a weight average molecular weight (Mw) of 9,800, and a non-volatile content of 40 mass % was obtained.

(Preparation of Solution Containing Dispersant [C-11]): Block Copolymer 39.4 parts of methyl methacrylate, 13.1 parts of n-butyl methacrylate, and 13.2 parts of tetramethylethylenediamine were put into a reaction tank including a gas inlet tube, a condenser, a stirring blade, and a thermometer, and stirred at 50° C. for 1 hour while flowing nitrogen gas, and the inside of the system was purged with nitrogen gas. Next, 2.6 parts of ethyl bromoisobutyrate, 5.6 parts of cuprous chloride, and 133 parts of PGMAc were put thereinto, the temperature was raised to 110° C. under a nitrogen stream, and polymerization of a first block initiated. After polymerization for 4 hours, a polymerization solution was sampled, the solid content was measured, and it was confirmed that the polymerization conversion rate was 98% or more in terms of the non-volatile content.

Next, 61 parts of PGMAc, 36.4 parts of DM as a second block monomer, and 13.8 parts of a methacryloyloxyethyl-trimethylammonium chloride aqueous solution ("Acryester DMC80," non-volatile content of 80% commercially available from Mitsubishi Rayon Co., Ltd.) were put into the reaction tank, and stirred while being maintained at 110° C. under a nitrogen atmosphere, and the reaction continued. After 2 hours, the polymerization solution was sampled, the solid content was measured, and it was confirmed that the polymerization conversion rate of a second block was 98% or more in terms of the non-volatile content, and the reaction solution was cooled to room temperature, and the polymerization was stopped.

PGMAc was added to the block copolymer solution synthesized previously so that the non-volatile content was 40 mass %. In this manner, a solution containing a dispersant [C-1] having an amine value per solid content of 130 mg KOH/g, a quaternary ammonium salt value of 30 mg KOH/g, a weight average molecular weight (Mw) of 9,800, and a non-volatile content of 40 mass % was obtained.

(Preparation of Solution Containing Dispersant [C-12]): Block Copolymer 40.2 parts of methyl methacrylate, 13.4 parts of n-butyl methacrylate, and 13.2 parts of tetramethylethylenediamine were put into a reaction tank including a gas inlet tube, a condenser, a stirring blade, and a thermometer, and stirred at 50° C. for 1 hour while flowing nitrogen gas, and the inside of the system was purged with nitrogen gas. Next, 2.6 parts of ethyl bromoisobutyrate, 5.6 parts of cuprous chloride, and 133 parts of propylene glycol monomethyl ether acetate (hereinafter referred to as PGMAc) were put thereinto, the temperature was raised to 110° C. under a nitrogen stream, and polymerization of a first block initiated. After polymerization for 4 hours, a polymerization solution was sampled, the solid content was measured, and it was confirmed that the polymerization conversion rate was 98% or more in terms of the non-volatile content.

Next, 61 parts of PGMAc and 39.6 parts of diethylaminoethyl methacrylate (hereinafter referred to as DE) as a second block monomer were put into the reaction tank and stirred while being maintained at 110° C. under a nitrogen atmosphere, and the reaction continued. 2 hours after dimethylaminoethyl methacrylate was added, the polymerization solution was sampled, the solid content was measured, and it was confirmed that the polymerization conversion rate of a second block was 98% or more in terms of the non-volatile content. In addition, 6.8 parts of benzyl chloride was put into the reaction device, and stirred for 3 hours while being maintained at 110° C. under a nitrogen atmosphere, and then cooled.

PGMAc was added to the block copolymer solution synthesized previously so that the non-volatile content was 40 mass %. In this manner, a solution containing a dispersant [C-12] having an amine value per solid content of 90 mg KOH/g, a quaternary ammonium salt value of 30 mg KOH/g, a weight average molecular weight (Mw) of 9,800, and a non-volatile content of 40 mass % was obtained.

(Preparation of Solution Containing Dispersant [C-13]): Block Copolymer 42.6 parts of methyl methacrylate, 14.2 parts of n-butyl methacrylate, and 13.2 parts of tetramethylethylenediamine were put into a reaction tank including a gas inlet tube, a condenser, a stirring blade, and a thermometer, and stirred at 50° C. for 1 hour while flowing nitrogen gas, and the inside of the system was purged with nitrogen gas. Next, 2.6 parts of ethyl bromoisobutyrate, 5.6 parts of cuprous chloride, and 133 parts of propylene glycol monomethyl ether acetate (hereinafter referred to as PGMAc) were put thereinto, the temperature was raised to 110° C. under a nitrogen stream, and polymerization of a first block initiated. After polymerization for 4 hours, a polymerization solution was sampled, the solid content was measured, and it was confirmed that the polymerization conversion rate was 98% or more in terms of the non-volatile content.

Next, 61 parts of PGMAc and 36.4 parts of dimethylaminopropyl methacrylamide (hereinafter referred to as DMAPMA) as a second block monomer were put into the reaction tank and stirred while being maintained at 110° C. under a nitrogen atmosphere, and the reaction continued. 2 hours after dimethylaminopropylmethacrylamide was added, the polymerization solution was sampled, the solid content was measured, and it was confirmed that the polymerization conversion rate of a second block was 98% or more in terms of the non-volatile content. In addition, 6.8 parts of benzyl chloride was put into the reaction device, and stirred for 3 hours while being maintained at 110° C. under a nitrogen atmosphere, and then cooled.

PGMAc was added to the block copolymer solution synthesized previously so that the non-volatile content was 40 mass %. In this manner, a solution containing a dispersant [C-13] having an amine value per solid content of 90 mg KOH/g, a quaternary ammonium salt value of 30 mg KOH/g, a weight average molecular weight (Mw) of 9,800, and a non-volatile content of 40 mass % was obtained.

(Preparation of Solution Containing Dispersant [C-14]: Block Copolymer 39.6 parts of methyl methacrylate, 13.2 parts of n-butyl methacrylate, and 13.2 parts of tetramethylethylenediamine were put into a reaction tank including a gas inlet tube, a condenser, a stirring blade, and a thermometer and stirred at 50° C. for 1 hour while flowing nitrogen gas, and the inside of the system was purged with nitrogen gas. Next, 2.6 parts of ethyl bromoisobutyrate, 5.6 parts of cuprous chloride, and 133 parts of PGMAc were put thereto, the temperature was raised to 110° C. under a nitrogen stream, and polymerization of a first block initiated. After polymerization for 4 hours, a polymerization solution was sampled, the solid content was measured, and it was confirmed that the polymerization conversion rate was 98% or more in terms of the non-volatile content.

Next, 61 parts of PGMAc, 36.1 parts of pentamethylpiperidyl methacrylate (commercially available from ADEKA Corporation, ADK STAB LA-82) as a second block monomer, and 13.8 parts of methacryloyloxyethyltrimethylammonium chloride aqueous solution ("Acryester DMC80", non-volatile content of 80% commercially available from Mitsubishi Rayon Co., Ltd.) were put into the reaction tank, and stirred while being maintained at 110° C. under a nitrogen atmosphere, and the reaction continued. After 2 hours, the polymerization solution was sampled, the solid content was measured, and it was confirmed that the polymerization conversion rate of a second block was 98% or more in terms of the non-volatile content, and the reaction solution was cooled to room temperature, and the polymerization was stopped.

PGMAc was added to the block copolymer solution synthesized previously so that the non-volatile content was 40 mass %. In this manner, a solution containing a dispersant [C-14] having an amine value per solid content of 90 mg KOH/g, a quaternary ammonium salt value of 30 mg KOH/g, a weight average molecular weight (Mw) of 9,800, and a non-volatile content of 40 mass % was obtained.

<Production of Paint (Coating Composition)>

Example 165

(Production of Coating Composition (SC-1))

A mixture having the following composition was uniformly stirred and mixed, and the mixture was then dispersed in an Eiger Mill for 3 hours using zirconia beads having a diameter of 0.5 mm, and then filtered using a filter with a size of 0.5 μm, and a coating composition (SC-1) was produced.

Squarylium dye [A-1]: 10.0 parts
Solution containing dispersant [C-1]: 7.5 parts
Solution containing binder resin [B-1]: 35.0 parts
Propylene glycol monomethyl ether acetate: 47.5 parts Examples 166 to 206, and Comparative Examples 13 and 14

(Production of Coating Compositions (SC-2 to 44))

Hereinafter, coating resin compositions (SC-2 to 44) were produced in the same manner as in the coating resin composition (SC-1) except that the squarylium dye [A], the resin [B], the dispersant [C] and the organic solvent were changed to the compositions and amounts shown in Table 6.

TABLE 6

| | Coating composition | Squarylium dye [A] Type | Amount added | Resin [B-1] Amount added | Dispersant [C] Type | Amount added | Organic solvent PGMAc Amount added |
|---|---|---|---|---|---|---|---|
| Example 165 | SC-1 | A-1 | 10 parts | 35.0 parts | [C-1] | 7.5 parts | 47.5 parts |
| Example 166 | SC-2 | A-1 | 10 parts | 35.0 parts | [C-2] | 7.5 parts | 47.5 parts |
| Example 167 | SC-3 | A-1 | 10 parts | 35.0 parts | [C-3] | 7.5 parts | 47.5 parts |
| Example 168 | SC-4 | A-1 | 10 parts | 25.0 parts | [C-4] | 12.5 parts | 5.25 parts |
| Example 169 | SC-5 | A-1 | 10 parts | 25.0 parts | [C-5] | 12.5 parts | 5.25 parts |
| Example 170 | SC-6 | A-1 | 10 parts | 25.0 parts | [C-6] | 12.5 parts | 5.25 parts |
| Example 171 | SC-7 | A-1 | 10 parts | 25.0 parts | [C-7] | 12.5 parts | 5.25 parts |
| Example 172 | SC-8 | A-1 | 10 parts | 25.0 parts | [C-8] | 12.5 parts | 5.25 parts |
| Example 173 | SC-9 | A-1 | 10 parts | 35.0 parts | [C-9] | 7.5 parts | 47.5 parts |
| Example 174 | SC-10 | A-1 | 10 parts | 35.0 parts | [C-10] | 7.5 parts | 47.5 parts |
| Example 175 | SC-11 | A-1 | 10 parts | 35.0 parts | [C-11] | 7.5 parts | 47.5 parts |
| Example 176 | SC-12 | A-1 | 10 parts | 35.0 parts | [C-12] | 7.5 parts | 47.5 parts |
| Example 177 | SC-13 | A-1 | 10 parts | 35.0 parts | [C-13] | 7.5 parts | 47.5 parts |
| Example 178 | SC-14 | A-1 | 10 parts | 35.0 parts | [C-14] | 7.5 parts | 47.5 parts |
| Example 179 | SC-15 | A-38 | 10 parts | 35.0 parts | [C-1] | 7.5 parts | 47.5 parts |
| Example 180 | SC-16 | A-38 | 10 parts | 35.0 parts | [C-2] | 7.5 parts | 47.5 parts |
| Example 181 | SC-17 | A-38 | 10 parts | 35.0 parts | [C-3] | 7.5 parts | 47.5 parts |
| Example 182 | SC-18 | A-38 | 10 parts | 25.0 parts | [C-4] | 12.5 parts | 52.5 parts |

TABLE 6-continued

| | Coating compo-sition | Squarylium dye [A] Type | Amount added | Resin [B-1] Amount added | Dispersant [C] Type | Amount added | Organic solvent PGMAc Amount added |
|---|---|---|---|---|---|---|---|
| Example 183 | SC-19 | A-38 | 10 parts | 25.0 parts | [C-5] | 12.5 parts | 52.5 parts |
| Example 184 | SC-20 | A-38 | 10 parts | 25.0 parts | [C-6] | 12.5 parts | 52.5 parts |
| Example 185 | SC-21 | A-38 | 10 parts | 25.0 parts | [C-7] | 12.5 parts | 52.5 parts |
| Example 186 | SC-22 | A-38 | 10 parts | 25.0 parts | [C-8] | 12.5 parts | 52.5 parts |
| Example 187 | SC-23 | A-38 | 10 parts | 35.0 parts | [C-9] | 7.5 parts | 47.5 parts |
| Example 188 | SC-24 | A-38 | 10 parts | 35.0 parts | [C-10] | 7.5 parts | 47.5 parts |
| Example 189 | SC-25 | A-38 | 10 parts | 35.0 parts | [C-11] | 7.5 parts | 47.5 parts |
| Example 190 | SC-26 | A-38 | 10 parts | 35.0 parts | [C-12] | 7.5 parts | 47.5 parts |
| Example 191 | SC-27 | A-38 | 10 parts | 35.0 parts | [C-13] | 7.5 parts | 47.5 parts |
| Example 192 | SC-28 | A-38 | 10 parts | 35.0 parts | [C-14] | 7.5 parts | 47.5 parts |
| Example 193 | SC-29 | A-49 | 10 parts | 35.0 parts | [C-1] | 7.5 parts | 47.5 parts |
| Example 194 | SC-30 | A-49 | 10 parts | 35.0 parts | [C-2] | 7.5 parts | 47.5 parts |
| Example 195 | SC-31 | A-49 | 10 parts | 35.0 parts | [C-3] | 7.5 parts | 47.5 parts |
| Example 196 | SC-32 | A-49 | 10 parts | 25.0 parts | [C-4] | 12.5 parts | 52.5 parts |
| Example 197 | SC-33 | A-49 | 10 parts | 25.0 parts | [C-5] | 12.5 parts | 52.5 parts |
| Example 198 | SC-34 | A-49 | 10 parts | 25.0 parts | [C-6] | 12.5 parts | 52.5 parts |
| Example 199 | SC-35 | A-49 | 10 parts | 25.0 parts | [C-7] | 12.5 parts | 52.5 parts |
| Example 200 | SC-36 | A-49 | 10 parts | 25.0 parts | [C-8] | 12.5 parts | 52.5 parts |
| Example 201 | SC-37 | A-49 | 10 parts | 35.0 parts | [C-9] | 7.5 parts | 47.5 parts |
| Example 202 | SC-38 | A-49 | 10 parts | 35.0 parts | [C-10] | 7.5 parts | 47.5 parts |
| Example 203 | SC-39 | A-49 | 10 parts | 35.0 parts | [C-11] | 7.5 parts | 47.5 parts |
| Example 204 | SC-40 | A-49 | 10 parts | 35.0 parts | [C-12] | 7.5 parts | 47.5 parts |
| Example 205 | SC-41 | A-49 | 10 parts | 35.0 parts | [C-13] | 7.5 parts | 47.5 parts |
| Example 206 | SC-42 | A-49 | 10 parts | 35.0 parts | [C-14] | 7.5 parts | 47.5 parts |
| Comparative Example 13 | SC-43 | D-1 | 10 parts | 35.0 parts | [C-2] | 7.5 parts | 47.5 parts |
| Comparative Example 14 | SC-44 | D-2 | 10 parts | 35.0 parts | [C-2] | 7.5 parts | 47.5 parts |

<Evaluation of Coating Composition>

Viscosity, storage stability, near-infrared absorption capability, invisibility, heat resistance, and light resistance tests were performed on the obtained coating compositions (SC-1 to 44) according to the following methods. The results are shown in Table 7.

(Evaluation of Viscosity)

The viscosity of the obtained coating compositions was measured using an E-type viscometer ("ELD type viscometer" commercially available from Toki Sangyo Co., Ltd.) at 25° C. and a rotational speed of 50 rpm. Evaluation was performed according to the following criteria.

⊚: less than 5 mPa·s
O: 5 mPa·s or more and less than 10 mPa·s
Δ: 10 mPa·s or more and less than 30 mPa·s
x: 30 mPa·s or more (Storage Stability (1))

The obtained coating composition was stored in a thermostat at 60° C. for 1 week, and aging was accelerated, and the viscosity was then measured in the same manner as in the evaluation of viscosity, and a rate of change in viscosity of the ink before and after aging was determined. Evaluation was performed according to the following criteria.

⊚: The rate of change was less than ±3%
O The rate of change was ±3% or more and less than ±5%
Δ The rate of change was ±5% or more and less than ±15%
x The rate of change was ±15% or more (Near-Infrared Absorption Capability)

The obtained coating composition was spin-coated on a glass substrate with a thickness of 1.1 mm using a spin coater so that the film thickness was 1.0 µm, and drying was performed at 60° C. for 5 minutes, and heating was then performed at 230° C. for 5 minutes, and a substrate was produced. Regarding the spectrum of the obtained substrate, an absorption spectrum in a wavelength range of 300 to 1,000 nm was measured using a spectrophotometer (U-4100 commercially available from Hitachi High-Technologies Corporation). The maximum absorption of the squarylium dye [A] of the present specification was in a region of 750 to 950 nm, and the near-infrared absorption capability was evaluated according to the absorbance at the maximum absorption wavelength based on the following criteria.

⊚: Absorbance at the maximum absorption wavelength was 1.5 or more
O: Absorbance at the maximum absorption wavelength was 1.0 or more and less than 1.5
Δ: Absorbance at the maximum absorption wavelength was 0.5 or more and less than 1.0
x: Absorbance at the maximum absorption wavelength was less than 0.5

(Invisibility)

Using the absorption spectrum in a wavelength range of 300 to 1,000 nm obtained in the method, according to "average absorbance at 400 to 700 nm" when the absorbance at the maximum absorption wavelength was normalized to 1, invisibility was evaluated based on the following criteria.

⊚: less than 0.03
O: 0.03 or more and less than 0.05
Δ: 0.05 or more and less than 0.1
x: 0.1 or more (Heat Resistance Test (1))

A test substrate was produced in the same procedures as in the evaluation of the near-infrared absorption capability, and additional heating was performed at 250° C. for 20 minutes for a heat resistance test. The absorbance at the maximum absorption wavelength of the substrate was measured, the residual ratio with respect to that before the heat resistance test was determined, and heat resistance was evaluated based on the following criteria. Here, the residual rate was calculated using the following formula.

Residual rate=(absorbance after heat resistance test)÷(absorbance before heat resistance test)×100

◎: The residual rate was 95% or more
O: The residual rate was 90% or more and less than 95%
Δ: The residual rate was 85% or more and less than 90%
x: The residual rate was less than 85%

(Heat Resistance Test (2))

A test substrate was produced in the same procedures as in the evaluation of the near-infrared absorption capability, and additional heating was performed at 260° C. for 20 minutes for a heat resistance test. The absorbance at the maximum absorption wavelength of the substrate was measured, the residual ratio with respect to that before the heat resistance test was determined, and heat resistance was evaluated based on the following criteria. Here, the residual rate was calculated using the following formula.

Residual rate=(absorbance after heat resistance test)÷(absorbance before heat resistance test)×100

◎: The residual rate was 95% or more
O: The residual rate was 90% or more and less than 95%
Δ: The residual rate was 85% or more and less than 90%
x: The residual rate was less than 85%

Light Resistance Test (1))

A test substrate was produced in the same procedures as in the evaluation of the near-infrared absorption capability, and put into a light resistance tester ("SUNTEST CPS+" commercially available from TOYOSEIKI) and left for 24 hours. In this case, the test was performed at a radiation illuminance of 47 mW/cm², and a light in a broad band of 300 to 800 nm. The absorbance at the maximum absorption wavelength of the substrate was measured, the residual ratio with respect to that before light irradiation was determined, and light resistance was evaluated based on the following criteria. Here, the residual rate was calculated using the following formula.

Residual rate=(absorbance after irradiation)÷(absorbance before irradiation)×100

◎: The residual rate was 95% or more
O: The residual rate was 90% or more and less than 95%
Δ: The residual rate was 85% or more and less than 90%
x: The residual rate was less than 85%

Light Resistance Test (2))

A test substrate was produced in the same procedures as in the evaluation of the near-infrared absorption capability, and put into a light resistance tester ("SUNTEST CPS+" commercially available from TOYOSEIKI) and left for 48 hours. In this case, the test was performed at a radiation illuminance of 47 mW/cm², and a light in a broad band of 300 to 800 nm. The absorbance at the maximum absorption wavelength of the substrate was measured, the residual ratio with respect to that before light irradiation was determined, and light resistance was evaluated based on the following criteria. Here, the residual rate was calculated using the following formula.

Residual rate=(absorbance after irradiation)÷(absorbance before irradiation)×100

◎: The residual rate was 95% or more
O: The residual rate was 90% or more and less than 95%
Δ: The residual rate was 85% or more and less than 90%
x: The residual rate was less than 85%

TABLE 7

| | Coating composition | Viscosity | Storage stability (C) | Near-infrared absorption capability | Invisibility | Heat resistance (1) | Heat resistance (2) | Light resistance (1) | Light resistance (2) |
|---|---|---|---|---|---|---|---|---|---|
| Example 165 | SC-1 | ◎ | ◎ | ◎ | ◎ | ◎ | ◎ | ◎ | ◎ |
| Example 166 | SC-2 | ◎ | ◎ | ◎ | ◎ | ◎ | ◎ | ◎ | ◎ |
| Example 167 | SC-3 | ◎ | ◎ | ◎ | ◎ | ◎ | ◎ | ◎ | ◎ |
| Example 168 | SC-4 | ◎ | ◎ | ◎ | ◎ | ◎ | ◎ | ◎ | ◎ |
| Example 169 | SC-5 | ◎ | ◎ | ◎ | ◎ | ◎ | ◎ | ◎ | ◎ |
| Example 170 | SC-6 | ◎ | ◎ | ◎ | ◎ | ◎ | ◎ | ◎ | ◎ |
| Example 171 | SC-7 | ◎ | ◎ | ◎ | ◎ | ◎ | ◎ | ◎ | ◎ |
| Example 172 | SC-8 | ◎ | ◎ | ◎ | ◎ | ◎ | ◎ | ◎ | ◎ |
| Example 173 | SC-9 | ◎ | ◎ | ◎ | ◎ | ◎ | ◎ | ◎ | ◎ |
| Example 174 | SC-10 | ◎ | ◎ | ◎ | ◎ | ◎ | ◎ | ◎ | ◎ |
| Example 175 | SC-11 | ◎ | ◎ | ◎ | ◎ | ◎ | ◎ | ◎ | ◎ |
| Example 176 | SC-12 | ◎ | ◎ | ◎ | ◎ | ◎ | ◎ | ◎ | ◎ |
| Example 177 | SC-13 | ◎ | ◎ | ◎ | ◎ | ◎ | ◎ | ◎ | ◎ |
| Example 178 | SC-14 | ◎ | ◎ | ◎ | ◎ | ◎ | ◎ | ◎ | ◎ |
| Example 179 | SC-15 | ◎ | O | ◎ | ◎ | ◎ | ◎ | ◎ | ◎ |
| Example 180 | SC-16 | ◎ | O | ◎ | ◎ | ◎ | ◎ | ◎ | ◎ |
| Example 181 | SC-17 | ◎ | O | ◎ | ◎ | ◎ | ◎ | ◎ | ◎ |
| Example 182 | SC-18 | ◎ | O | ◎ | ◎ | ◎ | ◎ | ◎ | ◎ |
| Example 183 | SC-19 | ◎ | O | ◎ | ◎ | ◎ | ◎ | ◎ | ◎ |
| Example 184 | SC-20 | ◎ | O | ◎ | ◎ | ◎ | ◎ | ◎ | ◎ |
| Example 185 | SC-21 | ◎ | O | ◎ | O | ◎ | ◎ | ◎ | ◎ |
| Example 186 | SC-22 | ◎ | O | ◎ | ◎ | ◎ | ◎ | ◎ | ◎ |
| Example 187 | SC-23 | ◎ | ◎ | ◎ | ◎ | ◎ | ◎ | ◎ | ◎ |
| Example 188 | SC-24 | ◎ | ◎ | ◎ | ◎ | ◎ | ◎ | ◎ | ◎ |
| Example 189 | SC-25 | ◎ | ◎ | ◎ | ◎ | ◎ | ◎ | ◎ | ◎ |
| Example 190 | SC-26 | ◎ | ◎ | ◎ | ◎ | ◎ | ◎ | ◎ | ◎ |
| Example 191 | SC-27 | ◎ | ◎ | ◎ | ◎ | ◎ | ◎ | ◎ | ◎ |
| Example 192 | SC-28 | ◎ | ◎ | ◎ | ◎ | ◎ | ◎ | ◎ | ◎ |
| Example 193 | SC-29 | ◎ | ◎ | ◎ | ◎ | ◎ | ◎ | ◎ | ◎ |
| Example 194 | SC-30 | ◎ | ◎ | ◎ | ◎ | ◎ | ◎ | ◎ | ◎ |
| Example 195 | SC-31 | ◎ | ◎ | ◎ | ◎ | ◎ | ◎ | ◎ | ◎ |
| Example 196 | SC-32 | ◎ | ◎ | ◎ | ◎ | ◎ | ◎ | ◎ | ◎ |
| Example 197 | SC-33 | ◎ | ◎ | ◎ | ◎ | ◎ | ◎ | ◎ | ◎ |
| Example 198 | SC-34 | ◎ | ◎ | ◎ | ◎ | ◎ | ◎ | ◎ | ◎ |

TABLE 7-continued

|  | Coating composition | Viscosity | Storage stability (C) | Near-infrared absorption capability | Invisibility | Heat resistance (1) | Heat resistance (2) | Light resistance (1) | Light resistance (2) |
|---|---|---|---|---|---|---|---|---|---|
| Example 199 | SC-35 | ◎ | ◎ | ◎ | ◎ | ◎ | ◎ | ◎ | ◎ |
| Example 200 | SC-36 | ◎ | ◎ | ◎ | ◎ | ◎ | ◎ | ◎ | ◎ |
| Example 201 | SC-37 | ◎ | ◎ | ◎ | ◎ | ◎ | ◎ | ◎ | ◎ |
| Example 202 | SC-38 | ◎ | ◎ | ◎ | ◎ | ◎ | ◎ | ◎ | ◎ |
| Example 203 | SC-39 | ◎ | ◎ | ◎ | ◎ | ◎ | ◎ | ◎ | ◎ |
| Example 204 | SC-40 | ◎ | ◎ | ◎ | ◎ | ◎ | ◎ | ◎ | ◎ |
| Example 205 | SC-41 | ◎ | ◎ | ◎ | ◎ | ◎ | ◎ | ◎ | ◎ |
| Example 206 | SC-42 | ◎ | ◎ | ◎ | ◎ | ◎ | ◎ | ◎ | ◎ |
| Comparative Example 13 | SC-43 | O | Δ | X | X | X | X | Δ | X |
| Comparative Example 14 | SC-44 | Δ | O | Δ | Δ | Δ | X | X | X |

(Storage Stability (2))

An additional storage stability test was performed on coating compositions (SC-1 to 5, 9 to 14). The results are shown in Table 8. The obtained coating composition was stored in a thermostat at 60° C. for 4 weeks, and aging was accelerated, and the viscosity was then measured in the same manner as in the evaluation of viscosity, and a rate of change in viscosity of the ink before and after aging was determined. Evaluation was performed according to the following criteria.

◎: The rate of change was less than ±3%. Excellent.
O The rate of change was ±3% or more and less than ±5%. Good
Δ The rate of change was ±5% or more and less than ±15%. Practical
x The rate of change was ±15% or more. Not practical

TABLE 8

|  | Coating composition | Storage stability (2) |
|---|---|---|
| Example 165 | SC-1 | O |
| Example 166 | SC-2 | O |
| Example 167 | SC-3 | O |
| Example 168 | SC-4 | Δ |
| Example 169 | SC-5 | Δ |
| Example 173 | SC-9 | ◎ |
| Example 174 | SC-10 | ◎ |
| Example 175 | SC-11 | ◎ |
| Example 176 | SC-12 | ◎ |
| Example 177 | SC-13 | ◎ |
| Example 178 | SC-14 | ◎ |

Coating compositions (SC-1 to 42) of the present specification exhibited very good performance in terms of stability, optical properties, and resistance as a composition. On the other hand, regarding coating compositions that were not included in the present specification, SC-43 had a big problem in optical properties, and SC-44 had a big problem in resistance, which were not to a practical level. This is inferred to be due to "strong color development," "high robustness," and "strong crystallinity" derived from the structure that the squarylium dye [A] of the present specification noticeably had among perimidine squarylium dyes. In addition, it was confirmed that coating compositions (SC-9 to 14) containing a tertiary amino group and a quaternary ammonium base and using a resin dispersant having a block structure had particularly excellent storage stability.

In addition, since stability as a composition is also excellent, the compositions are not limited to solid coating in this case, but can also be applied in various coating processes such as pattern forming coating, for example, photolithography and dry etching, and print coating such as UV offset and gravure. In addition, the compositions are not limited to the coating substrate. In addition, the compositions had very good optical properties (near-infrared absorption capability and invisibility), and resistance (heat resistance and light resistance). Therefore, in addition to the image forming materials, they can be appropriately used for applications such as a near-infrared cut filter material, a heat radiation cutting material, a photothermal conversion material including laser welding, and a solid-state image sensing device material.

<Production of Laser Welded Assembly>

Example 207

(Production of assembly 1)

The coating composition (SC-1) was solid-coated on a surface of a 10 square cm polystyrene transparent plate with a thickness of 1 mm and made of a thermoplastic resin using a bar coater so that the dry film thickness was 0.5 μm, and then dried in an oven at 60° C. for 5 minutes, and thereby an assembly precursor 1 was obtained. The obtained "assembly precursor 1" and "a 10 square cm polystyrene transparent plate having no coating with a thickness of 1 mm" overlapped with a coating layer therebetween, a laser beam with a laser wavelength of 808 nm, a laser scanning speed of 10 mm/sec, and a laser output of 30 W was emitted to the overlapping part, and thereby a laser welded assembly 1 was obtained.

Examples 208 to 226, and Comparative Examples 15 to 22

(Production of Assemblies 2 to 28)

Laser welded assemblies 2 to 28 were obtained in the same manner as in the laser welded assembly 1 except that the composition and coating member used in the laser welded assembly 1 were changed to types shown in Table 9.

<Evaluation of Laser Welded Assembly>

The obtained laser welded assemblies were evaluated as follows. The results are shown in Table 9.

(Evaluation of Welding Strength of Laser Welded Assembly)

Respective tips of two transparent plates which were laser-welded in the method were gripped and the degree of welding was visually determined.
O: uniformly and sufficiently welded
x: not welded

TABLE 9

| | Assembly | Coating composition | Coating member for laser welding | Welding strength |
|---|---|---|---|---|
| Example 207 | Assembly 1 | SC-1 | PS | O |
| Example 208 | Assembly 2 | SC-1 | PMMA | O |
| Example 209 | Assembly 3 | SC-1 | COP | O |
| Example 210 | Assembly 4 | SC-1 | PC | O |
| Example 211 | Assembly 5 | SC-2 | PS | O |
| Example 212 | Assembly 6 | SC-2 | PMMA | O |
| Example 213 | Assembly 7 | SC-2 | COP | O |
| Example 214 | Assembly 8 | SC-2 | PC | O |
| Example 215 | Assembly 9 | SC-13 | PS | O |
| Example 216 | Assembly 10 | SC-13 | PMMA | O |
| Example 217 | Assembly 11 | SC-13 | COP | O |
| Example 218 | Assembly 12 | SC-13 | PC | O |
| Example 219 | Assembly 13 | SC-16 | PS | O |
| Example 220 | Assembly 14 | SC-16 | PMMA | O |
| Example 221 | Assembly 15 | SC-16 | COP | O |
| Example 222 | Assembly 16 | SC-16 | PC | O |
| Example 223 | Assembly 17 | SC-30 | PS | O |
| Example 224 | Assembly 18 | SC-30 | PMMA | O |
| Example 225 | Assembly 19 | SC-30 | COP | O |
| Example 226 | Assembly 20 | SC-30 | PC | O |
| Comparative Example 15 | Assembly 21 | SC-43 | PS | X |
| Comparative Example 16 | Assembly 22 | SC-43 | PMMA | X |
| Comparative Example 17 | Assembly 23 | SC-43 | COP | X |
| Comparative Example 18 | Assembly 24 | SC-43 | PC | X |
| Comparative Example 19 | Assembly 25 | SC-44 | PS | X |
| Comparative Example 20 | Assembly 26 | SC-44 | PMMA | X |
| Comparative Example 21 | Assembly 27 | SC-44 | COP | X |
| Comparative Example 22 | Assembly 28 | SC-44 | PC | X |

The abbreviations in Table 9 are shown below. (10 square cm substrate with a thickness of 1 mm)
PS: polystyrene (product name: CR-4500; manufacturer: DIC)
PMMA: polymethylmethacrylate (product name: PARA-PET HR-L; manufacturer: Kuraray)
COP: cycloolefin polymer (product name: Z Ethyleneoxy NEX E48R; manufacturer: Zeon Corporation)
PC: polycarbonate (product name: Iupilon H-4000; manufacturer: commercially available from Mitsubishi Engineering-Plastics Corporation)

Since the coating compositions (SC-1, SC-2, SC-13, SC-16, and SC-30) of the present specification had a very high near-infrared absorption capability and could convert a laser beam into heat with high efficiency, it was possible to firmly weld resin members. In addition, since the composition had high stability and could be uniformly applied, uniform welding was also possible. Based on these results, it was found that the resin composition of the present specification could be appropriately used for laser welding applications.

<Production of Solid-State Image Sensing Device Composition>

Example 227

(Production of Solid-State Image Sensing Device Composition (CM-1))

The following mixture was stirred and mixed so that it became uniform, and then filtered using a filter with a size of 1.0 μm, and thereby a solid-state image sensing device composition (CM-1) was obtained.
Coating composition (SC-1): 30.0 parts
Solution containing binder resin [B-1]: 13.9 parts
Photopolymerizable monomer ("M-350" commercially available from Toagosei Co., Ltd.): 3.2 parts
Photopolymerization initiator ("OXE-01" commercially available from BASF): 0.2 parts PGMAc: 52.7 parts Example 228

(Production of Solid-State Image Sensing Device Composition (CM-2))

The following mixture was stirred and mixed so that it became uniform, and then filtered using a filter with a size of 1.0 μm, and thereby a solid-state image sensing device composition (CM-2) was obtained.
Coating composition (SC-1): 30.0 parts
Solution containing binder resin [B-1]: 13.3 parts
Hindered phenolic antioxidant (commercially available from BASF "IRGANOX 1010"): 0.2 parts Photopolymerizable monomer ("ARONIXM-350" commercially available from Toagosei Co., Ltd.): 3.2 parts
Photopolymerization initiator ("OXE-01" commercially available from BASF): 0.2 parts PGMAc: 53.1 parts Example 229

(Production of Solid-State Image Sensing Device Composition (CM-3))

A solid-state image sensing device composition (CM-3) was obtained in the same manner as in the solid-state image sensing device composition (CM-2) except that a total amount of the photopolymerizable monomer ("ARONIXM-350" commercially available from Toagosei Co., Ltd.) and the photopolymerization initiator ("OXE-01" commercially available from BASF) was changed to the epoxy resin ("EX-611" commercially available from Nagase ChemteX Corporation).

Examples 230 to 241, and Comparative Examples 23 to 28

(Production of Solid-State Image Sensing Device Compositions (CM-4 to 21))

Hereinafter, solid-state image sensing device compositions (CM-4 to 21) were obtained in the same manner as in the solid-state image sensing device compositions (CM-1) to (CM-3) except that compositions and amounts added shown in Table 10 were used.

TABLE 10

| Solid-state image sensing device composition | Coating composition Type | Coating composition Parts by weight | Binder resin [B-1] (parts by weight) | Photo-polymerizable monomer M-350 (parts by weight) | Photo-polymerization initiator OXE-01 (parts by weight) | Antioxidant IRGANOX 1010 (parts by weight) | Epoxy resin EX-611 (parts by weight) | PGMAc (parts by weight) |
|---|---|---|---|---|---|---|---|---|
| Example 227 | CM-1 | SC-1 | 30.0 | 13.9 | 3.2 | 0.2 | 0 | 0 | 52.7 |
| Example 228 | CM-2 | SC-1 | 30.0 | 13.3 | 3.2 | 0.2 | 0.2 | 0 | 53.1 |
| Example 229 | CM-3 | SC-1 | 30.0 | 13.3 | 0 | 0 | 0.2 | 3.4 | 53.1 |
| Example 230 | CM-4 | SC-2 | 30.0 | 13.9 | 3.2 | 0.2 | 0 | 0 | 52.7 |
| Example 231 | CM-5 | SC-2 | 30.0 | 13.3 | 3.2 | 0.2 | 0.2 | 0 | 53.1 |
| Example 232 | CM-6 | SC-2 | 30.0 | 13.3 | 0 | 0 | 0.2 | 3.4 | 53.1 |
| Example 233 | CM-7 | SC-13 | 30.0 | 13.9 | 3.2 | 0.2 | 0 | 0 | 52.7 |
| Example 234 | CM-8 | SC-13 | 30.0 | 13.3 | 3.2 | 0.2 | 0.2 | 0 | 53.1 |
| Example 235 | CM-9 | SC-13 | 30.0 | 13.3 | 0 | 0 | 0.2 | 3.4 | 53.1 |
| Example 236 | CM-10 | SC-16 | 30.0 | 13.9 | 3.2 | 0.2 | 0 | 0 | 52.7 |
| Example 237 | CM-11 | SC-16 | 30.0 | 13.3 | 3.2 | 0.2 | 0.2 | 0 | 53.1 |
| Example 238 | CM-12 | SC-16 | 30.0 | 13.3 | 0 | 0 | 0.2 | 3.4 | 53.1 |
| Example 239 | CM-13 | SC-30 | 30.0 | 13.9 | 3.2 | 0.2 | 0 | 0 | 52.7 |
| Example 240 | CM-14 | SC-30 | 30.0 | 13.3 | 3.2 | 0.2 | 0.2 | 0 | 53.1 |
| Example 241 | CM-15 | SC-30 | 30.0 | 13.3 | 0 | 0 | 0.2 | 3.4 | 53.1 |
| Comparative Example 23 | CM-16 | SC-43 | 30.0 | 13.9 | 3.2 | 0.2 | 0 | 0 | 52.7 |
| Comparative Example 24 | CM-17 | SC-43 | 30.0 | 13.3 | 3.2 | 0.2 | 0.2 | 0 | 53.1 |
| Comparative Example 25 | CM-18 | SC-43 | 30.0 | 13.3 | 0 | 0 | 0.2 | 3.4 | 53.1 |
| Comparative Example 26 | CM-19 | SC-44 | 30.0 | 13.9 | 3.2 | 0.2 | 0 | 0 | 52.7 |
| Comparative Example 27 | CM-20 | SC-44 | 30.0 | 13.3 | 3.2 | 0.2 | 0.2 | 0 | 53.1 |
| Comparative Example 28 | CM-21 | SC-44 | 30.0 | 13.3 | 0 | 0 | 0.2 | 3.4 | 53.1 |

<Evaluation of Solid-State Image Sensing Device Composition>

Near-infrared absorption capability, invisibility, heat resistance, light resistance, pattern peelability (1 or 2), and pattern formability tests were performed on the solid-state image sensing device resin compositions (CM-1 to 21) obtained in the examples and comparative examples according to the following method. The results are shown in Table 11.

(Near-Infrared Absorption Capability)

The obtained solid-state image sensing device composition was spin-coated on a glass substrate with a thickness of 1.1 mm using a spin coater so that the film thickness was 1.0 μm, and drying was performed at 60° C. for 5 minutes, and heating was then performed at 230° C. for 5 minutes, and a substrate was produced. Regarding the spectrum of the obtained substrate, an absorption spectrum in a wavelength range of 300 to 1,000 nm was measured using a spectrophotometer (U-4100 commercially available from Hitachi High-Technologies Corporation). The maximum absorption of the squarylium dye [A] of the present specification was in a region of 750 to 950 nm, and the near-infrared absorption capability was evaluated according to the absorbance at the maximum absorption wavelength based on the following criteria.

⊚: Absorbance at the maximum absorption wavelength was 1.0 or more
O: Absorbance at the maximum absorption wavelength was 0.7 or more and less than 1.0
Δ: Absorbance at the maximum absorption wavelength was 0.5 or more and less than 0.7
x: Absorbance at the maximum absorption wavelength was less than 0.5

(Invisibility)

Using the absorption spectrum in a wavelength range of 300 to 1,000 nm obtained in the method, according to "average absorbance at 400 to 700 nm" when the absorbance at the maximum absorption wavelength was normalized to 1, invisibility was evaluated based on the following criteria.

⊚: less than 0.05
O: 0.05 or more and less than 0.07
Δ: 0.07 or more and less than 0.1
x: 0.1 or more (Heat Resistance Test (1))

A test substrate was produced in the same procedures as in the evaluation of the near-infrared absorption capability, and additional heating was performed at 250° C. for 20 minutes for a heat resistance test. The absorbance at the maximum absorption wavelength of the substrate was measured, the residual ratio with respect to that before the heat resistance test was determined, and heat resistance was evaluated based on the following criteria. Here, the residual rate was calculated using the following formula.

Residual rate=(absorbance after heat resistance test)÷(absorbance before heat resistance test)×100

⊚: The residual rate was 95% or more
O: The residual rate was 90% or more and less than 95%
Δ: The residual rate was 85% or more and less than 90%
x: The residual rate was less than 85%

(Heat Resistance Test (2))

A test substrate was produced in the same procedures as in the evaluation of the near-infrared absorption capability, and additional heating was performed at 260° C. for 20 minutes for a heat resistance test. The absorbance at the maximum absorption wavelength of the substrate was measured, the residual ratio with respect to that before the heat resistance test was determined, and heat resistance was evaluated based on the following criteria. Here, the residual rate was calculated using the following formula.

Residual rate=(absorbance after heat resistance test)÷(absorbance before heat resistance test)×100

⊚: The residual rate was 95% or more
O: The residual rate was 90% or more and less than 95%
Δ: The residual rate was 85% or more and less than 90%
x: The residual rate was less than 85%
(Light Resistance Test (1))

A test substrate was produced in the same procedures as in the evaluation of the near-infrared absorption capability, and put into a light resistance tester ("SUNTEST CPS+" commercially available from TOYOSEIKI) and left for 24 hours. In this case, the test was performed at a radiation illuminance of 47 mW/cm$^2$, and a light in a broad band of 300 to 800 nm. The absorbance at the maximum absorption wavelength of the substrate was measured, the residual ratio with respect to that before light irradiation was determined, and light resistance was evaluated based on the following criteria. Here, the residual rate was calculated using the following formula.

Residual rate=(absorbance after irradiation)÷(absorbance before irradiation)×100

⊚: The residual rate was 95% or more
O: The residual rate was 90% or more and less than 95%
Δ: The residual rate was 85% or more and less than 90%
x: The residual rate was less than 85%
(Light Resistance Test (2))

A test substrate was produced in the same procedures as in the evaluation of the near-infrared absorption capability, and put into a light resistance tester ("SUNTEST CPS+" commercially available from TOYOSEIKI) and left for 48 hours. In this case, the test was performed at a radiation illuminance of 47 mW/cm$^2$, and a light in a broad band of 300 to 800 nm. The absorbance at the maximum absorption wavelength of the substrate was measured, the residual ratio with respect to that before light irradiation was determined, and light resistance was evaluated based on the following criteria. Here, the residual rate was calculated using the following formula.

Residual rate=(absorbance after irradiation)÷(absorbance before irradiation)×100

⊚: The residual rate was 95% or more
O: The residual rate was 90% or more and less than 95%
Δ: The residual rate was 85% or more and less than 90%
x: The residual rate was less than 85%
(Pattern Peelability 1)
[Infrared Absorption Pattern Forming Process According to Photolithography]

The solid-state image sensing device compositions (CM-1, 2, 4, 5, 7, 8, 10, 11, 13, and 14) obtained in the method were applied to 8-inch silicon wafers by spin coating, and a heat treatment was then performed on the coating film surface at a surface temperature of 100° C. for 120 seconds, drying was performed on a hot plate, and the dried coating film having a film thickness of about 1.0 μm was formed.

Next, the dried coating film was exposed at an exposure amount of 1,000 mJ/cm$^2$ through a mask pattern in which 1.2 μm square pixels were arranged in the form of dots in a 10 mm×10 mm area on the substrate using an i-line stepper (FPA-3000i5+ commercially available from Canon Inc.).

The pattern-exposed coating film was subjected to paddle developing using an organic alkaline developing solution (PK-DEX4310 commercially available from Parker Corporation) at room temperature for 60 seconds, and additionally then rinsed with pure water using a spin shower for 20 seconds. Then, washing with pure water was additionally performed. Then, water droplets were blown with high pressure air, the substrate was naturally dried, a post-baking treatment was performed on a hot plate at 230° C. for 300 seconds, and an infrared absorption pattern was formed on the silicon wafer.

Regarding the infrared absorption pattern produced above, the number of pattern peelings that occurred was inspected using a defect inspection device "ComPLUS3" (commercially available from Applied Materials technology), defective parts were detected, and the number of defects due to peeling was determined from such defective parts. Based on the determined number of peeling defects, evaluation was performed based on the following evaluation criteria. Here, regarding the inspection area, 200 areas with 10 mm in length×10 mm in width were prepared on the 8-inch wafer, and these were evaluated.

⊚: The number of peeling defects was 5 or less
O: The number of peeling defects was 6 or more and 10 or less
Δ: The number of peeling defects was 11 or more and 20 or less
x: The number of peeling defects was 21 or more
(Pattern Peelability 2)
[Infrared Absorption Pattern Forming Process According to Dry Etching]

The solid-state image sensing device compositions (CM-3, 6, 9, 12, and 15) obtained in the method were applied to 8-inch silicon wafers by spin coating, and drying was then performed on a hot plate at 100° C. for 180 seconds, and after drying, a heat treatment (post baking) was additionally performed on the hot plate at 200° C. for 480 seconds.

Next, a positive photoresist "FHi622BC" (commercially available from FUJIFILM Electronic Materials Co., Ltd.) was applied to the layer, prebaking was performed, and a photoresist layer was formed.

Subsequently, the photoresist layer was subjected to pattern exposure at an exposure amount of 350 mJ/cm$^2$ using an i-line stepper (commercially available from Canon Inc.), and a heat treatment was performed for 1 minute at a temperature at which the temperature of the photoresist layer or the ambient temperature was 90° C. Then, a developing treatment was performed using a developing solution "FHD-5" (commercially available from FUJIFILM Electronic Materials Co., Ltd.) for 1 minute, and additionally a post-baking treatment was performed at 110° C. for 1 minute, and a resist pattern was formed. The resist pattern was a pattern in which 1.2 square μm square resist films were arranged in a checkered form in consideration of etching conversion difference (reduction of the pattern width due to etching).

Next, dry etching was performed using the resist pattern as an etching mask according to the following procedures. Using a dry etching device (U-621 commercially available from Hitachi High-Technologies Corporation), RF power: 800 W, antenna bias: 400 W, wafer bias: 200 W, chamber internal pressure: 4.0 Pa, substrate temperature: 50° C., and gas types and flow rates of the mixed gas: $CF_4$: 80 mL/min, $O_2$: 40 mL/min, Ar: 800 mL/min, were set, and a first stage etching treatment was performed for 80 seconds.

Under these etching conditions, an amount of the layer scrapped was 356 nm (89% etching amount), and there was a residual film of about 44 nm.

Next, in the same etching chamber, RF power: 600 W, antenna bias: 100 W, wafer bias: 250 W, chamber internal pressure: 2.0 Pa, substrate temperature: 50° C., and gas types and flow rates of the mixed gas: N$_2$: 500 mL/min, O$_2$: 50 mL/min, and Ar: 500 mL/min (N$_2$/O$_2$/Ar=10/1/10), were set, an over etching rate in the etching total was set to 20%, and a second stage etching treatment and an over etching treatment were performed.

The etching rate of the infrared absorption pattern layer under second stage etching conditions was 600 nm/min or more, and a time of about 10 seconds was required to etch the residual film of the layer. The sum of the first stage etching time of 80 seconds and the second stage etching time of 10 seconds was calculated as an etching time. As a result, the etching time was 80+10=90 seconds, the over etching time was 90×0.2=18 seconds, and the total etching time was set to 90+18=108 seconds.

After dry etching was performed under the above conditions, a release treatment was performed using a photoresist release solution "MS230C" (commercially available from FUJIFILM Electronic Materials Co., Ltd.) for 120 seconds, a resist pattern was removed, and additionally, washing with pure water and spin drying were performed. Then, a dehydration baking treatment was performed at 100° C. for 2 minutes.

Regarding the infrared absorption pattern produced above, the number of pattern peelings that occurred was evaluated in the same method as in the above (pattern peelability 1).

(Pattern Formability)

The infrared absorption pattern produced in the evaluation of pattern peelability was cut by glass cutting, and observed using a scanning electron microscope (S-4800, commercially available from Hitachi Ltd.) at a magnification of 15,000, and evaluated according to the following evaluation criteria.

O: A pattern with a line width of 1.2 μm was formed with favorable linearity

Δ: A pattern with a line width of 1.2 μm had slight looseness. No problem in practical use.

x: A pattern with a line width of 1.2 μm had very poor linearity.

TABLE 11

| | Solid-state image sensing device composition | Coating composition | Near-infrared absorption capability | Invisibility | Heat resistance (1) | Heat resistance (2) | Light resistance (1) | Light resistance (2) | Pattern peelability 1 | Pattern peelability 2 | Pattern formability |
|---|---|---|---|---|---|---|---|---|---|---|---|
| Example 227 | CM-1 | SC-1 | ◎ | ◎ | ◎ | ◎ | ◎ | ◎ | ◎ | — | O |
| Example 228 | CM-2 | SC-1 | ◎ | ◎ | ◎ | ◎ | ◎ | ◎ | ◎ | — | O |
| Example 229 | CM-3 | SC-1 | ◎ | ◎ | ◎ | ◎ | ◎ | ◎ | — | ◎ | O |
| Example 230 | CM-4 | SC-2 | ◎ | ◎ | ◎ | ◎ | ◎ | ◎ | ◎ | — | O |
| Example 231 | CM-5 | SC-2 | ◎ | ◎ | ◎ | ◎ | ◎ | ◎ | ◎ | — | O |
| Example 232 | CM-6 | SC-2 | ◎ | ◎ | ◎ | ◎ | ◎ | ◎ | — | ◎ | O |
| Example 233 | CM-7 | SC-13 | ◎ | ◎ | ◎ | ◎ | ◎ | ◎ | ◎ | — | O |
| Example 234 | CM-8 | SC-13 | ◎ | ◎ | ◎ | ◎ | ◎ | ◎ | ◎ | — | O |
| Example 235 | CM-9 | SC-13 | ◎ | ◎ | ◎ | ◎ | ◎ | ◎ | — | ◎ | O |
| Example 236 | CM-10 | SC-16 | ◎ | ◎ | ◎ | ◎ | ◎ | ◎ | O | — | O |
| Example 237 | CM-11 | SC-16 | ◎ | ◎ | ◎ | ◎ | ◎ | ◎ | O | — | O |
| Example 238 | CM-12 | SC-16 | ◎ | ◎ | ◎ | ◎ | ◎ | ◎ | — | O | O |
| Example 239 | CM-13 | SC-30 | ◎ | ◎ | ◎ | ◎ | ◎ | ◎ | ◎ | — | O |
| Example 240 | CM-14 | SC-30 | ◎ | ◎ | ◎ | ◎ | ◎ | ◎ | ◎ | — | O |
| Example 241 | CM-15 | SC-30 | ◎ | ◎ | ◎ | ◎ | ◎ | ◎ | — | ◎ | O |
| Comparative Example 23 | CM-16 | SC-43 | X | Δ | X | X | Δ | X | Δ | — | Δ |
| Comparative Example 24 | CM-17 | SC-43 | X | Δ | Δ | X | Δ | X | Δ | — | Δ |
| Comparative Example 25 | CM-18 | SC-43 | X | Δ | Δ | X | Δ | X | — | Δ | Δ |
| Comparative Example 26 | CM-19 | SC-44 | Δ | Δ | Δ | X | X | X | Δ | — | X |
| Comparative Example 27 | CM-20 | SC-44 | Δ | Δ | O | Δ | X | X | Δ | — | X |
| Comparative Example 28 | CM-21 | SC-44 | Δ | Δ | O | Δ | X | X | — | Δ | X |

The solid-state image sensing device compositions (CM-1 to 15) of the present specifications had good pattern peelability and pattern formability in addition to the near-infrared absorption capability, invisibility, heat resistance, and light resistance, and could be appropriately used for solid-state image sensing device applications. In addition, in any of photolithography and dry etching as a typical pattern forming process, high performance was exhibited.

<Production of Pressure-Sensitive Adhesive (Pressure-Sensitive Adhesive Composition)>

When a pressure-sensitive adhesive was produced, a pressure-sensitive adhesive resin was produced.

<Method of Producing Resin [B] (Pressure-Sensitive Adhesive Resin)>

(Preparation of Acrylic Pressure-Sensitive Adhesive Resin [B-2])

99.85 parts of n-butyl acrylate, 0.15 parts of acrylic acid, 121.0 parts of ethyl acetate, and 0.2 parts of benzoyl peroxide were put into a reaction container including a stirrer, a thermometer, a reflux cooler, a dripping device, and a nitrogen inlet tube, air in the reactor was purged with nitrogen gas while stirring, and the temperature was raised until refluxing occurred, and maintained, and the reaction was caused for a total of 5 hours. After the reaction was completed, 34.4 parts of ethyl acetate, 28.3 parts of toluene, and 0.5 parts of 2,5-ditertiary butyl hydroquinone as the polymerization inhibitor were added for dilution, the temperature was lowered to room temperature, and a solution containing an acrylic pressure-sensitive adhesive resin [B-2] having a non-volatile content of 34.0% was obtained. The weight average molecular weight of the acrylic pressure-sensitive adhesive resin [B-2] was 500,000.

Example 242

(Production of Pressure-Sensitive Adhesive Composition (AD-1))

0.5 parts of the squarylium dye [A-1], 98.8 parts, of the acrylic pressure-sensitive adhesive resin [B-2], and 0.7 parts of TDI/TMP (a trimethylolpropane adduct product of tolylene diisocyanate) as a cross-linking agent were mixed, and stirred strongly in a disper, the squarylium dye [A-1] in the resin was dispersed, and thereby an adhesive pressure-sensitive composition (AD-1) was prepared.

Examples 243 and 244, and Comparative Examples 29 and 30

(Production of Pressure-Sensitive Adhesive Compositions (AD-2 to 5))

Hereinafter, pressure-sensitive adhesive compositions (AD-2 to 5) were prepared in the same manner as in the pressure-sensitive adhesive composition (AD-1) except that squarylium dyes [A-38], [A-49], [D-1], and [D-2] were used in place of the squarylium dye [A-1].

<Evaluation of Pressure-Sensitive Adhesive (Pressure-Sensitive Adhesive Composition)>

Dispersibility, near-infrared absorption capability, invisibility, and weather resistance tests were performed on the obtained pressure-sensitive adhesive compositions (AD-1 to 5) according to the following method. The results are shown in Table 12.

(Dispersibility)

The obtained pressure-sensitive adhesive compositions (AD1 to 5) were applied to a transparent release sheet with a thickness of 75 μm using a doctor blade so that the dry film thickness was 45 μm, and dried and thus a pressure-sensitive adhesive layer was formed, and then laminated on one surface of a PET film with a thickness of 25 μm, and thereby a single-sided adhesive tape composed of PET film/pressure-sensitive adhesive layer/release sheet was obtained. The pressure-sensitive adhesive tape was aged for 7 days in an atmosphere of 23° C. and an RH of 50%. When the surface of the obtained single-sided pressure-sensitive adhesive tape was observed under an optical microscope, the dispersibility of the squarylium dye [A] in the pressure-sensitive adhesive resin composition was evaluated. The evaluation criteria are as follows.

⊚: There were no aggregates, and the squarylium dye was very uniformly dispersed.

O: There were substantially no aggregates, and the squarylium dye was uniformly dispersed Δ: There were aggregates, and the squarylium dye was not uniformly dispersed x: There were many aggregates, and the squarylium dye was not uniformly dispersed (Near-Infrared Absorption Capability)

Regarding the spectrum of the single-sided pressure-sensitive adhesive tape obtained in the method, an absorption spectrum in a wavelength range of 300 to 1,000 nm was measured using a spectrophotometer (U-4100 commercially available from Hitachi High-Technologies Corporation). The maximum absorption of the squarylium dye [A] of the present specification was in a region of 750 to 950 nm, and the near-infrared absorption capability was evaluated according to the absorbance at the maximum absorption wavelength based on the following criteria.

⊚: Absorbance at the maximum absorption wavelength was 1.5 or more

O: Absorbance at the maximum absorption wavelength was 1.0 or more and less than 1.5

Δ: Absorbance at the maximum absorption wavelength was 0.5 or more and less than 1.0 x: Absorbance at the maximum absorption wavelength was less than 0.5

(Invisibility)

Using the absorption spectrum in a wavelength range of 300 to 1,000 nm obtained in the method, according to "average absorbance at 400 to 700 nm" when the absorbance at the maximum absorption wavelength was normalized to 1, invisibility was evaluated based on the following criteria.

⊚: less than 0.03

O: 0.03 or more and less than 0.05

Δ: 0.05 or more and less than 0.1 x: 0.1 or more (Weather Resistance Test)

Regarding the single-sided pressure-sensitive adhesive tape obtained in the method, the weather resistance test was performed for 48 hours using "EYE Super UV Tester" (commercially available from Iwasaki Electric Co., Ltd.), under conditions of a temperature of 63° C. and a humidity of 70%. In this case, the test was performed with light with a radiation illuminance of 100 mW/cm², and in a narrow band of 300 to 400 nm. The absorbance at the maximum absorption wavelength of the single-sided pressure-sensitive adhesive tape was measured, and the residual ratio with respect to absorbance before the test was determined, and weather resistance was evaluated based on the following criteria. Here, the residual rate was calculated using the following formula.

Residual rate=(absorbance after test)÷(absorbance before test)×100

⊚: The residual rate was 95% or more
O: The residual rate was 90% or more and less than 95%
Δ: The residual rate was 85% or more and less than 90%
x: The residual rate was less than 85%

TABLE 12

| | Pressure-sensitive adhesive tape | Pressure-sensitive adhesive composition | Squarylium dye [A] | Dispersibility | Near-infrared absorption capability | Invisibility | Weather resistance |
|---|---|---|---|---|---|---|---|
| Example 242 | Pressure-sensitive adhesive tape 1 | AD-1 | A-1 | ⊚ | ⊚ | ⊚ | ⊚ |
| Example 243 | Pressure-sensitive adhesive tape 2 | AD-2 | A-38 | O | ⊚ | ⊚ | ⊚ |

TABLE 12-continued

|  | Pressure-sensitive adhesive tape | Pressure-sensitive adhesive composition | Squarylium dye [A] | Dispersibility | Near-infrared absorption capability | Invisibility | Weather resistance |
|---|---|---|---|---|---|---|---|
| Example 244 | Pressure-sensitive adhesive tape 3 | AD-3 | A-49 | ⊚ | ⊚ | ⊚ | ⊚ |
| Comparative Example 29 | Pressure-sensitive adhesive tape 4 | AD-4 | D-1 | Δ | Δ | X | X |
| Comparative Example 30 | Pressure-sensitive adhesive tape 5 | AD-5 | D-2 | O | X | Δ | Δ |

The pressure-sensitive adhesive compositions (AD-1 to 3) of the present specification exhibited very good performance in terms of dispersibility in the pressure-sensitive adhesive resin, optical properties, and weather resistance. On the other hand, regarding pressure-sensitive adhesive compositions that were not included in the present specification, AD-4 had a big problem in weather resistance, and AD-5 had a big problem in optical properties, which were not to a practical level. As in the above coating compositions, the squarylium dye [A] of the present specification exhibited very high dispersibility and compatibility with respect to the pressure-sensitive adhesive resin. In addition, very high near-infrared absorption capability, invisibility, and weather resistance were maintained. In addition, it was thought that, when the pressure-sensitive adhesive resin was changed to the adhesive resin, the composition could be appropriately used for not only the pressure-sensitive adhesive but also the adhesive. In addition, the pressure-sensitive adhesive and adhesive containing the squarylium dye [A] of the present specification could be appropriately used for applications such as an optical filter material, a heat radiation cutting material, a photothermal conversion material including laser welding.

<Production of Masterbatch>

Example 245

(Production of Masterbatch (MB-1))

100 parts of the squarylium dye [A-1], and 100 parts of HI-WAX™ (NL-100: decomposable LDPE-WAX, commercially available from Mitsui Chemicals Inc) as the dispersant [C-9] were mixed and dispersed using three rollers, and thereby a pre-dispersing element of a masterbatch (MB-1) was obtained. Then, 10 parts of the pre-dispersing element, and 90 parts of Novatech™ LD (LF342M1: film grade low density polyethylene pellets, commercially available from Mitsubishi Chemical Corporation) as the resin [B-3] were put into a tumbler mixer (commercially available from Kawata MFG Co., Ltd.), and the mixture was stirred under conditions of a temperature of 25° C. and a time of 3 minutes, and then put into a twin-screw extruder (commercially available from Nippon Placon Co., Ltd.), and melted and kneaded at a temperature of 180° C., and thereby a masterbatch (MB-1) was obtained.

Example 246

(Production of Masterbatch (MB-2))

100 parts of the squarylium dye [A-1] and 100 parts of DIACRON (ER-561: polyester resin pellets, commercially available from Mitsubishi Chemical Corporation) as the resin [B-4] were mixed and dispersed using three rollers, and thereby a pre-dispersing element of a masterbatch (MB-2) was obtained. Then, 10 parts of the pre-dispersing element and 90 parts of DIACRON (ER-561: polyester resin, commercially available from Mitsubishi Chemical Corporation) were put into a tumbler mixer (commercially available from Kawata MFG Co., Ltd.), and stirred under conditions of a temperature of 25° C. and a time of 3 minutes, and then put into a twin-screw extruder (commercially available from Nippon Placon Co., Ltd.), and melted and kneaded at a temperature of 140° C., and thereby a masterbatch (MB-2) was obtained.

Examples 247 and 248, and Comparative Examples 31 and 32

(Production of Masterbatches (MB-3 to 6))

Hereinafter, masterbatches (MB-3 to 6) were produced in the same manner as in the masterbatch (MB-1) except that dyes shown in Table 13 were used in place of the squarylium dye [A-1].

TABLE 13

|  | Masterbatch | Squarylium dye [A] | Resin [B] |
|---|---|---|---|
| Example 245 | MB-1 | A-1 | Low density polyethylene |
| Example 246 | MB-2 | A-1 | Polyester |
| Example 247 | MB-3 | A-38 | Low density polyethylene |
| Example 248 | MB-4 | A-49 | Low density polyethylene |
| Comparative Example 31 | MB-5 | D-1 | Low density polyethylene |
| Comparative Example 32 | MB-6 | D-2 | Low density polyethylene |

<Production of Molded Product (Film)>

Example 249

(Production of Resin Molded Product 1 Made of Masterbatch (MB-1))

4 parts of the masterbatch (MB-1) and 100 parts of the same Novatech™ LD as above (LF342M1: film grade low density polyethylene pellets) were put into a tumbler mixer (commercially available from Kawata MFG Co., Ltd.), and stirred under conditions of a temperature of 25° C. and a time of 3 minutes, and then melted and kneaded using a T-die extruder, and film molding was performed, and thereby a resin molded product 1 (film) made of the masterbatch (MB-1) was obtained. The molding temperature in this case was 180° C., and the film was produced so that the film thickness was 50 μm.

Examples 250 and 251, and Comparative Examples 33 and 34

(Production of Resin Molded Products 2 to 5 Made of Masterbatches (MB-3 to 6))

Hereinafter, resin molded products 2 to 5 (film) were obtained in the same manner as in the resin molded product 1 (film) except that masterbatches (MB-3) to (MB-6) were used in place of the masterbatch (MB-1).

<Evaluation of Resin Molded Products (Films) Made of Masterbatch>

Dispersibility, near-infrared absorption capability, invisibility, and light resistance tests were performed on the resin molded products 1 to 5 according to the following method. The results are shown in Table 14.

(Dispersibility)

The dispersibility of the squarylium dye [A] in the film was evaluated by observing the surface of the obtained films made of the masterbatch under an optical microscope. The evaluation criteria are as follows.

⊚: There were no pigment aggregates, and the squarylium dye was very uniformly dispersed
O: There were substantially no pigment aggregates, and the squarylium dye was uniformly dispersed
Δ: There were pigment aggregates, and the squarylium dye was not uniformly dispersed
x: There were many pigment aggregates, and the squarylium dye was not uniformly dispersed (Near-Infrared Absorption Capability)

Regarding the spectrum of the film obtained in the method, an absorption spectrum in a wavelength range of 300 to 1,000 nm was measured using a spectrophotometer (U-4100 commercially available from Hitachi High-Technologies Corporation). The maximum absorption of the squarylium dye [A] of the present specification was in a region of 750 to 950 nm, and the near-infrared absorption capability was evaluated according to the absorbance at the maximum absorption wavelength based on the following criteria.

⊚: Absorbance at the maximum absorption wavelength was 1.5 or more
O: Absorbance at the maximum absorption wavelength was 1.0 or more and less than 1.5
Δ: Absorbance at the maximum absorption wavelength was 0.5 or more and less than 1.0
x: Absorbance at the maximum absorption wavelength was less than 0.5

(Invisibility)

Using the absorption spectrum in a wavelength range of 300 to 1,000 nm obtained in the method, according to "average absorbance at 400 to 700 nm" when the absorbance at the maximum absorption wavelength was normalized to 1, invisibility was evaluated based on the following criteria.

⊚: less than 0.03
O: 0.03 or more and less than 0.05
Δ: 0.05 or more and less than 0.1
x: 0.1 or more (Light Resistance Test (1))

The film obtained in the method was put into a light resistance tester ("SUNTEST CPS+" commercially available from TOYOSEIKI) and left for 24 hours. In this case, the test was performed at a radiation illuminance of 47 mW/cm$^2$, and a light in a broad band of 300 to 800 nm. The absorbance at the maximum absorption wavelength of the substrate was measured, the residual ratio with respect to that before light irradiation was determined, and light resistance was evaluated based on the following criteria. Here, the residual rate was calculated using the following formula.

Residual rate=(absorbance after irradiation)÷(absorbance before irradiation)×100

⊚: The residual rate was 95% or more
O: The residual rate was 90% or more and less than 95%
Δ: The residual rate was 85% or more and less than 90%
x: The residual rate was less than 85%

(Light Resistance Test (2))

The film obtained in the method was put into a light resistance tester ("SUNTEST CPS+" commercially available from TOYOSEIKI) and left for 48 hours. In this case, the test was performed at a radiation illuminance of 47 mW/cm$^2$, and a light in a broad band of 300 to 800 nm. The absorbance at the maximum absorption wavelength of the substrate was measured, the residual ratio with respect to that before light irradiation was determined, and light resistance was evaluated based on the following criteria. Here, the residual rate was calculated using the following formula.

Residual rate=(absorbance after irradiation)÷(absorbance before irradiation)×100

⊚: The residual rate was 95% or more
O: The residual rate was 90% or more and less than 95%
Δ: The residual rate was 85% or more and less than 90%
x: The residual rate was less than 85%

TABLE 14

| | Resin molded product | Masterbatch | Squarylium dye [A] | Dispersibility | Near-infrared absorption capability | Invisibility | Light resistance (1) | Light resistance (2) |
|---|---|---|---|---|---|---|---|---|
| Example 249 | Molded product 1 | MB-1 | A-1 | ⊚ | ⊚ | ⊚ | ⊚ | ⊚ |
| Example 250 | Molded product 2 | MB-3 | A-38 | O | ⊚ | ⊚ | ⊚ | ⊚ |
| Example 251 | Molded product 3 | MB-4 | A-49 | ⊚ | ⊚ | ⊚ | ⊚ | ⊚ |
| Comparative Example 33 | Molded product 4 | MB-5 | D-1 | Δ | Δ | X | X | X |
| Comparative Example 34 | Molded product 5 | MB-6 | D-2 | O | X | Δ | Δ | X |

The resin molded products 1 to 3 (films) made of the masterbatch of the present specification exhibited very good performance in terms of dispersibility in the thermoplastic resin for molding, optical properties, and light resistance. On the other hand, regarding resin molded products (films) made of the masterbatch that were not included in the present specification, the molded product 4 had a big problem particularly in light resistance and the molded product 5 had a big problem particularly in optical properties, which were not to a practical level. It was found that the squarylium dye [A] of the present specification exhibited very excellent performance not only in a liquid dispersion such as a paint and a pressure-sensitive adhesive but also in the form and application of a solid dispersion. In addition, in addition to dispersibility, very high near-infrared absorption capability, invisibility, and light resistance were maintained. Therefore, the masterbatch containing the squarylium dye [A] of the present specification and the molded product could be appropriately used for applications such as a near-infrared cut filter material, a heat radiation cutting material, and a photothermal conversion material including a laser welding material.

Based on the above results, the squarylium dye [A] of the present specification had various composition forms in combination with the resin [B] such as a binder resin, a pressure-sensitive adhesive resin, and a thermoplastic resin, and could be appropriately used for a variety of applications. As described above, the reason for this is inferred to be due to strong color development, firm robustness, and strong crystallinity derived from the structure of the squarylium dye [A] of the present specification among perimidine squarylium dyes, and thus the compositions and application forms exhibited very excellent optical properties and high various resistances, and stability as a composition.

What is claimed is:

1. A squarylium dye [A] which is represented by the following General Formula (1) and has diffraction peaks at least at a Bragg angle 2 θ±0.2° of 8.6°, 12.4°, 17.5°, 20.2°, 22.2° and 25.4° in an X-ray diffraction pattern according to CuKα rays:

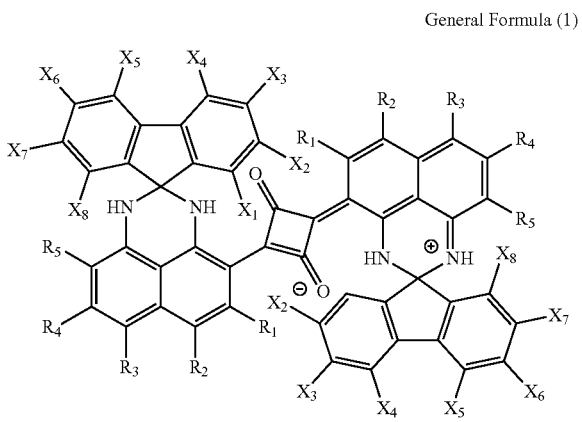

General Formula (1)

in General Formula (1), $R_1$ to $R_5$ each independently represent a hydrogen atom, a sulfo group or a halogen atom, $X_1$ to $X_8$ each independently represent a hydrogen atom, an alkyl group which may have a substituent, an alkenyl group which may have a substituent, an aryl group which may have a substituent, an aralkyl group which may have a substituent, an alkoxy group which may have a substituent, an aryloxy group which may have a substituent, a hydroxyl group, an amino group, —$NR_6R_7$, a sulfo group, —$SO_2NR_8R_9$, —$COOR_{10}$, —$CONR_{11}R_{12}$, a nitro group, a cyano group or a halogen atom, and $R_6$ to $R_{12}$ each independently represent a hydrogen atom, an alkyl group which may have a substituent, an aryl group which may have a substituent, an acyl group which may have a substituent or a pyridinyl group which may have a substituent, and $R_6$ and $R_7$, $R_8$ and $R_9$ and $R_{11}$ and $R_{12}$ may be bonded to each other to form a ring.

2. The squarylium dye [A] according to claim 1, wherein, in General Formula (1), $R_1$ to $R_5$ are all hydrogen atoms, or four thereof are hydrogen atoms and one thereof is a sulfo group or a halogen atom.

3. The squarylium dye [A] according to claim 1, wherein, in General Formula (1), $X_1$ to $X_8$ represent a hydrogen atom.

4. A near-infrared absorbing composition including the squarylium dye [A] according to claim 1 and at least one selected from the group consisting of a resin [B], a dispersant [C], a photopolymerizable monomer, a photopolymerization initiator, an organic solvent and water.

5. A solid-state image sensing device composition including the squarylium dye [A] according to claim 1, a resin [B], a dispersant [C], a photopolymerizable monomer, a photopolymerization initiator, and an organic solvent.

6. A near-infrared cut filter formed of the solid-state image sensing device composition according to claim 5 on a substrate.

7. A solid-state image sensing device including the near-infrared cut filter according to claim 6.

8. An image forming material including the squarylium dye [A] according to claim 1.

9. The image forming material according to claim 8, which is a toner for electrophotography, an ink for an inkjet printer, an ink for a thermal printer, or an ink for letterpress, offset, flexo, gravure, or silk printing.

10. A paint including the squarylium dye [A] according to claim 1.

11. An adhesive including the squarylium dye [A] according to claim 1.

12. A pressure-sensitive adhesive including the squarylium dye [A] according to claim 1.

13. A molded product including the squarylium dye [A] according to claim 1.

14. A laser welding material including the squarylium dye [A] according to claim 1.

15. A laser welded assembly made of the laser welding material according to claim 14.

* * * * *